US009331663B2

(12) United States Patent
Suzuki

(10) Patent No.: US 9,331,663 B2
(45) Date of Patent: May 3, 2016

(54) IMPEDANCE MATCHING DEVICE AND CONTROL METHOD

(75) Inventor: Masami Suzuki, Fujimino (JP)

(73) Assignee: PIONEER CORPORATION, Kanagawa (JP)

( * ) Notice: Subject to any disclaimer, the term of this patent is extended or adjusted under 35 U.S.C. 154(b) by 129 days.

(21) Appl. No.: 14/124,359

(22) PCT Filed: Jun. 7, 2011

(86) PCT No.: PCT/JP2011/063069
§ 371 (c)(1),
(2), (4) Date: Feb. 26, 2014

(87) PCT Pub. No.: WO2012/169014
PCT Pub. Date: Dec. 13, 2012

(65) Prior Publication Data
US 2014/0191819 A1 Jul. 10, 2014

(51) Int. Cl.
*H03H 7/40* (2006.01)
*H04B 5/00* (2006.01)
(Continued)

(52) U.S. Cl.
CPC ............... *H03H 7/40* (2013.01); *H01F 38/14* (2013.01); *H02J 5/005* (2013.01); *H02J 17/00* (2013.01); *H04B 5/0037* (2013.01)

(58) Field of Classification Search
CPC ............. H03H 7/40; H03H 7/38; H02J 5/005; H02J 17/00
USPC .......................... 333/17.1, 17.3, 32; 455/41.1
See application file for complete search history.

(56) References Cited

U.S. PATENT DOCUMENTS 5,589,844 A * 12/1996 Belcher .................. H01Q 23/00
333/17.3
7,359,681 B2    4/2008 Cho
(Continued)

FOREIGN PATENT DOCUMENTS

JP          07-273680       10/1995
JP          2005-129985      5/2005
(Continued)

OTHER PUBLICATIONS

International Search Report, PCT/JP2011/063069, Aug. 23, 2011.
(Continued)

*Primary Examiner* — Benny Lee
*Assistant Examiner* — Albens Dieujuste
(74) *Attorney, Agent, or Firm* — Young & Thompson

(57) ABSTRACT

In an impedance matching device, a storage unit stores a control value representing a load value and a value equivalent to input impedance in advance. The control value identifies inductance and capacitance values matching a predetermined impedance value by use of either a first or second matching circuit. An impedance estimation unit estimates input impedance of the power transmission antenna. The load value estimation unit estimates load value of a circuit connected to a power reception antenna and consuming transmitted electric power. A circuit selection unit electrically connects the first matching circuit, the second matching circuit, or a through circuit per the load value and the input impedance equivalent value. A control value output unit reads out the control value stored in the storage unit based on the load value and the input impedance equivalent value, and outputs the control value to the circuit selected by the circuit selection unit.

20 Claims, 39 Drawing Sheets

(51) Int. Cl.
*H02J 5/00* (2016.01)
*H02J 17/00* (2006.01)
*H01F 38/14* (2006.01)

(56) References Cited

U.S. PATENT DOCUMENTS

| | | |
|---|---|---|
| 2005/0026573 A1 | 2/2005 | Cho |
| 2010/0102641 A1 | 4/2010 | Joannopoulos et al. |
| 2010/0117455 A1 | 5/2010 | Joannopoulos et al. |

FOREIGN PATENT DOCUMENTS

| | | |
|---|---|---|
| JP | WO2007/008646 | 1/2007 |
| JP | 4225953 | 12/2008 |
| JP | 2009-501510 | 1/2009 |
| JP | 2010-130800 | 6/2010 |
| JP | 2010-141976 | 6/2010 |
| JP | 2011-010435 | 1/2011 |
| JP | 2011-050140 | 3/2011 |
| WO | WO2010/067763 | 6/2010 |

OTHER PUBLICATIONS

A. Kurs, A. Karalis, et al., "Wireless Power Transfer via Strongly Coupled Magnetic Resonances"., published online Jun. 7, 2007, Science Jul. 6, 2007, vol. 317, No. 5834, pp. 83-86 (2007).

T. Imura, and Y. Hori, "Transfer Technology Using Electromagnetic Resonant Coupling", IEEJ Journal, vol. 129, No. 7, pp. 414-417 (2009).

T. Imura, H. Okabe, T. Uchida, and Y. Hori, "Wireless Power Transfer during Displacement using Electromagnetic Coupling in Resonance", IEEJ Journal of Industry Applications, vol. 130, No. 1, pp. 76-83 (2010).

H. Kurata and A. Kawamura, "Study on Efficiency Optimization of Wireless Power Transmission based on Magnetic Equivalent Circuit", The Papers of Technical Meeting on Industrial Instrumentation and Control, IEE Japan, IIC-10-015 (2010).

\* cited by examiner

RL=10Ω

RL=50Ω

RL=200Ω k=0.030 k=0.064 k=0.120

| Idx | k | Ri | Xi | If | C(pF) | L(nH) |
|---|---|---|---|---|---|---|
| 1 | 0.01 | 1.973 | 0.036 | 2 | 1213.097 | 119.214 |
| 2 | 0.015 | 3.184 | 0.079 | 2 | 942.783 | 149.104 |
| 3 | 0.02 | 4.879 | 0.136 | 2 | 747.623 | 180.726 |
| 4 | 0.03 | 9.726 | 0.273 | 2 | 500.291 | 239.941 |
| 5 | 0.05 | 25.248 | 0.451 | 2 | 243.431 | 301.756 |
| 6 | 0.07 | 48.539 | -0.022 | 2 | 42.650 | 103.774 |
| 7 | 0.1 | 97.855 | -3.872 | 1 | 117.812 | 602.326 |
| 8 | 0.15 | 215.080 | -30.069 | 1 | 95.312 | 1130.954 |
| 9 | 0.2 | 360.973 | -100.689 | 1 | 73.466 | 1600.568 |
| 10 | 0.3 | 599.609 | -405.715 | 1 | 47.578 | 2495.367 | k: COUPLING COEFFICIENT
If: FLAG INFORMATION

| Idx | k | Ri | Xi | If | C(pF) | L(nH) |
|---|---|---|---|---|---|---|
| 1 | 0.01 | 5.493 | 0.009 | 2 | 699.795 | 192.108 |
| 2 | 0.015 | 11.105 | -0.026 | 2 | 460.110 | 255.801 |
| 3 | 0.02 | 18.961 | -0.161 | 2 | 314.566 | 300.198 |
| 4 | 0.03 | 41.380 | -1.104 | 2 | 112.211 | 245.739 |
| 5 | 0.05 | 112.421 | -9.609 | 1 | 112.807 | 691.257 |
| 6 | 0.07 | 214.511 | -37.280 | 1 | 93.200 | 1136.639 |
| 7 | 0.1 | 397.945 | -143.867 | 1 | 67.392 | 1738.872 |
| 8 | 0.15 | 603.608 | -495.977 | 1 | 43.313 | 2694.830 |
| 9 | 0.2 | 570.611 | -836.471 | 1 | 30.409 | 3632.954 |
| 10 | 0.3 | 338.672 | -1119.851 | 1 | 17.119 | 5491.725 | k: COUPLING COEFFICIENT
If: FLAG INFORMATION

FIG. 19B

| Idx | k | Ri | Xi | If | C(pF) | L(nH) |
|---|---|---|---|---|---|---|
| 1 | 0.01 | 1.973 | 0.036 | 2 | 1213.097 | 119.214 |
| 2 | 0.015 | 3.184 | 0.079 | 2 | 942.793 | 148.104 |
| 3 | 0.02 | 4.878 | 0.136 | 2 | 747.623 | 180.726 |
| 4 | 0.03 | 9.726 | 0.273 | 2 | 500.291 | 239.941 |
| 5 | 0.05 | 25.248 | 0.451 | 2 | 243.431 | 301.756 |
| 6 | 0.07 | 48.539 | -0.022 | 2 | 42.650 | 103.774 |
| 7 | 0.1 | 97.855 | -3.972 | 1 | 117.812 | 602.326 |
| 8 | 0.15 | 215.080 | -30.069 | 1 | 95.312 | 1130.954 |
| 9 | 0.2 | 360.973 | -100.689 | 1 | 79.466 | 1600.568 |
| 10 | 0.3 | 599.609 | -405.715 | 1 | 47.578 | 2485.367 | k: COUPLING COEFFICIENT
If: FLAG INFORMATION

FIG. 19C

| Idx | k | Ri | Xi | If | C(pF) | L(nH) |
|---|---|---|---|---|---|---|
| 1 | 0.01 | 1.250 | 0.039 | 2 | 1535.450 | 95.479 |
| 2 | 0.015 | 1.557 | 0.068 | 2 | 1371.241 | 105.685 |
| 3 | 0.02 | 1.988 | 0.157 | 2 | 1208.320 | 118.157 |
| 4 | 0.03 | 3.218 | 0.353 | 2 | 937.398 | 146.496 |
| 5 | 0.05 | 7.160 | 0.961 | 2 | 601.359 | 203.482 |
| 6 | 0.07 | 13.089 | 1.828 | 2 | 412.869 | 247.726 |
| 7 | 0.1 | 25.741 | 3.482 | 2 | 238.670 | 264.384 |
| 8 | 0.15 | 57.028 | 6.438 | 1 | 107.850 | 242.053 |
| 9 | 0.2 | 101.298 | 7.895 | 1 | 132.308 | 626.294 |
| 10 | 0.3 | 227.946 | -5.609 | 1 | 100.389 | 1159.976 | k: COUPLING COEFFICIENT
If: FLAG INFORMATION

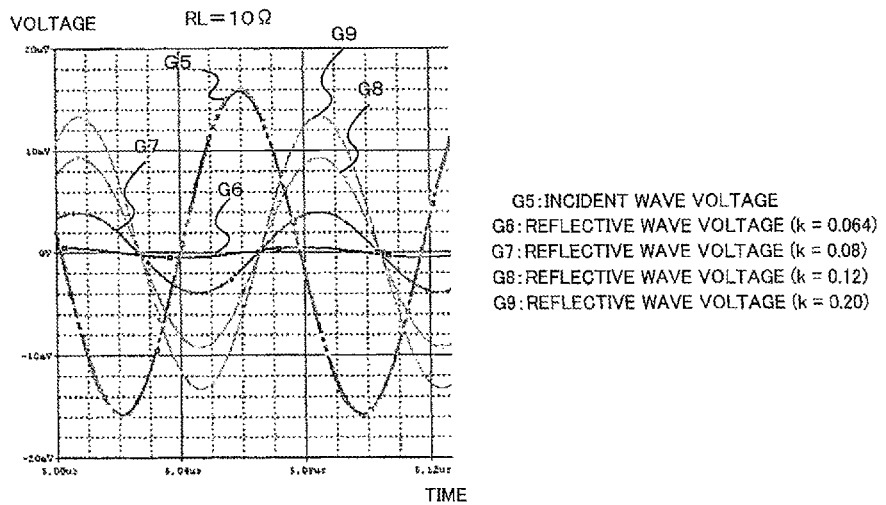

FIG. 21A

G5: INCIDENT WAVE VOLTAGE
G6: REFLECTIVE WAVE VOLTAGE (k = 0.064)
G7: REFLECTIVE WAVE VOLTAGE (k = 0.08)
G8: REFLECTIVE WAVE VOLTAGE (k = 0.12)
G9: REFLECTIVE WAVE VOLTAGE (k = 0.20)

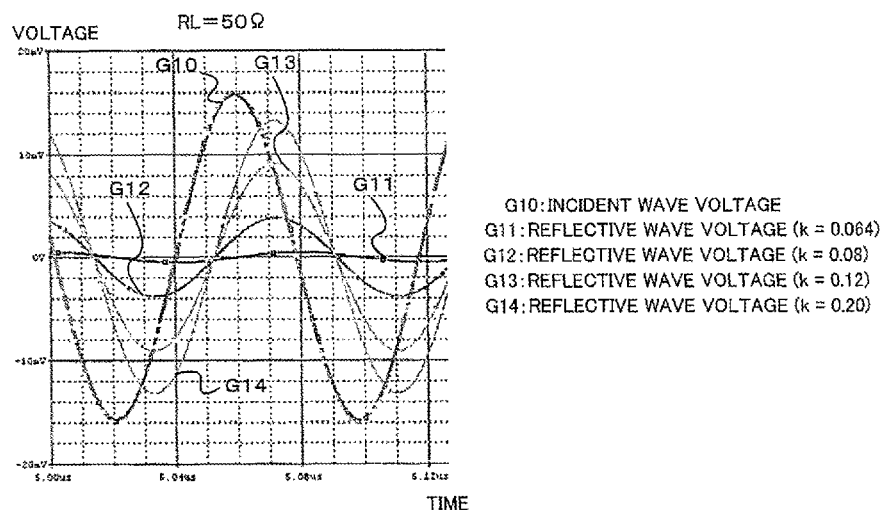

FIG. 21B

G10: INCIDENT WAVE VOLTAGE
G11: REFLECTIVE WAVE VOLTAGE (k = 0.064)
G12: REFLECTIVE WAVE VOLTAGE (k = 0.08)
G13: REFLECTIVE WAVE VOLTAGE (k = 0.12)
G14: REFLECTIVE WAVE VOLTAGE (k = 0.20)

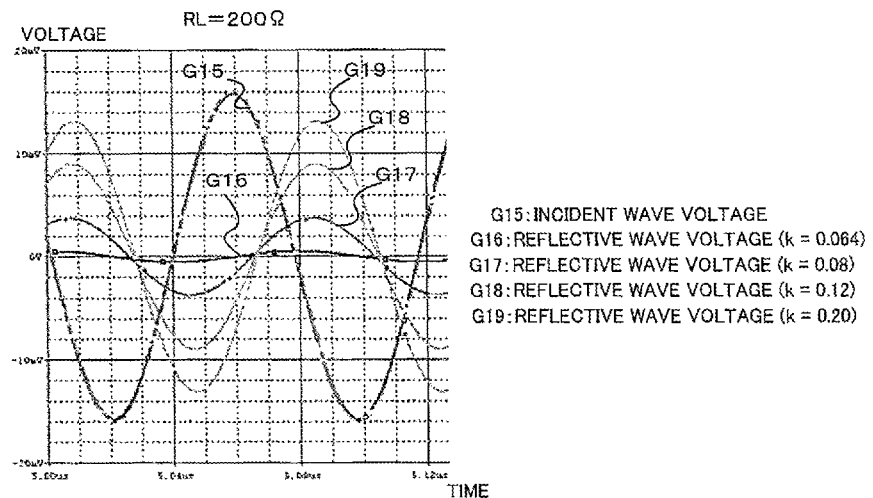

FIG. 21C

G15: INCIDENT WAVE VOLTAGE
G16: REFLECTIVE WAVE VOLTAGE (k = 0.064)
G17: REFLECTIVE WAVE VOLTAGE (k = 0.08)
G18: REFLECTIVE WAVE VOLTAGE (k = 0.12)
G19: REFLECTIVE WAVE VOLTAGE (k = 0.20)

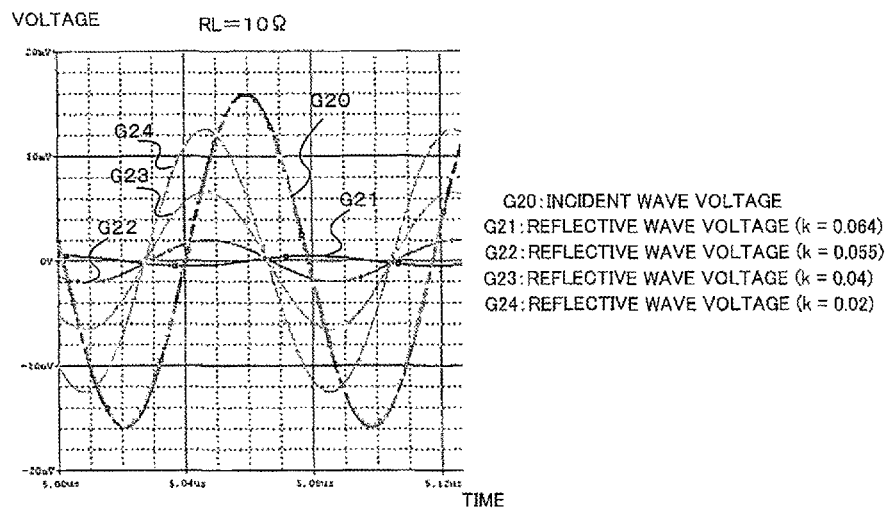

FIG. 22A

G20: INCIDENT WAVE VOLTAGE
G21: REFLECTIVE WAVE VOLTAGE (k = 0.064)
G22: REFLECTIVE WAVE VOLTAGE (k = 0.055)
G23: REFLECTIVE WAVE VOLTAGE (k = 0.04)
G24: REFLECTIVE WAVE VOLTAGE (k = 0.02)

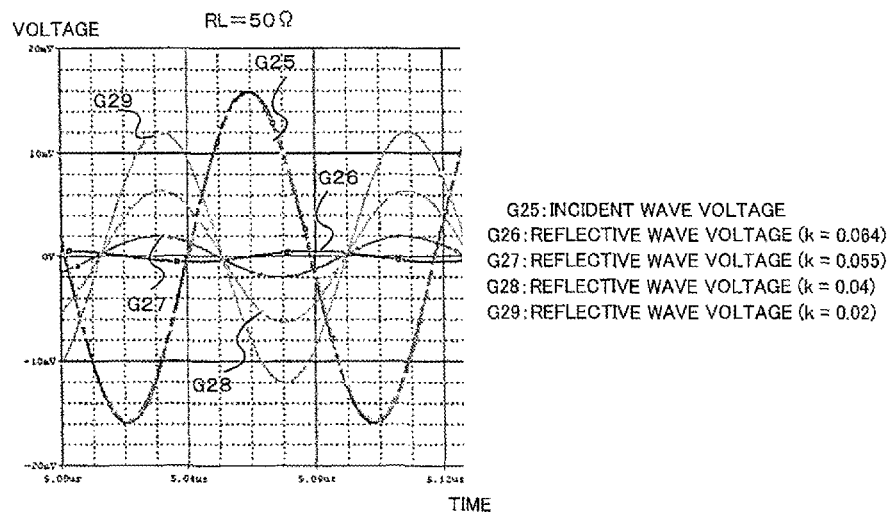

FIG. 22B

G25: INCIDENT WAVE VOLTAGE
G26: REFLECTIVE WAVE VOLTAGE (k = 0.064)
G27: REFLECTIVE WAVE VOLTAGE (k = 0.055)
G28: REFLECTIVE WAVE VOLTAGE (k = 0.04)
G29: REFLECTIVE WAVE VOLTAGE (k = 0.02)

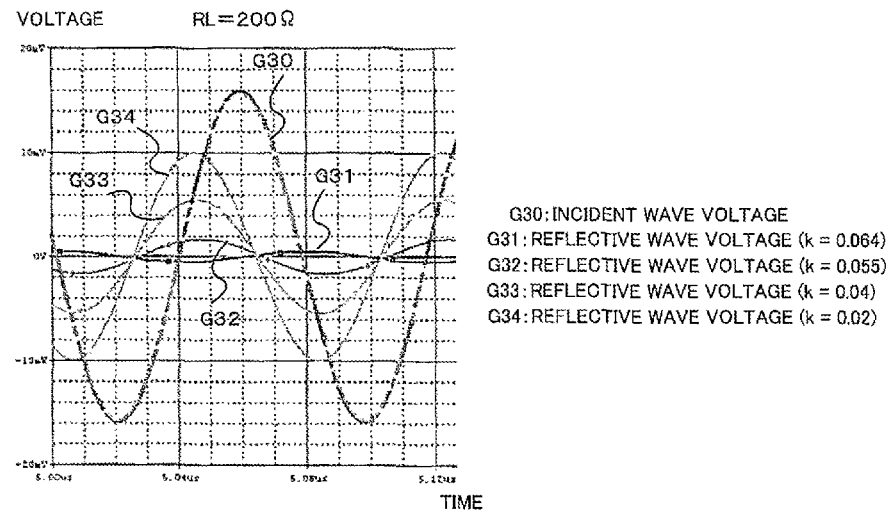

FIG. 22C

G30: INCIDENT WAVE VOLTAGE
G31: REFLECTIVE WAVE VOLTAGE (k = 0.064)
G32: REFLECTIVE WAVE VOLTAGE (k = 0.055)
G33: REFLECTIVE WAVE VOLTAGE (k = 0.04)
G34: REFLECTIVE WAVE VOLTAGE (k = 0.02)

| Idx | RL | Ri | Xi | If | C | L |
|---|---|---|---|---|---|---|
| 1 | 10 | 214.511 | -37.280 | 1 | 93.200 | 1136.639 |
| 2 | 15 | 150.340 | -17.050 | 1 | 106.302 | 879.062 |
| 3 | 20 | 115.540 | -9.228 | 1 | 113.274 | 707.650 |
| 4 | 30 | 78.987 | -3.268 | 1 | 112.143 | 469.084 |
| 5 | 50 | 48.539 | -0.022 | 2 | 42.650 | 103.774 |
| 6 | 70 | 35.178 | 0.918 | 2 | 159.584 | 269.409 |
| 7 | 100 | 25.040 | 1.435 | 2 | 245.462 | 289.678 |
| 8 | 150 | 17.087 | 1.723 | 2 | 341.216 | 270.344 |
| 9 | 200 | 13.089 | 1.828 | 2 | 412.869 | 247.726 |
| 10 | 300 | 9.076 | 1.907 | 2 | 522.059 | 213.467 |
| 11 | 500 | 5.856 | 1.952 | 2 | 675.026 | 173.649 |

RL: LOAD
If: FLAG INFORMATION

| Idx | RL | Ri | Xi | If | C | L |
|---|---|---|---|---|---|---|
| 1 | 10 | 41.380 | −1.104 | 2 | 112.211 | 245.739 |
| 2 | 15 | 28.784 | −0.359 | 2 | 211.078 | 308.196 |
| 3 | 20 | 22.176 | −0.073 | 2 | 275.389 | 306.247 |
| 4 | 30 | 15.350 | 0.148 | 2 | 369.378 | 281.683 |
| 5 | 50 | 9.726 | 0.273 | 2 | 500.291 | 239.941 |
| 6 | 70 | 7.270 | 0.311 | 2 | 596.056 | 212.837 |
| 7 | 100 | 5.409 | 0.333 | 2 | 705.897 | 186.815 |
| 8 | 150 | 3.951 | 0.347 | 2 | 839.357 | 161.543 |
| 9 | 200 | 3.218 | 0.353 | 2 | 937.398 | 146.496 |
| 10 | 300 | 2.483 | 0.357 | 2 | 1075.562 | 129.130 |
| 11 | 500 | 1.893 | 0.360 | 2 | 1239.454 | 112.875 |

RL: LOAD
If: FLAG INFORMATION

FIG. 34B

| Idx | RL | Ri | Xi | If | C | L |
|---|---|---|---|---|---|---|
| 1 | 10 | 214.511 | −37.290 | 1 | 93.200 | 1136.639 |
| 2 | 15 | 150.340 | −17.050 | 1 | 106.302 | 879.062 |
| 3 | 20 | 115.540 | −9.228 | 1 | 113.274 | 707.650 |
| 4 | 30 | 78.987 | −3.268 | 1 | 112.143 | 469.034 |
| 5 | 50 | 48.539 | −0.022 | 2 | 42.650 | 103.774 |
| 6 | 70 | 35.178 | 0.918 | 2 | 159.594 | 269.409 |
| 7 | 100 | 25.040 | 1.435 | 2 | 245.462 | 289.678 |
| 8 | 150 | 17.097 | 1.723 | 2 | 341.218 | 270.344 |
| 9 | 200 | 13.099 | 1.828 | 2 | 412.869 | 247.726 |
| 10 | 300 | 9.076 | 1.907 | 2 | 522.069 | 213.467 |
| 11 | 500 | 5.856 | 1.952 | 2 | 675.026 | 173.649 |

RL: LOAD
If: FLAG INFORMATION

FIG. 34C

| Idx | RL | R | X | If | C | L |
|---|---|---|---|---|---|---|
| 1 | 10 | 603.609 | −495.977 | 1 | 43.313 | 2694.830 |
| 2 | 15 | 530.050 | −296.236 | 1 | 53.625 | 2208.627 |
| 3 | 20 | 451.034 | −189.106 | 1 | 62.126 | 1905.032 |
| 4 | 30 | 335.065 | −90.878 | 1 | 75.784 | 1529.736 |
| 5 | 50 | 215.080 | −30.069 | 1 | 95.312 | 1130.954 |
| 6 | 70 | 157.202 | −11.535 | 1 | 108.630 | 903.538 |
| 7 | 100 | 111.760 | −1.253 | 1 | 121.012 | 683.189 |
| 8 | 150 | 75.444 | 4.410 | 1 | 125.815 | 440.678 |
| 9 | 200 | 57.028 | 6.438 | 1 | 107.650 | 242.053 |
| 10 | 300 | 36.469 | 7.915 | 2 | 134.601 | 161.598 |
| 11 | 500 | 23.537 | 9.695 | 2 | 260.687 | 199.912 |

RL: LOAD
If: FLAG INFORMATION

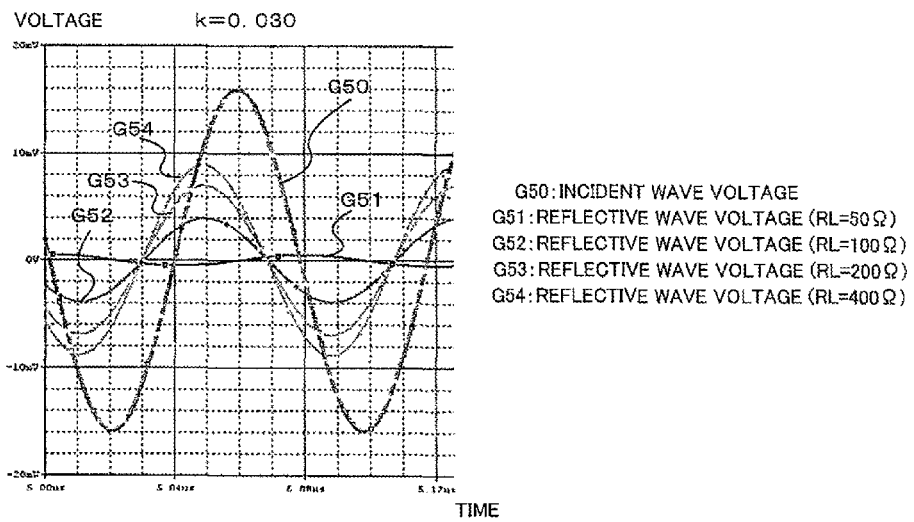

FIG. 36A

G50: INCIDENT WAVE VOLTAGE
G51: REFLECTIVE WAVE VOLTAGE (RL=50Ω)
G52: REFLECTIVE WAVE VOLTAGE (RL=100Ω)
G53: REFLECTIVE WAVE VOLTAGE (RL=200Ω)
G54: REFLECTIVE WAVE VOLTAGE (RL=400Ω)

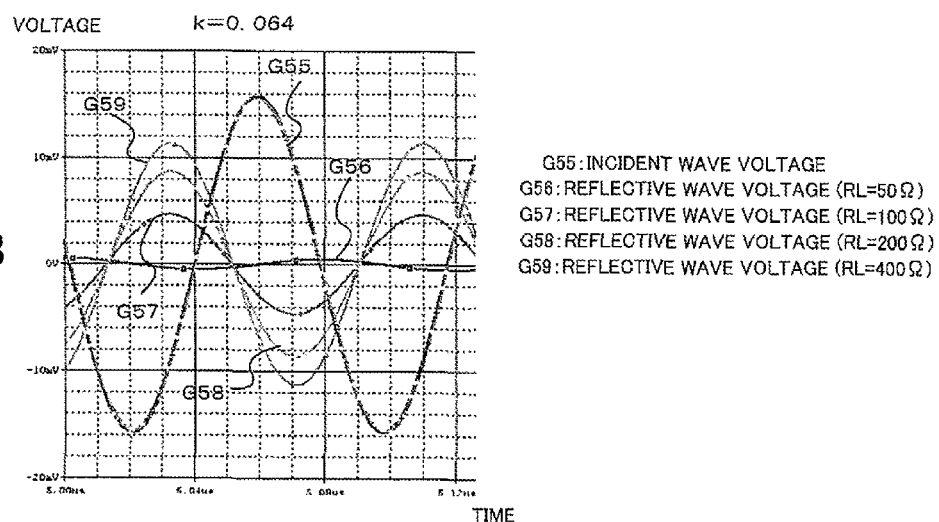

FIG. 36B

G55: INCIDENT WAVE VOLTAGE
G56: REFLECTIVE WAVE VOLTAGE (RL=50Ω)
G57: REFLECTIVE WAVE VOLTAGE (RL=100Ω)
G58: REFLECTIVE WAVE VOLTAGE (RL=200Ω)
G59: REFLECTIVE WAVE VOLTAGE (RL=400Ω)

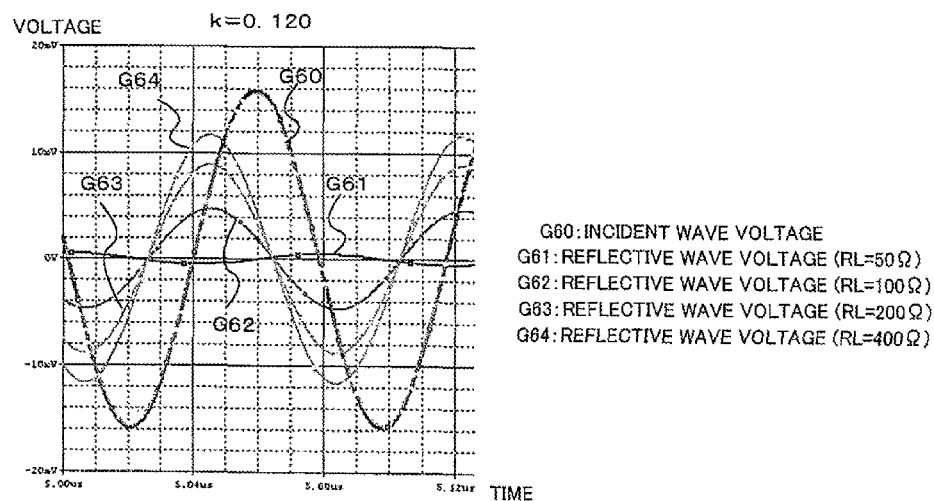

FIG. 36C

G60: INCIDENT WAVE VOLTAGE
G61: REFLECTIVE WAVE VOLTAGE (RL=50Ω)
G62: REFLECTIVE WAVE VOLTAGE (RL=100Ω)
G63: REFLECTIVE WAVE VOLTAGE (RL=200Ω)
G64: REFLECTIVE WAVE VOLTAGE (RL=400Ω)

G85: INCIDENT WAVE VOLTAGE
G86: REFLECTIVE WAVE VOLTAGE

G87: INCIDENT WAVE VOLTAGE
G88: REFLECTIVE WAVE VOLTAGE

G89: INCIDENT WAVE VOLTAGE
G90: REFLECTIVE WAVE VOLTAGE

IMPEDANCE MATCHING DEVICE AND
CONTROL METHOD

TECHNICAL FIELD

The present invention relates to an impedance matching device useful for a wireless contactless electric power transmission system, especially a wireless electric power transmission system based on the principle of electromagnetic field resonance coupling (also referred to as magnetic field resonance or electric field resonance).

BACKGROUND TECHNIQUE

In recent years, a wireless contactless electric power transmission technology is beginning to be used. In households, a contactless charger for charging small devices used near a sink such as an electric toothbrush and a shaver, and for charging portable devices such as a cell phone is gaining in popularity. Regarding electric vehicles, a system in which a vehicle stopping at a parking area or a bus stop is fed or charged from under the body by a contactless power feeding device has already been in practical use.

Electric power transmission technologies by radio (electromagnetic wave) are classified into three major modes which are an electromagnetic induction mode, an electromagnetic field resonance coupling mode, and a microwave electric power transmission mode. Among them, the most widespread mode used in home appliances, industrial machinery and electric vehicles is the electromagnetic induction mode, which has already been turned into commercial realities compatible with a wide range of electric power from a small electric power such as several watts to a large electric power such as dozens of kilowatts. However, unfortunately, the electromagnetic induction mode needs to narrow an interval (air gap, hereinafter also referred to as "gap") between a coil (primary side coil) on the electric power transmission side and a coil (secondary side coil) on the electric power reception side to a minimum, and it is vulnerable to positional misalignment between the transmission-side coil and the reception-side coil. These problems limit the fields to which it can be applied. As a system adopting the microwave electric power transmission mode, a SPS (Solar Power Satellite) system is under study. The SPS system sends electric power generated by solar array panels provided at an artificial satellite to a reception antenna on the ground by use of electric wave whose beam width is extremely narrowed. The SPS system needs, however, a large scale facility. For use in electric vehicles, an experimental production in which a waveguide slot antenna is used as a transmission unit and a combination of a patch antenna and a rectifier are used as a reception unit has also been reported, but it has such a problem that its efficiency is low at present.

Meanwhile, a wireless electric power transmission using the electromagnetic field resonance coupling mode is gaining attention in recent years (see Non-Patent Reference-1, Non-Patent Reference-2 and Patent Reference 1, for example). This mode has advantages that it allows the gap between the transmission antenna and the reception antenna to be wide (from dozens of centimeters to several meters), and that it is robust over the positional misalignment. Thus, it is expected to be applied to various fields such as home appliances, industrial machinery and electric vehicles. In addition, great expectations are placed on the electromagnetic field resonance coupling mode regarding wireless supply of electric power to a moving body which cannot be achieved by the electromagnetic induction mode.

In Patent Reference-3, there is disclosed a technique for controlling impedance based on the distance between antennas or the load thereof. Non-Patent Reference-3 discloses the availability of the magnetic field resonance mode, and Non-Patent Reference-4 discloses reasonability of a series parallel equivalent circuit as a model of an electric power transmission antenna and/or an electric power reception antenna based on electromagnetic field resonance mode. In addition, the applicant has filed undisclosed applications of the international application numbers "PCT/JP2010/063569" and "PCT/JP2010/063570" which are relevant to this application.

Patent Reference-1: Japanese Patent Application Laid-open under No. 2009-501510
Patent Reference-2: Japanese Patent No. 4225953
Patent Reference-3: Japanese Patent Application Laid-open under No. 2010-141976
Non-Patent Reference-1: A. Kurs and A. Karalis, et al. "Wireless Power Transfer via Strongly Coupled Magnetic Resonances", Science, Vol. 317, 6 Jul. 2007
Non-Patent Reference-2: Imura and Hori, "Transmission Technology Using Electromagnetic Field Resonance Coupling", IEEJ Journal, Vol. 129, Vo. 7, 2009
Non-Patent Reference-3: Imura, Okabe, Uchida and Hori, "Wireless Electric Power Transmission Resistant to Positional Misalignment Using Electromagnetic Field Coupling During Resonance", The Institute of Electrical Engineers of Japan, Industrial Application Branch, Vol. 130-1, 2010, p. 78 to 83
Non-Patent Reference-4: Kurata and Kawamura, "Research Relating to High Efficiency of Contactless Power Feeding Using Magnetic Coupling Equivalent Circuit", The Institute of Electrical Engineers of Japan, Paper of Industrial Instrumentation Control Conference, IIC-10-15

DISCLOSURE OF INVENTION

Problem to be Solved by the Invention

A wireless electric power transmission system based on the electromagnetic resonance mode (electromagnetic field resonance coupling) has following two characteristics: (A) along with the change of the coupling state between the power transmission antenna and the power reception antenna, the value of input impedance at the edge of the power transmission antenna varies, and (B) along with the change of the value of load connected on the side of the power reception antenna, the value of input impedance at the edge of the power transmission antenna also varies. Thus, if the above-mentioned coupling state or the value of the load varies, there occurs a mismatch between the output impedance of the power transmission circuit (power source) and the impedance at the input-side edge of the power transmission antenna. As a result, this leads to generation of reflection loss and deterioration of transmission efficiency. Generally, an impedance matching circuit is used for suppressing the reflection loss due to the mismatch of the impedance. However, there is no impedance matching circuit capable of efficiently and promptly dealing with the variation of the input impedance peculiar to the electromagnetic resonance mode.

The above is an example of the problem to be solved by the present invention. An object of the present invention is to provide an impedance matching device capable of efficiently and promptly matching the impedance.

Means for Solving the Problem

One invention is an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: an input impedance estimation unit configured to estimate an input impedance equivalent value corresponding to input impedance of the power transmission antenna or a value equivalent thereto; a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; a load value estimation unit configured to estimate a value of a load of a circuit in which the transmitted electric power is consumed, the circuit being connected to the power reception antenna; a storage unit configured to previously store control values each associated with the value of the load and the input impedance equivalent value, each of the control values corresponding to an inductance value and a capacitance value each needed for matching to a predetermined impedance value by use of the first matching circuit or the second matching circuit; a circuit selection unit configured to electrically connect one of the first matching circuit, the second matching circuit and the through circuit based on the estimated value of the load and the estimated input impedance equivalent value; and a control value output unit configured to read out one of the control values stored in the storage unit based on the estimated value of the load and the estimated input impedance equivalent value, and to output the control value to the circuit selected by the circuit selection unit.

Another invention is an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: an input impedance estimation unit configured to estimate an input impedance equivalent value corresponding to input impedance of the power transmission antenna or a value equivalent thereto; a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; a coupling coefficient estimation unit configured to estimate a coupling coefficient between the power transmission antenna and the power reception antenna; a storage unit configured to previously store control values each associated with the coupling coefficient and the input impedance equivalent value, each of the control values corresponding to an inductance value and a capacitance value each needed for matching to a predetermined impedance value by use of the first matching circuit or the second matching circuit; a circuit selection unit configured to electrically connect one of the first matching circuit, the second matching circuit and the through circuit based on the estimated coupling coefficient and the estimated input impedance equivalent value; a control value output unit configured to read out one of the control values stored in the storage unit based on the estimated coupling coefficient and the estimated input impedance equivalent value, and to output the control value to the circuit selected by the circuit selection unit.

Another invention is a control method executed by an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; and a storage unit configured to previously store control values each associated with a value of a load of a circuit in which the transmitted electric power is consumed and an input impedance equivalent value, each of the control values corresponding to an inductance value and a capacitance value each needed for matching to a predetermined impedance value by use of the first matching circuit or the second matching circuit, the input impedance equivalent value corresponding to input impedance of the power transmission antenna or a value equivalent thereto, the circuit being connected to the power reception antenna, the control method including: an input impedance estimation process for estimating the input impedance equivalent value; a load value estimation process for estimating the value of the load; a circuit selection process for electrically connecting one of the first matching circuit, the second matching circuit and the through circuit based on the estimated value of the load and the estimated input impedance equivalent value; and a control value output process for reading out one of the control values stored in the storage unit based on the estimated value of the load and the estimated input impedance equivalent value, and for outputting the control value to the circuit selected in the circuit selection process.

Another invention is a control method executed by an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; and a storage unit configured to previously store control values each associated with a coupling coefficient between the power transmission antenna and the power reception antenna and an input impedance equivalent value, each of the control values corresponding to an inductance value and a capacitance value each needed for matching to a predetermined impedance value by use of the first matching circuit or the second matching circuit, the input impedance equivalent value corresponding to input impedance of the power transmission antenna or a value equivalent thereto, the control method including: an input impedance estimation process for estimating the input impedance equivalent value; a coupling state estimation process for estimating the coupling coefficient; a circuit selection process for electrically connecting one of the first matching circuit, the second matching circuit and the through circuit based on the estimated coupling coefficient and the estimated input impedance equivalent value; and a control value output process for reading out one of the control values stored in the storage unit based on the estimated coupling coefficient and the estimated input impedance equivalent value, and for outputting the control value to the circuit selected in the circuit selection process.

BRIEF DESCRIPTION OF THE DRAWINGS

FIGS. 19A to 19C each illustrates a matching correction amount table according to the first embodiment.

FIGS. 21A to 21C each illustrates a graph indicating the relationship between the waveform of the incident wave voltage and the waveform of the reflective wave voltage in the case that the coupling strength shifts toward the direction where the coupling strength is strengthened.

FIGS. 22A to 22C each illustrates the relationship between the waveform of the incident wave voltage and the waveform of the reflective wave voltage in the case that the coupling strength shifts toward the direction where the coupling strength is weakened.

FIGS. 34A to 34C each illustrates a matching correction amount table according to the second embodiment prepared through theoretic calculation.

FIGS. 36A to 36C each illustrates a graph indicating the relationship between the waveform of the incident wave voltage and the waveform of the reflective wave voltage in the case that the load value shifts toward the direction where the load value becomes larger.

DETAILED DESCRIPTION OF THE PREFERRED EMBODIMENTS

Figure 1:
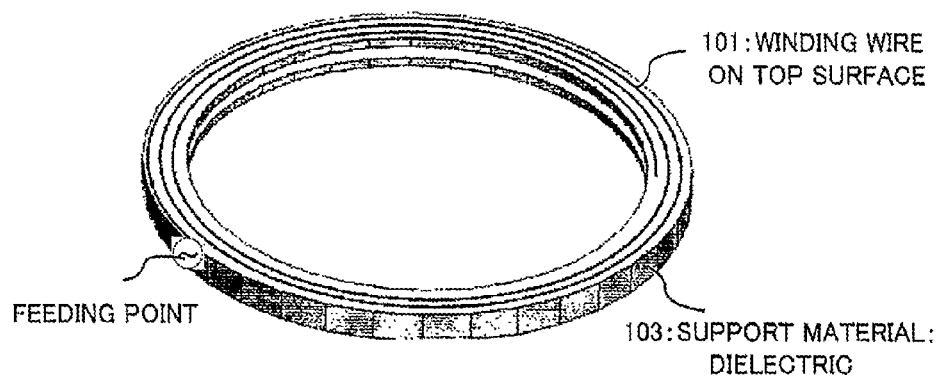
FIG. 1 illustrates an example of a power transmission/reception antenna based on the electromagnetic resonance mode.

According to a preferable embodiment of the present invention, an impedance matching device included in a wireless electric power transmission system transmitting electric power by coupling a power transmission antenna with a power reception antenna through an electromagnetic field, the impedance matching device being provided between a power transmission circuit and the power transmission antenna, includes: an input impedance estimation unit configured to estimate an input impedance equivalent value corresponding to input impedance of the power transmission antenna or a value equivalent thereto; a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; a load value estimation unit configured to estimate a value of a load of a circuit in which the transmitted electric power is consumed, the circuit being connected to the power reception antenna; a storage unit configured to previously store control values each associated with the value of the load and the input impedance equivalent value, each of the control values corresponding to an inductance value and a capacitance value each needed for matching to a predetermined impedance value by use of the first matching circuit or the second matching circuit; a circuit selection unit configured to electrically connect one of the first matching circuit, the second matching circuit and the through circuit based on the estimated value of the load and the estimated input impedance equivalent value; and a control value output unit configured to read out one of the control values stored in the storage unit based on the estimated value of the load and the estimated input impedance equivalent value, and to output the control value to the circuit selected by the circuit selection unit.

The above-mentioned impedance matching device is provided between a power transmission circuit and a power transmission antenna in a wireless electric power transmission system transmitting electric power by coupling the power transmission antenna with a power reception antenna through an electromagnetic field. The impedance matching device includes an input impedance estimation unit, a first matching circuit, a second matching circuit, a through circuit, a load value estimation unit, a storage unit, a circuit selection unit and a control value output unit. The storage unit previously stores control values each associated with the value of the load and the input impedance equivalent value, each of the control values corresponding to an inductance value and a capacitance value each needed for matching to a predetermined impedance value by use of the first matching circuit or the second matching circuit. In addition to an inductance value and a capacitance value, examples of the "control value" herein also include a control voltage value for changing an inductance value and a capacitance value by electric means or by some mechanism such as a motor, and bit patterns for controlling the on/off state of a switch unit such as a MEMS (Micro Electro Mechanical System) and a relay included in a LC network circuit having a plurality of micro inductor elements and micro capacitor elements. The input impedance estimation unit estimates an input impedance equivalent value. The term "input impedance equivalent value" herein indicates a value equivalent to input impedance including not only input impedance of the power transmission antenna but also any value uniquely corresponding to the input impedance. The load value estimation unit estimates a value of a load of a circuit in which the transmitted electric power is consumed, and the circuit is connected to the power reception antenna. The circuit selection unit electrically connects one of the first matching circuit, the second matching circuit and the through circuit based on the estimated value of the estimated load and the estimated input impedance equivalent value. The control value output unit reads out one of the control values stored in the storage unit based on the estimated value of the load and the estimated input impedance equivalent value, and outputs the control value to the circuit selected by the circuit selection unit. In this way, when electric power is transmitted in a state that the power transmission antenna and the power reception antenna are coupled via electromagnetic field, the impedance matching device matches the impedance between the power transmission circuit and the power transmission antenna in accordance with the value of the load on the power-reception side and the coupling state between the power transmission antenna and the power reception antenna. Thereby, the impedance matching device can transmit electric power inputted from power-transmission side to the power-reception side without loss of the electric power.

In one mode of the impedance matching device, the storage unit previously stores the control values and flag information each pair of which associated with the value of the load and the input impedance equivalent value, the flag information indicating either the first matching circuit or the second matching circuit to which the control value is applied, and the circuit selection unit electrically connects either one of the first matching circuit or the second matching circuit based on the flag information determined from the estimated value of the load and the estimated input impedance equivalent value. According to this mode, the impedance matching device associates flag information indicating a matching circuit to be used with the value of the load and the input impedance equivalent value, and stores it on the storage unit in advance. Thereby, the impedance matching device can precisely and easily select the matching circuit to be used based on the estimated load value and the input impedance equivalent value.

In another mode of the impedance matching device, each of the control values is determined based on a locus of variation of impedance inputted from the power transmission circuit to the power transmission antenna in a condition that coupling state between the power transmission antenna and the power reception antenna is changed while the value of the load of the circuit is fixed. By storing control values set in this way in advance and matching the impedance, the impedance matching device can reduce processing steps, necessary memory amount and the necessary scale of the circuit.

According to another preferable embodiment of the present invention, an impedance matching device included in a wireless electric power transmission system transmitting electric power by coupling a power transmission antenna with a power reception antenna through an electromagnetic field, the impedance matching device being provided between a power transmission circuit and the power transmission antenna, includes: an input impedance estimation unit configured to estimate an input impedance equivalent value corresponding to input impedance of the power transmission antenna or a value equivalent thereto; a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; a coupling coefficient estimation unit configured to estimate a coupling coefficient between the power transmission antenna and the power reception antenna; a storage unit configured to previously store control values each associated with the coupling coefficient and the input impedance equivalent value, each of the control values corresponding to an inductance value and a capacitance value each needed for matching to a predetermined impedance value by use of the first matching circuit or the second matching circuit; a circuit selection unit configured to electrically connect one of the first matching circuit, the second matching circuit and the through circuit based on the estimated coupling coefficient and the estimated input impedance equivalent value; a control value output unit configured to read out one of the control values stored in the storage unit based on the estimated coupling coefficient and the estimated input impedance equivalent value, and to output the control value to the circuit selected by the circuit selection unit.

The above-mentioned impedance matching device is provided between a power transmission circuit and the power transmission antenna in a wireless electric power transmission system transmitting electric power by coupling a power transmission antenna with a power reception antenna through an electromagnetic field. The impedance matching device includes an input impedance estimation unit, a first matching circuit, a second matching circuit, a through circuit, a coupling coefficient estimation unit, a storage unit, a circuit selection unit and a control value output unit. The storage unit previously stores control values each associated with the coupling coefficient and the input impedance equivalent value, each of the control values corresponding to an inductance value and a capacitance value each needed for matching to a predetermined impedance value by use of the first matching circuit or the second matching circuit. The input impedance estimation unit estimates an input impedance equivalent value corresponding to input impedance of the power transmission antenna or a value equivalent thereto. The coupling coefficient estimation unit estimates a coupling coefficient between the power transmission antenna and the power reception antenna. The circuit selection unit electrically connects one of the first matching circuit, the second matching circuit and the through circuit based on the estimated coupling coefficient and the estimated input impedance equivalent value. The control value output unit reads out one of the control values stored in the storage unit based on the estimated coupling coefficient and the estimated input impedance equivalent value, and outputs the control value to the circuit selected by the circuit selection unit. In this way, when electric power is transmitted in a state that the power transmission antenna and the power reception antenna are coupled via electromagnetic field, the impedance matching device matches the impedance between the power transmission circuit and the power transmission antenna in accordance with the coupling coefficient between the power transmission antenna and the power reception antenna and the value of the load on the power-reception side. Thereby, the impedance matching device can transmit electric power inputted from power-transmission side to the power-reception side without loss of the electric power.

In one mode of the impedance matching device, the storage unit previously stores the control values and flag information each pair of which associated with the coupling coefficient and the input impedance equivalent value, the flag information indicating either the first matching circuit or the second matching circuit to which the control value is applied, and the circuit selection unit electrically connect either one of the first matching circuit or the second matching circuit based on the flag information determined from the estimated coupling coefficient and the estimated input impedance equivalent value. According to this mode, the impedance matching device associates flag information indicating a matching circuit to be used with the coupling coefficient and the input impedance equivalent value, and stores it on the storage unit in advance. Thereby, the impedance matching device can precisely and easily select the matching circuit to be used based on the estimated coupling coefficient and the estimated input impedance equivalent value.

In another mode of the impedance matching device, each of the control values is determined based on a locus of variation of impedance inputted from the power transmission circuit to the power transmission antenna in a condition that the value of the load of the circuit is changed while coupling state between the power transmission antenna and the power reception antenna is fixed. By storing control values set in this way in advance and matching the impedance, the impedance matching device can reduce processing steps, necessary memory amount and the necessary scale of the circuit.

In another mode of the impedance matching device, the impedance matching device further includes an incident-wave/reflective-wave extraction unit configured to extract incident wave voltage corresponding to an output signal from the power transmission circuit and reflective wave voltage corresponding to a signal reflected from the power transmission antenna; a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; a phase difference calculation unit configured to compare a phase of the incident wave voltage to a phase of the reflective wave voltage and to calculate a phase difference between the phases, and the input impedance estimation unit estimates the reflection-coefficient-absolute-value equivalent value and the phase difference as the input impedance equivalent value. The term "reflection-coefficient-absolute-value equivalent value" herein indicates a value equivalent to the absolute value of a reflection coefficient such as the absolute value of a reflection coefficient and any value uniquely corresponding thereto, and examples thereof include the absolute value of a reflection coefficient and the absolute value of impedance. In this way, by estimating the reflection-coefficient-absolute-value equivalent value and the above-mentioned phase difference, the impedance matching device can identify the input impedance and can preferably determine the matching circuit to be used and the control value to be applied thereto.

In another mode of the impedance matching device, the impedance matching device further includes an incident-wave/reflective-wave extraction unit configured to extract incident wave voltage corresponding to an output signal from the power transmission circuit and reflective wave voltage corresponding to a signal reflected from the power transmission antenna; a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto, and the circuit selection unit selects the through circuit if the reflection-coefficient-absolute-value equivalent value is equal to or smaller than a predetermined value. Thereby, preferably, the impedance matching device can match the impedance only when loss of the electric power due to the reflection exceeds a predetermined tolerable value.

In another mode of the impedance matching device, the control value is quantized such that the larger an absolute value of a reflection coefficient is, the shorter the quantizing interval becomes. By matching the impedance based on the above-mentioned control value, the impedance matching device can continuously suppress the reflection loss after the matching process up to a predetermined threshold.

According to another preferable embodiment of the present invention, a control method executed by an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; and a storage unit configured to previously store control values each associated with a value of a load of a circuit in which the transmitted electric power is consumed and an input impedance equivalent value, each of the control values corresponding to an inductance value and a capacitance value each needed for matching to a predetermined impedance value by use of the first matching circuit or the second matching circuit, the input impedance equivalent value corresponding to input impedance of the power transmission antenna or a value equivalent thereto, the circuit being connected to the power reception antenna, includes: an input impedance estimation process for estimating the input impedance equivalent value; a load value estimation process for estimating the value of the load; a circuit selection process for electrically connecting one of the first matching circuit, the second matching circuit and the through circuit based on the estimated value of the load and the estimated input impedance equivalent value; and a control value output process for reading out one of the control values stored in the storage unit based on the estimated value of the load and the estimated input impedance equivalent value, and for outputting the control value to the circuit selected in the circuit selection process.

According to another preferable embodiment of the present invention, a control method executed by an impedance matching device included in a wireless electric power transmission system transmitting electric power by coupling a power transmission antenna with a power reception antenna through an electromagnetic field, the impedance matching device being provided between a power transmission circuit and the power transmission antenna, the impedance matching device including: a first matching circuit configured to include a variable inductor element and a variable capacitor element, the variable inductor element being connected in series between the power transmission circuit and the power transmission antenna, the variable capacitor element being connected in parallel closer to the power transmission antenna than the variable inductor element; a second matching circuit configured to include a variable inductor element and a variable capacitor element, the variable inductor element being connected in series between the power transmission circuit and the power transmission antenna, the variable capacitor element being connected in parallel closer to the power transmission circuit than the variable inductor element; a through circuit connected in series between the power transmission circuit and the power transmission antenna; and a storage unit configured to previously store control values each associated with a coupling coefficient between the power transmission antenna and the power reception antenna and an input impedance equivalent value, each of the control values corresponding to an inductance value and a capacitance value each needed for matching to a predetermined impedance value by use of the first matching circuit or the second matching circuit, the input impedance equivalent value corresponding to input impedance of the power transmission antenna or a value equivalent thereto, includes: an input impedance estimation process for estimating the input impedance equivalent value; a coupling state estimation process for estimating the coupling coefficient; a circuit selection process for electrically connecting one of the first matching circuit, the second matching circuit and the through circuit based on the estimated coupling coefficient and the estimated input impedance equivalent value; and a control value output process for reading out one of the control values stored in the storage unit based on the estimated coupling coefficient and the estimated input impedance equivalent value, and for outputting the control value to the circuit selected in the circuit selection process.

EMBODIMENT

Hereinafter, preferred embodiments of the present invention will be explained with reference to the drawings after a basic explanation relating to fundamental technologies of the present invention and problems thereof.

<Basic Explanation>

FIG. 1 illustrates an example of an antenna (power transmission/reception antenna) used for a power transmission antenna and a power reception antenna which are based on the electromagnetic resonance mode. The power transmission/reception antenna illustrated in FIG. 1 is an antenna having winding wires each formed into a helical shape on the upper surface and the bottom surface, and it includes a winding wire 101 on the upper surface, an winding wire (not shown) on the bottom surface, a feeding point 102 and a support material (dielectric) 103. The diameter of the power transmission/reception antenna is 30 cm, and the number of turns on the upper surface and the bottom surface is 5.2, and the pitch of the winding wires is 7 mm, and the distance between the upper surface and the bottom surface is 15 mm. The tip of each surface of the power transmission/reception antenna is open, and the power transmission/reception antenna supplies or receives electric power from the feeding point 102 existing on the center of the winding wire on the upper surface or the bottom surface.

In this case, provided that parameters relating to the electric circuit of the antenna illustrated in FIG. 1 is calculated by an electromagnetic analysis, inductance "L" is "8.64 pH", capacitance "C" is "17.49 pF" and loss resistance "R" is "1.0Ω". The power transmission/reception antenna functions as a serial resonance circuit having these constant values. In this case, the resonance frequency "fo" is "$1/(2\pi\sqrt{(LC)})$=12.947 MHz".

Figure 2:
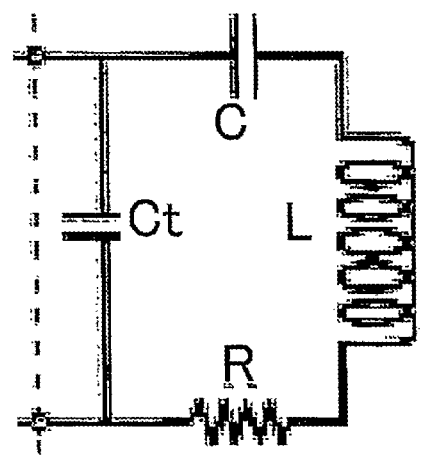
FIG. 2 illustrates a series parallel equivalent circuit having a capacitor connected in parallel with the serial resonance circuit.

FIG. 2 is a series parallel equivalent circuit indicating an equivalent circuit model precisely expressing the power transmission/reception antenna illustrated in FIG. 1. The series parallel equivalent circuit has a capacitor connected in parallel with the serial resonance circuit. In the case of the power transmission/reception antenna illustrated in FIG. 1, the parallel capacitor "Ct" is "10.08 pF".

Figure 3:
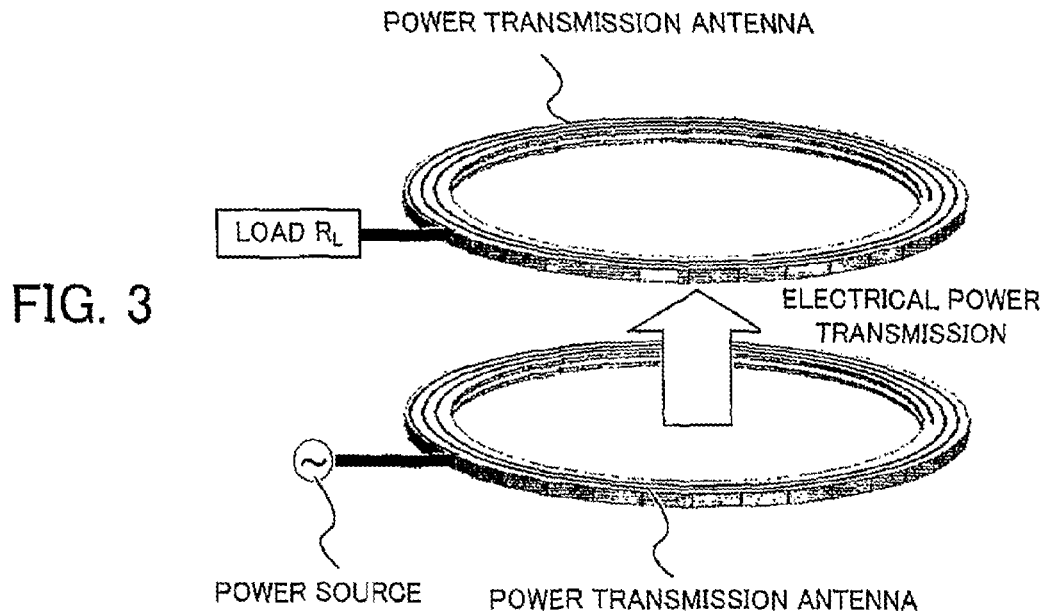
FIG. 3 illustrates an electric power transmission system in which the power transmission antenna and the power reception antenna are arranged to face each other.

In a case of wireless electric power transmission based on an electromagnetic resonance mode, two antennas each of which is illustrated in FIG. 1 are placed to face each other on the power transmission side and the power reception side, respectively. A power transmission-side circuit (power source) is connected to the power transmission antenna, and a load is connected to the power reception antenna via coaxial cables, respectively. The state thereof is illustrated in FIG. 3. FIG. 3 illustrates an electric power transmission system in which antennas each illustrated in FIG. 1 are arranged to face each other as the power transmission antenna and the power reception antenna. As illustrated in FIG. 3, the power source is connected to the power transmission antenna, and the load is connected to the power reception antenna.

Figure 4:
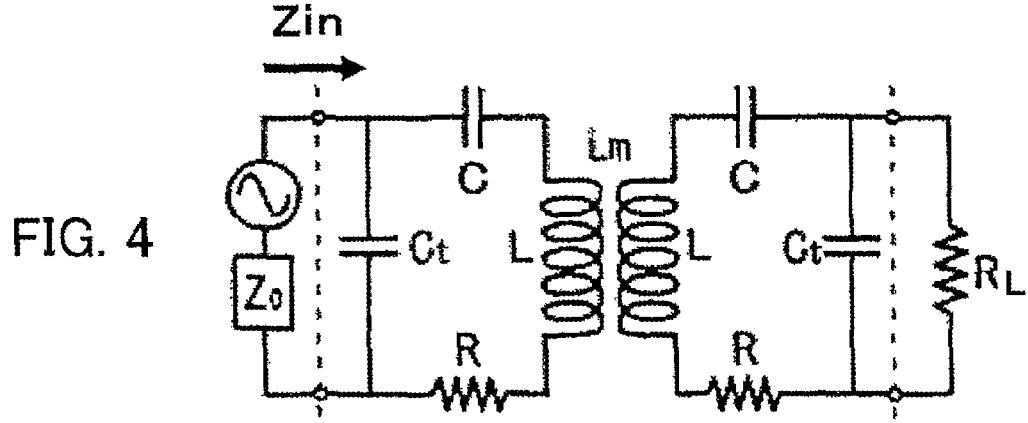
FIG. 4 is an example of the electric power transmission system expressed by use of a series parallel equivalent circuit.

FIG. 4 is an example of the electric power transmission system illustrated in FIG. 3 and expressed by use of a series parallel equivalent circuit. The symbol "Lm" stands for mutual inductance in a state where the power transmission antenna is magnetically connected to the power reception antenna. Provided that the same antennas are used for the power transmission antenna and the power reception antenna (this is not a necessary requirement if the resonance frequencies of these antennas are identical), the equation "Lm=kL" is true, wherein the symbol "k" is coupling coefficient. The coupling coefficient k is determined depending on the positional relationship between the power transmission antenna and the power reception antenna such as the width of the gap (interval) thereof and the amount of the misalignment thereof. Changing the width of the gap or the amount of the misalignment may be considered to be equivalent to changing the coupling coefficient k.

The input impedance "Zin" at the edge (simply referred to as "edge of the power transmission antenna") of the power transmission antenna where the electric power enters will be examined by use of the equivalent circuit expression illustrated in FIG. 4, with respect to the following two cases:

(1) the coupling coefficient k between the power transmission antenna and the power reception antenna is changed while the value "RL" of the load is fixed;

(2) the value of the load on the power reception side is changed while the coupling coefficient k is fixed.

It is noted that the frequency (hereinafter referred to as "drive frequency") of the power transmission circuit is the same as the resonance frequency "12.947 MHz" between the power transmission antenna and the power reception antenna.

Figure 5A:
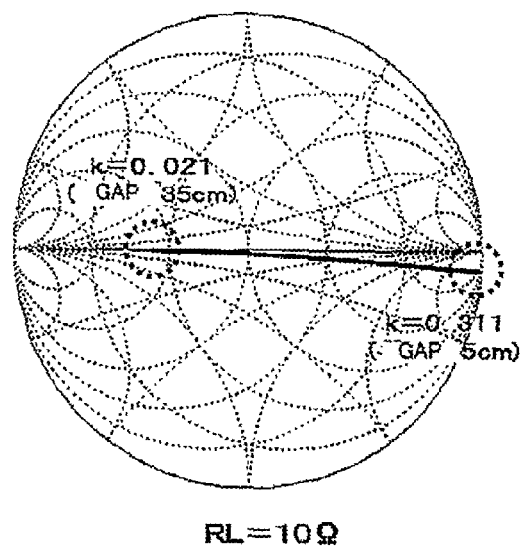
FIGS. 5A to 5C each illustrates a Smith chart in which a locus of the input impedance is plotted, wherein the coupling coefficient between the power transmission antenna and the power reception antenna is changed within the range of "0.311 to 0.021" while the load value is fixed.
Figure 5B:
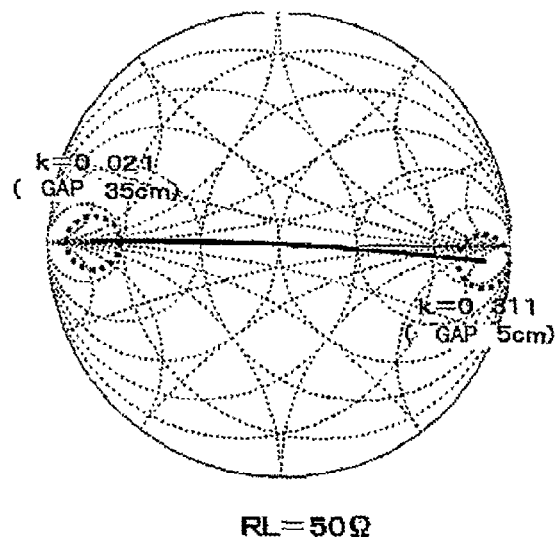
Figure 5C:
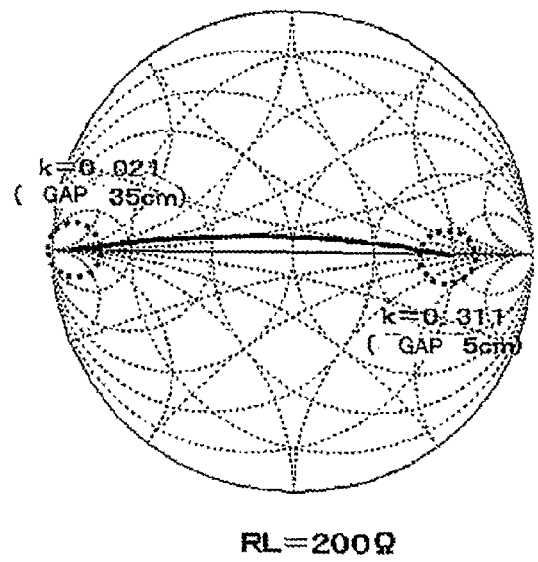
Figure 6A:
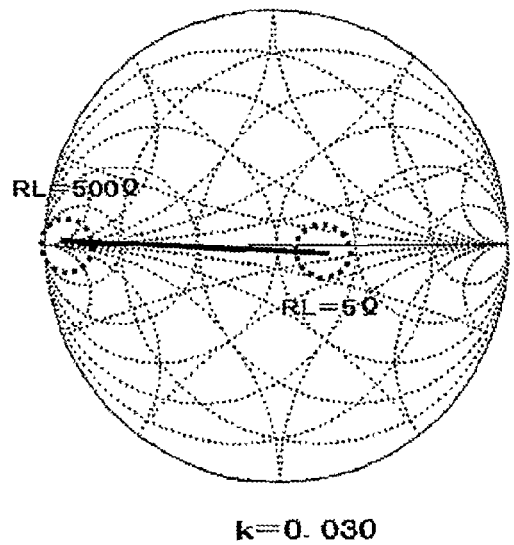
FIGS. 6A to 6C each illustrates a Smith chart in which a locus of the input impedance is plotted, wherein the load value is changed within the range of "5Ω" to "500Ω" while the coupling coefficient k between the power transmission antenna and the power reception antenna is fixed.
Figure 6B:
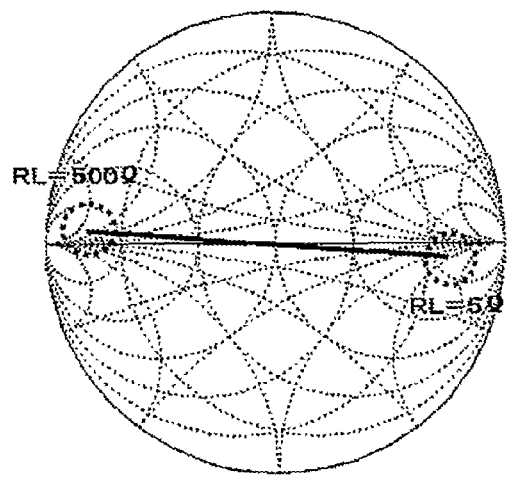
Figure 6C:
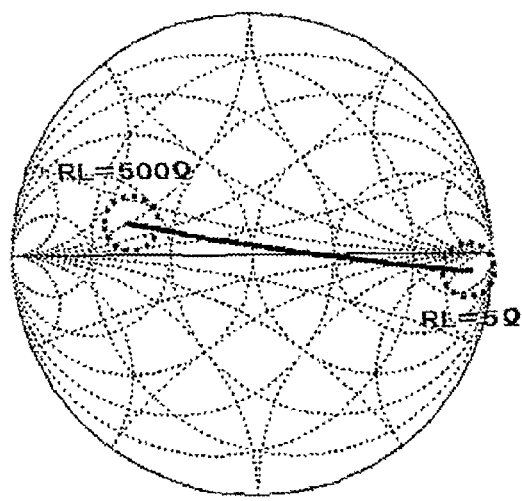

FIGS. 5A to 5C each illustrates a Smith chart in which a locus of the input impedance Zin is plotted, wherein the coupling coefficient k between the power transmission antenna and the power reception antenna is changed within the range of "0.311 to 0.021" while the load value RL is fixed at 10Ω in the case of FIG. 5A, 50Ω in the case of FIG. 5B and 200Ω in the case of FIG. 5C, respectively. Provided that the antenna illustrated in FIG. 1 is used as each of the power transmission antenna and the power reception antenna and that the positional misalignment in the horizontal direction is zero, the coupling coefficient "k=0.311" corresponds to a state that the width of the gap between the power transmission antenna and the power reception antenna is "5 cm" whereas the coupling coefficient "k=0.021" corresponds to a state that the width of the gap is "35 cm". FIGS. 6A to 6C each illustrates a Smith chart in which a locus of the input impedance Zin is plotted, wherein the load value RL is changed within the range of "5Ω" to "500Ω" while the coupling coefficient k is fixed at 0.030 in the case of FIG. 6A, 0.064 in the case of FIG. 6B and 0.120 in the case of FIG. 6C, respectively. Provided that the antenna illustrated in FIG. 1 is used as each of the power transmission antenna and the power reception antenna and that the positional misalignment in the horizontal direction is zero, the coupling coefficient "k=0.030" corresponds to a state that the width of the gap between the power transmission antenna and the power reception antenna is "29 cm" whereas the coupling coefficient "k=0.12" corresponds to a state that the width of the gap is "13 cm".

As illustrated in FIGS. 5A to 5C, if the coupling coefficient k is changed while the load value RL is fixed, each of the loci of the input impedance Zin at the edge of the power transmission antenna varies particularly around the axis corresponding to "X=0Ω" ("X" is the reactance component) in the horizontal direction on the Smith charts. Each of the loci is positioned relatively towards the right of the Smith charts as the value RL of the load becomes small, and towards the left as the value RL of the load becomes large. Thus, when the value RL of the load is relatively small such as "10Ω", the locus of the input impedance Zin is positioned towards the right (see FIG. 5A). In contrast, when the load value RL is relatively large such as "200Ω", the locus of the input impedance Zin is positioned towards the left (see FIG. 5C). When the load value RL is a medium value such as "50Ω", the locus of the input impedance Zin ranges without substantially slanting leftward or rightward.

In contrast, as illustrated in FIGS. 6A to 6C, if the value RL of the load is changed while the coupling coefficient k is fixed, each of the loci of the input impedance Zin at the edge of the power transmission antenna varies particularly around the axis corresponding to "X=0Ω" in the horizontal direction on the Smith charts. Each of the loci is positioned relatively towards the left of the Smith charts as the coupling coefficient k becomes small, and towards the right as the coupling coefficient k becomes large. Thus, when the coupling coefficient k is relatively small such as "0.030", the locus of the input impedance Zin is positioned towards the left (see FIG. 6A). In contrast, when the coupling coefficient k is relatively large such as "0.12", the locus of the input impedance Zin is positioned towards the right (see FIG. 6C). When the coupling coefficient k is a medium value such as "0.064", the locus of the input impedance Zin ranges without substantially slanting leftward or rightward.

As described above, the input impedance Zin at the edge of the power transmission antenna has a different locus on the Smith chart in the following cases:
(1) the coupling coefficient k between the power transmission antenna and the power reception antenna is changed; and
(2) the value RL of the load on the reception side is changed.

In addition, the locus of the input impedance Zin in the above cases varies particularly around the axis corresponding to "X=0Ω" in the horizontal direction on the Smith charts.

Above things considered, there is a necessity of a process (referred to as "automatic matching operation" or "automatic matching process") for automatically and promptly matching the impedance at the edge of the power transmission antenna having one of these different impedance loci to the output impedance (i.e., matching point) of the power transmission circuit. The detail of the automatic matching operation will be described in the first embodiment and in the second embodiment.

Figure 7:
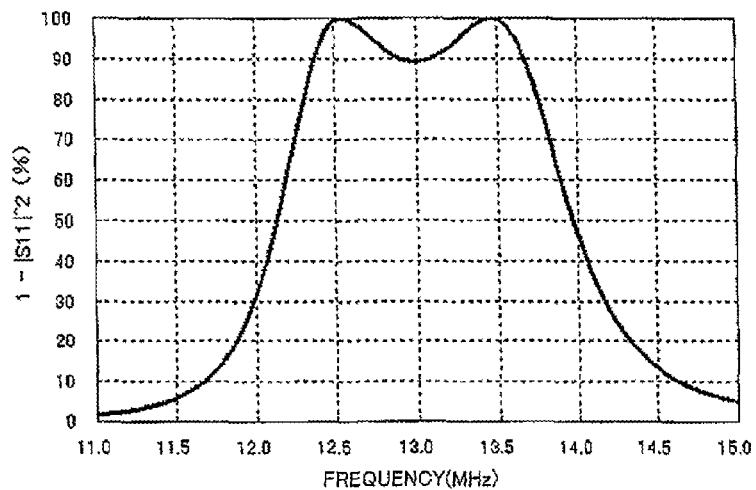
FIG. 7 illustrates a graph of the ratio of electric power supplied to the power transmission antenna to electric power supplied from the power source.

Next, a description will be given of the effects of matching the input impedance Zin at the edge of the power transmission antenna to the output impedance of the power transmission circuit. FIG. 7 illustrates a graph of the ratio $(1-|S_{11}|^2)$ of "electric power supplied to the power transmission antenna" to "electric power supplied from the power source", wherein the symbol "$S_{11}$" is identical to the reflection coefficient and therefore $|S_{11}|^2$ is identical to the reflection coefficient of the electric power reflected and returned after the supply from the power source. In the case of FIG. 7, the power transmission antenna and the power reception antenna are arranged to face each other as illustrated in FIG. 4, and the antenna illustrated in FIG. 1 is used for the power transmission antenna and power reception antenna, and the value RL of the load is set to "50Ω", and the coupling coefficient k is set to 0.1, i.e., a value in conditions that the width of the gap is "15 cm" and that there is no misalignment.

According to FIG. 7, the above-mentioned ratio at the drive frequency 12.947 MHz is 89.4%. In this case, the input impedance Zin at the edge of the power transmission antenna at the driving frequency 12.947 MHz is "97.86-3.98j (Ω)". Thus, in this case, since the input impedance Zin is not equal to "50Ω" that is the output impedance of the power transmission circuit, there is 10% loss due to the mismatch.

Figure 8:
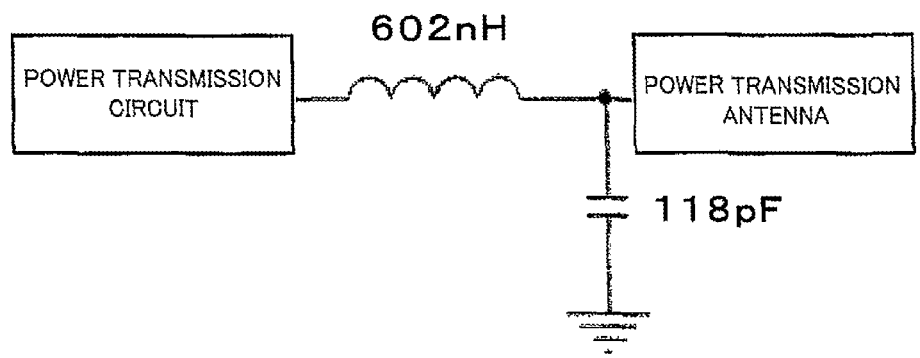
FIG. 8 illustrates a matching circuit for matching the input impedance at the edge of the power transmission antenna to "50Ω".
Figure 9:
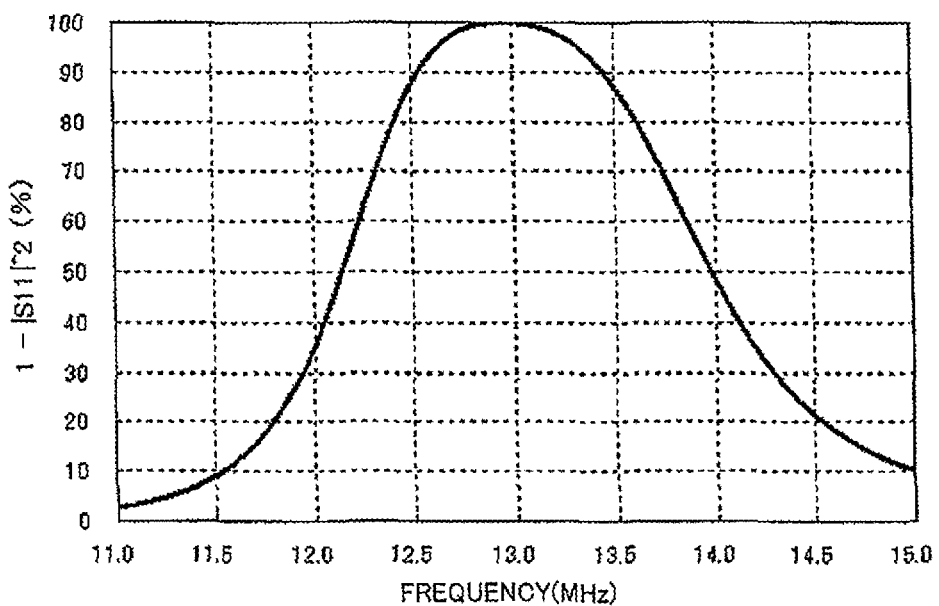
FIG. 9 illustrates a graph of the ratio of the electric power supplied to the power transmission antenna 3 to the electric power supplied from the power source 20 in a state that the matching circuit illustrated in FIG. 8 is added.

FIG. 8 illustrates a matching circuit for matching the input impedance Zin at the edge of the power transmission antenna to "50Ω". FIG. 9 illustrates a graph of the ratio of the electric power supplied to the power transmission antenna to the electric power supplied from the power source in a state that the matching circuit illustrated in FIG. 8 is added. As illustrated in FIG. 9, in the state that the matching circuit illustrated in FIG. 8 is added, the above-mentioned ratio at the drive frequency "12.947 MHz" is 100%. In this case, the input impedance Zin at the edge of the power transmission antenna is matched to the output impedance of the power transmission circuit, and there is no loss due to the mismatch.

Figure 10A:
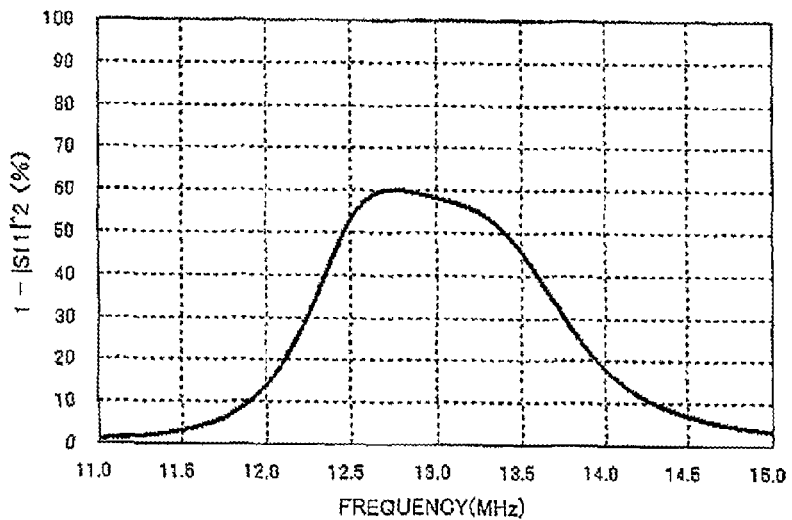
FIG. 10A indicates the ratio of the electric power supplied to the power transmission antenna to the electric power supplied from the power source in the case that the load value falls to "10Ω" while the coupling coefficient remains "0.1" in the matching state illustrated in FIG. 9.
Figure 10B:
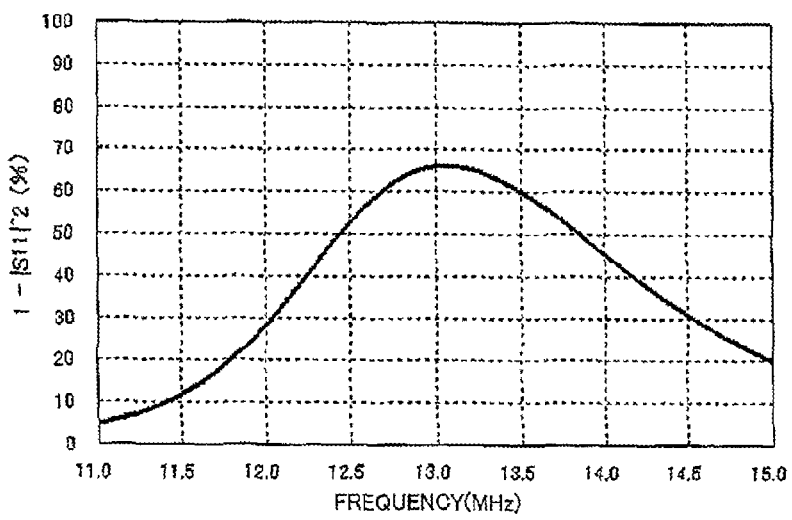
FIG. 10B indicates the ratio of the electric power supplied to the power transmission antenna to the electric power supplied from the power source in the case that the load value has increased to "200Ω" while the coupling coefficient k remains "0.1" in the matching state illustrated in FIG. 9.

Next, a description will be given of the influence caused by the change of the value RL of the load after the matching process. FIG. 10A indicates the ratio of the electric power supplied to the power transmission antenna to the electric power supplied from the power source in the case that the value RL of the load falls to "10Ω" while the coupling coefficient k remains "0.1" in the matching state illustrated in FIG. 9. FIG. 10B indicates the ratio of the electric power supplied to the power transmission antenna to the electric power supplied from the power source in the case that the value RL of the load has increased to "200Ω" while the coupling coefficient k remains "0.1" in the matching state illustrated in FIG. 9. When the value RL of the load varies from the matching state in this way, the ratio "$1-|S_{11}|^2$" at the drive frequency "12.947 MHz" falls to 58.7% in the case of FIG. 10A whereas it falls to 65.7% in the case of FIG. 10B.

Figure 11A:
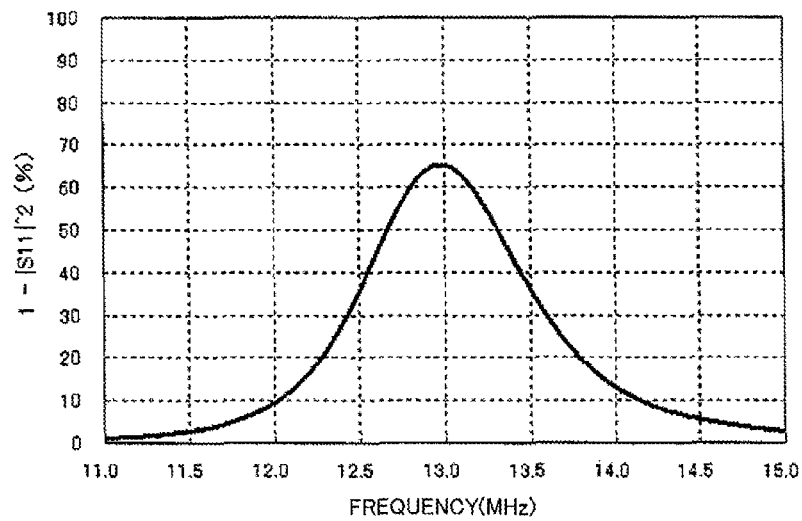
FIG. 11A indicates the ratio of the electric power supplied to the power transmission antenna to the electric power supplied from the power source in the case that the load value remains "50Ω" while the coupling coefficient falls to "0.05" in the matching state illustrated in FIG. 9.
Figure 11B:
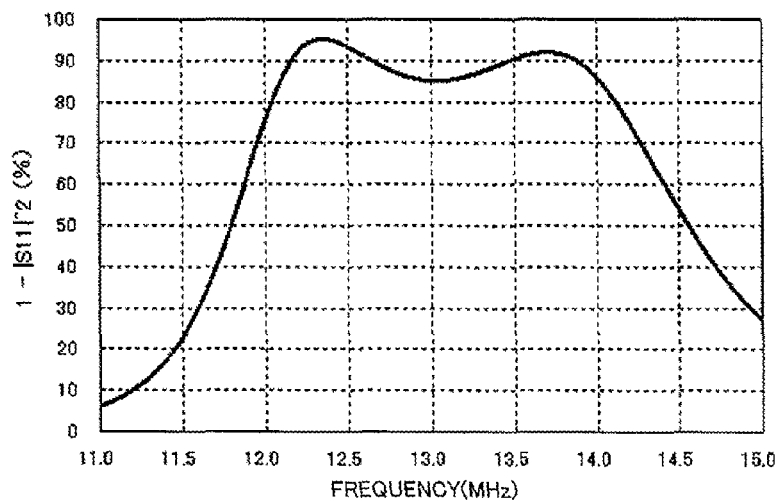
FIG. 11B indicates the ratio of the electric power supplied to the power transmission antenna to the electric power supplied from the power source in the case that the load value remains "50Ω" while the coupling coefficient has increased to "0.15" in the matching state illustrated in FIG. 9.

Next, a description will be given of the influence caused by the change of the coupling coefficient k after matching process. FIG. 11A indicates the ratio of the electric power supplied to the power transmission antenna to the electric power supplied from the power source in the case that the value RL of the load remains "50Ω" while the coupling coefficient k falls to "0.05" in the matching state illustrated in FIG. 9. FIG. 11B indicates the ratio of the electric power supplied to the power transmission antenna to the electric power supplied from the power source in the case that the value RL of the load remains "50Ω" while the coupling coefficient k has increased to "0.15" in the matching state illustrated in FIG. 9. When the coupling coefficient k varies from the matching state in this way, the ratio "$1-|S_{11}|^2$" at the drive frequency "12.947 MHz" falls to 65.1% in the case of FIG. 11A whereas it falls to 85.4% in the case of FIG. 11B.

As described above, the input impedance Zin becomes mismatched from the matching point because of the variation of the value RL of the load for some reason and/or the variation of the coupling coefficient k through the variation of the gap between the power transmission/reception antenna, even though the matching circuit which makes the input impedance Zin at the edge of the power transmission antenna most suitable for (1) a predetermined coupling coefficient k between the power transmission antenna and the power reception antenna, and
(2) a predetermined value RL of the load at the reception side, is added to between the power transmission circuit and the power transmission antenna. As a result, the reflection loss at the time of supplying the electric power from the power transmission circuit to the power transmission antenna becomes large, which causes the deterioration of the transmitting efficiency.

In consideration of the above fact, there is a necessity of a process (referred to as "matching-state tracking operation" or "matching-state tracking process") for constantly and promptly tracking the matching state by detecting the mismatch from the matching state as soon as possible and properly changing a constant value applied to the matching circuit even in an event of the mismatch from the matching state due to the variation of the value RL of the load and/or due to the variation of the coupling coefficient k between the power transmission antenna and the power reception antenna after once having the impedance matched on a predetermined condition. The detail description of the matching-state tracking operation will be given in the first embodiment and the second embodiment described later.

Next, a description will be given of applications of the electric power transmission system which meets the above-mentioned conditions. The contactless charging system for an electric vehicle is thought as a major application of the wireless electric power transmission mode in accordance with the electromagnetic resonance mode. Regarding the charge of the battery of an electric vehicle, the load variation depending on the amount of the charge of the battery should be considered as well as the load variation caused by the time-series switchover between the charge in the constant current mode and the charge in the constant voltage mode. It can be also assumed that the width of the gap and/or the amount of the misalignment between the power transmission antenna and the power reception antenna are continuously changed over time, particularly during the charge while running. In these cases, by providing the electric power transmission system constantly and promptly tracking the matching state, an efficient contactless charging system can be achieved.

First Embodiment

Next, a description will be given of the first embodiment to which the present invention is preferably applied. Regarding the first embodiment, a description will be given of a case that the coupling state (coupling coefficient k) between the power transmission antenna and the power reception antenna is changed while the value RL of the load is fixed. In summary, the electric power transmission system estimates the value RL of the load and the input impedance Zin at the edge of the power transmission antenna to determine the matching circuit to be used and the control value to be applied to the matching circuit by referring to a predetermined table (referred to as "matching correction amount table") on the basis of the estimation values. Thereby, the electric power transmission system matches the input impedance Zin of the power transmission antenna to the output impedance of the power transmission circuit. In addition, the electric power transmission system keeps the matching state through the matching-state tracking operation for keeping the matching state after once having the impedance matched.

[Schematic Configuration]

Figure 12:
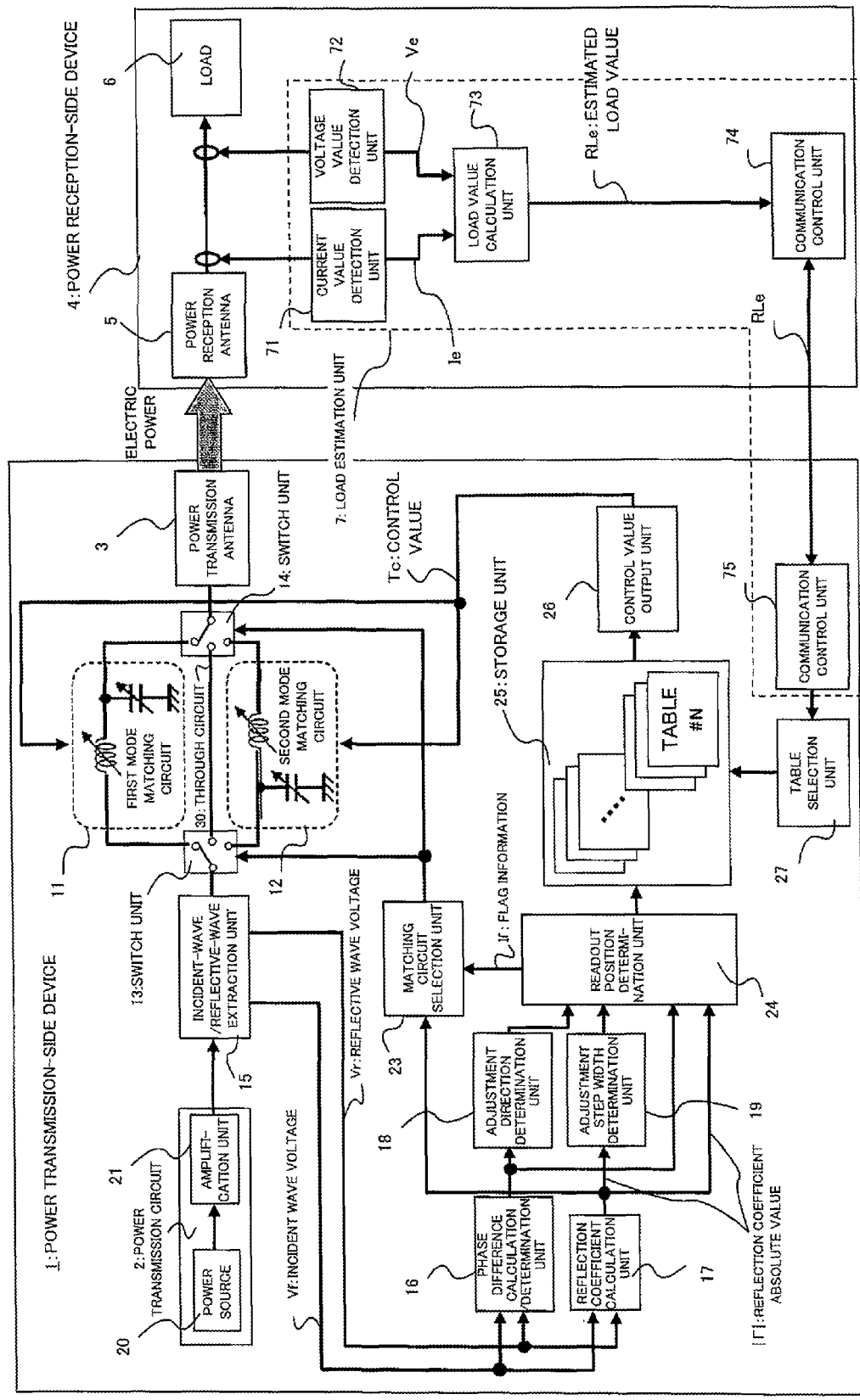
FIG. 12 is a schematic configuration of the electric power transmission system according to the first embodiment.

FIG. 12 is a schematic configuration of the electric power transmission system according to the first embodiment. As illustrated in FIG. 12, the electric power transmission system includes a power transmission-side device 1 equipped with a power transmission circuit 2 and a power transmission antenna 3, and a power reception-side device 4 equipped with a power reception antenna 5 and a load 6.

The power transmission circuit 2 includes a power source 20 and an amplification unit 21. The amplification unit 21 controls the amount of the electric power transmitted from the power source 20 while functioning as a control circuit which controls the start and the end of the transmission of the electric power from the power source 20.

A first mode matching circuit 11 includes a variable inductance element inserted in series between the power transmission circuit 2 and the power transmission antenna 3, and a variable capacitance element connected in parallel at the edge on the side of the power transmission antenna 3. The second mode matching circuit 12 includes a variable inductance element inserted in series between the power transmission circuit 2 and the power transmission antenna 3, and a variable capacitance element connected in parallel at the edge on the side of the power transmission circuit 2. Hereinafter, each of the first mode matching circuit 11 and the second mode matching circuit 12 is simply and inclusively referred to as "matching circuit".

The storage unit 25 stores a plurality of matching correction amount tables each of which corresponds to a different load value. Each of the matching correction amount tables stores flag information "If" and control values "Tc" to be applied to the matching circuit. The flag information indicates which to select from the first mode matching circuit 11 and the second mode matching circuit 12. Each raw of the matching correction amount table has an index (referred to as "index number Idx") which is a sequential serial number, and the control values Tc are arranged in order of increasing the coupling coefficient k corresponding thereto. The concrete example of the matching correction amount table will be explained with reference to FIG. 13. It is noted that the control value Tc indicates a inductance value (referred to as "inductance value L") and a capacitance value (referred to as "capacitance value C") which are to be applied to the first mode matching circuit 11 or the second mode matching circuit 12. As described later, the control value Tc is determined based on the locus indicating the variation of the input impedance Zin seen from the power transmission circuit 2 to the power transmission antenna 3 in a condition that the power transmission antenna 3 and the power reception antenna 5 in the electromagnetic resonance coupling mode are positioned to face each other and that the gap thereof is changed.

The switch units 13 and 14 each electrically connects one of the first mode matching circuit 11, the second mode matching circuit 12 and the through circuit 30 between the power transmission circuit 2 and the power transmission antenna 3. The through circuit 30 is composed of an electric cable.

The load estimation unit 7 includes a current value determination unit 71, a voltage value detection unit 72, a load value calculation unit 73 and communication control units 74 and 75, and calculates an estimated value RL (referred to as "load estimation value RLe") of the load 6 of the power reception-side device 4 prior to the transmission of the rated electric power (i.e., electric power to be transmitted). Specially, when the power transmission antenna 3 transmits a small electric power prior to the transmission of the rated electric power, the current value determination unit 71 detects the current flowing through the load 6 and supplies the detected current value (referred to as "detected current value Ie") to the load value calculation unit 73. The voltage value detection unit 72 detects the voltage of the load 6 and supplies the detected voltage (referred to as "detected voltage value Ve") to the load value calculation unit 73. Then, the load value calculation unit 73 calculates the estimated load value RLe based on the detected current value Ie supplied from the current value determination unit 71 and the detected voltage value Ve supplied from the voltage value detection unit 72. Specially, the load value calculation unit 73 determines the impedance value calculated by dividing the detected voltage value Ve by the detected current value Ie as the estimated load value RLe. The communication control unit 74 in the power reception-side device 4 transmits the estimated load value RLe calculated by the load value calculation unit 73 to the communication control unit 75 in the power transmission-side device 1 via a wireless control communication unit other than the wireless communication unit for transmitting the electric power. Thereafter, the estimated load value RLe is supplied to the table selection unit 27.

The table selection unit 27 selects the matching correction amount table corresponding to the load value nearest to the supplied estimated load value RLe from plural matching correction amount tables each corresponding to a different load value stored by the storage unit 25. The detail of the matching correction amount table will be described later.

The incident-wave/reflective-wave extraction unit 15, the phase difference calculation/determination unit 16 and the reflection coefficient calculation unit 17 perform processing for calculating the input impedance Zin at the edge of the power transmission antenna corresponding to the present value RL of the load 6 when a small electric power is transmitted from the power transmission antenna 3 prior to the transmission of the rated electric power. Specifically, the incident-wave/reflective-wave extraction unit 15 separates the incident wave voltage "Vf" (Vf=|Vf|exp(jθ1): "θ1" is the phase of Vf) corresponding to a signal outputted from the power transmission circuit 2 from the reflective wave voltage "Vr" (Vr=|Vr|exp(jθ2): "θ2" is the phase of Vr) corresponding to a signal reflected and returned from the power transmission antenna 3 because of the mismatch of the impedance, and extracts each of them. Preferably, the incident-wave/reflective-wave extraction unit 15 is a directional coupler. The reflection coefficient calculation unit 17 calculates the absolute value |Γ| of the reflection coefficient "Γ" by using the amplitude value |Vr| of the incident wave voltage Vf and the amplitude value |Vr| of the reflective wave voltage Vr according to the following equation (1).

$$|\Gamma| = \frac{|V_r|}{|V_f|} \quad (1)$$

The phase difference calculation/determination unit 16 calculates the phase difference "θ" between the phase θ1 of the incident wave voltage Vf and the phase θ2 of the reflective wave voltage Vr according to the following equation (2).

$$\theta = \theta 2 - \theta 1 \quad (2)$$

Then, on the basis of the result, the phase difference calculation/determination unit 16 or the reflection coefficient calculation unit 17 calculates the complex reflection coefficient Γ(Γ=|Γ|exp(jθ)) corresponding to the input impedance Zin at the edge of the power transmission antenna, and converts the value according to the following equation (3) thereby to calculate the input impedance Zin. Here, the symbol "$Z_0$" indicates the target impedance of matching.

$$Zin = \frac{1+\Gamma}{1-\Gamma} Z_0 \quad (3)$$

The readout position determination unit 24 refers to the matching correction amount table selected by the table selection unit 27 and reads out the flag information If indicating the matching circuit to be used and the control value Tc to be applied to the matching circuit from the row of the matching correction amount table having the impedance value nearest to the calculated input impedance Zin. Then, the matching circuit selection unit 23 controls the switch units 13 and 14 based on the flag information If supplied from the readout position determination unit 24 so that one of the first mode matching circuit 11, the second mode matching circuit 12 and the through circuit 30 composed of an electric cable is electrically connected between the power transmission circuit 2 and the power transmission antenna 3. The control value output unit 26 applies the control value Tc read out by the readout position determination unit 24 to the first mode matching circuit 11 or the second mode matching circuit 12 selected by the matching circuit selection unit 23.

Figures 13, 14:
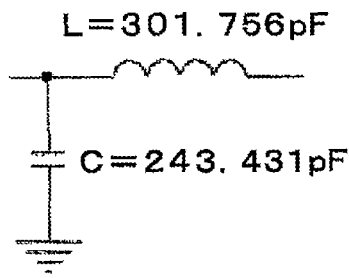
FIG. 13 indicates an example of the matching correction amount table according to the first embodiment.
FIG. 14 illustrates an example of a matching circuit suitable for the embodiment.

A description will be given of the process executed by the readout position determination unit 24, the matching circuit selection unit 23 and the control value output unit 26 by use of a concrete example. FIG. 13 indicates an example of the matching correction amount table corresponding to the load value "50Ω". The matching correction amount table includes capacitance values "C" and inductance values "L" each necessary for matching the input impedance Zin to "50Ω", and flag information If indicating the matching circuit to be used. The input impedance Zin herein is limited within such a range that the coupling coefficient k between the power transmission antenna 3 and the power reception antenna 5 is "0.01 to 0.3". Here, in a case that the flag information If is "1", the flag information If indicates that the first mode matching circuit 11 should be used whereas the flag information If indicates that the second mode matching circuit 12 should be used in a case that the flag information If is "2".

For example, when the input impedance Zin inputted to the readout position determination unit 24 is "27+j0Ω", the readout position determination unit 24 selects the row having such an index number Idx that the "$(R-Ri)^2+(X-Xi)^2$" becomes its minimum value with reference to "Ri" and "Xi" ("i" indicates an index number Idx) stored in the matching correction amount table, and with reference to the real part "R" and the imaginary part "X" of the calculated input impedance Zin. As a result, the row having the index number Idx "5" corresponding to the real part Ri "25.248Ω" and the imaginary part Xi "0.451Ω" illustrated in FIG. 13 is selected. The readout position determination unit 24 reads out the flag information If ("2" in this case) which is information on the mode of the matching circuit from the selected row and supplies it to the matching circuit selection unit 23. In addition, the readout position determination unit 24 reads out the capacitance value C "243.431 pF" and the inductance value L "301.756 nH" and supplies them to the control value output unit 26. In this case, the matching circuit selection unit 23 controls the switch units 13 and 14 so that the second mode matching circuit 12 is connected between the power transmission circuit 2 and the power transmission antenna 3. The control value output unit 26 applies the capacitance value C and the inductance value L supplied from the readout position determination unit 24 to the variable condenser unit and the variable inductor unit of the selected second mode matching circuit 12. FIG. 14 illustrates the matching circuit determined by the above-mentioned process.

In this way, by identifying the input impedance Zin at the edge of the power transmission antenna, the power transmission-side device 1 can promptly perform the impedance matching process between the power transmission circuit 2 and the power transmission antenna 3 with reference to the selected matching correction amount table. For example, if electric vehicles become popular in the future and an electric vehicle stopping at a traffic intersection is charged by a battery charger provided on the road surface, it will be necessary to start the charge after the stop of the vehicle as soon as possible. In such a situation, automatic completion of the impedance matching as soon as possible will lead to prompt transition to a rated electric power transmission.

Next, a description will be given of the phase difference calculation/determination unit 16, the adjustment direction determination unit 18 and the adjustment step width determination unit 19 which perform the process at the matching-state tracking operation after the transition from an initial state to the matching state. The detailed description thereof will be given in the section "Matching-State Tracking Operation".

The phase difference calculation/determination unit 16 recognizes the phase relationship between the incident wave voltage Vf and the reflective wave voltage Vr after the transition from the initial state to the matching state. On the basis of the phase relationship between the incident wave voltage Vf and the reflective wave voltage Vr recognized by the phase difference calculation/determination unit 16, the adjustment direction determination unit 18 determines the direction of the row whose control value Tc is to be read out at the next time with respect to the previously used row (index number Idx) of the matching correction amount table.

On the basis of the reflection coefficient absolute value |Γ|, the adjustment step width determination unit 19 determines whether or not there is a necessity of the change of the present control value Tc to another control value Tc to be used after the transition from an initial state to the matching state. In addition, the adjustment step width determination unit 19 determines the step (shift) width (referred to as "step width Widx") of the index number Idx in the matching correction amount table to read out a new control value Tc.

On the basis of the readout direction determined by the adjustment direction determination unit 18 and the step width Widx, the readout position determination unit 24 determines the row whose control value Tc should be read out in the matching correction amount table.

[Matching Correction Amount Table]

Next, a concrete description will be given of the matching correction amount table stored in the storage unit 25. The matching correction amount table used in the embodiments has such a feature that it is determined based on the locus indicating the variation of the input impedance Zin at the edge of the power transmission antenna illustrated in FIGS. 5A to 5C and FIGS. 6A to 6C. It is noted that FIGS. 5A to 5C each indicates a locus of the input impedance Zin in the case of changing the coupling state (i.e., coupling coefficient k) between the power transmission/reception antenna while fixing the value RL of the load 6 to a predetermined value. In contrast, FIGS. 6A to 6C each indicates a locus of the input impedance Zin in the case of changing the value RL of the load 6 of the power reception-side device 4 while fixing the coupling state between the power transmission/reception antenna to a predetermined state.

Hereinafter, a description will be given hereinafter of a case that the matching correction amount table is configured based on the loci illustrated by FIGS. 5A to 5C since the first embodiment targets the operation to deal with the change of the coupling state between the power transmission antenna 3 and the power reception antenna 5 in the condition that the value RL of the load 6 is fixed.

As illustrated in FIGS. 5A to 5C, provided that the coupling coefficient k is changed while the value RL of the load 6 is fixed, the locus of the input impedance Zin at the edge of the power transmission antenna varies particularly around the axis corresponding to "X=0Ω" in the horizontal direction on the Smith chart. In addition, as mentioned above, the locus is likely to be positioned towards the right of the Smith chart as the value RL of the load 6 is small (e.g., RL=10Ω), positioned towards the left of the Smith chart as the value RL of the load 6 is large (e.g., RL=2005), and positioned substantially without slanting leftward or rightward if the value RL of the load 6 is a medium value (e.g., RL=50Ω).

Regarding FIGS. 6A to 6C used for the explanation of the second embodiment, the further the point on the locus of the input impedance Zin is positioned towards the right of the Smith chart, the stronger the coupling strength between the power transmission antenna 3 and the power reception antenna 5 becomes (e.g., the gap between the power transmission antenna 3 and the power reception antenna 5 becomes smaller). Namely, the further the point on the locus of the input impedance Zin is positioned towards the left of the Smith chart, the weaker the coupling becomes (e.g., the gap becomes larger).

Figure 15A:
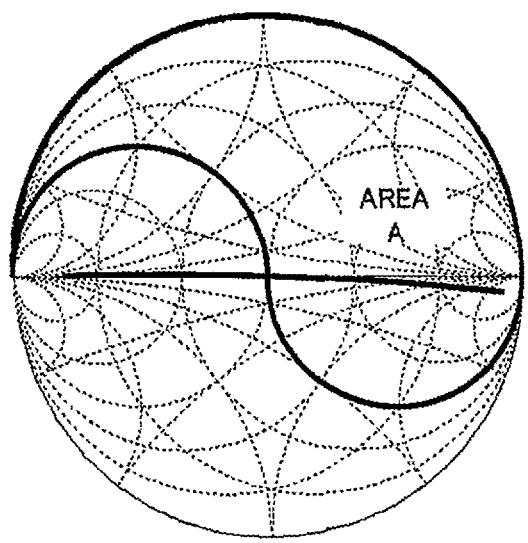
FIGS. 15A and 15B indicate Smith charts each of which is divided into two major areas, the area A and the area B.
Figure 15B:
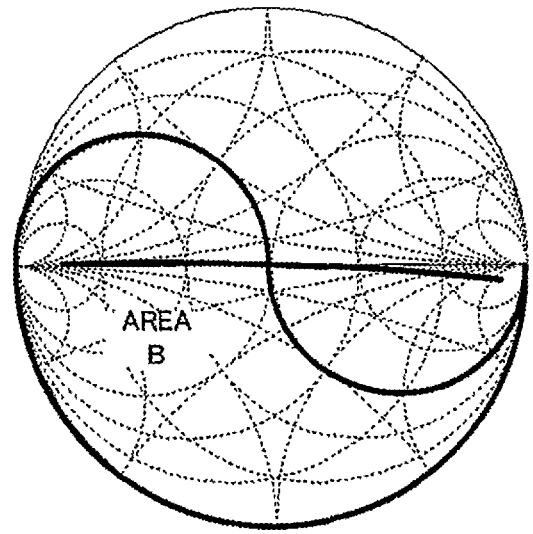

As illustrated in FIGS. 5A to 5C, the loci each indicating the variation of the input impedance Zin at the edge of the power transmission antenna in the condition that the coupling coefficient k between the power transmission antenna 3 and the power reception antenna 5 is changed has a common shape in that it varies particularly around the axis corresponding to "X=0Ω" in the horizontal direction on the Smith charts even if the target value RL of the load 6 is different. In consideration of the above fact, in order to match the impedance at any point on the locus of the impedance, it is only necessary to divide the Smith chart into two areas, "area A" and "area B", as illustrated in FIGS. 15A and 15B, and to use the matching circuit appropriate for each area.

Figure 16A:
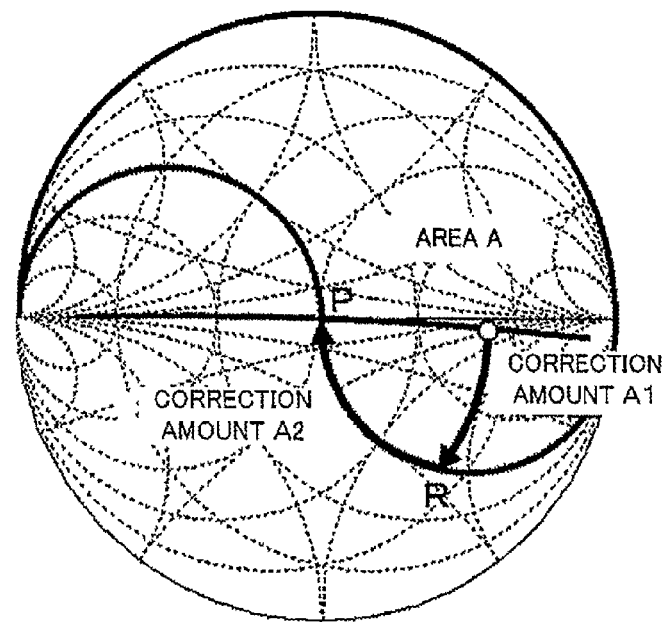
FIGS. 16A and 16B each indicates an example of moving the impedance from each point on the impedance locus existing in the area A or the area B to the matching point.
Figure 16B:
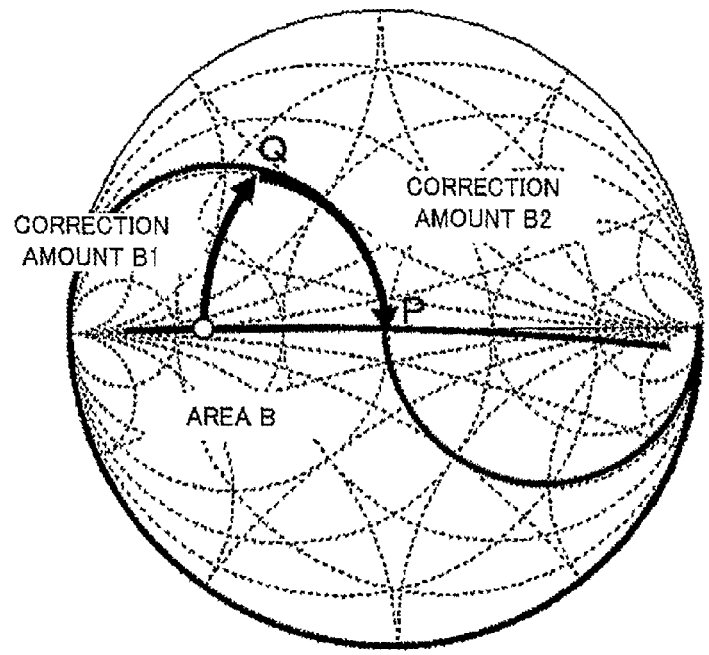

FIGS. 16A and 16B each indicates an example of moving the impedance from each point on the impedance locus existing in the area A or the area B to the matching point "P". As illustrated in FIG. 16A, in a case of a point on the impedance locus existing in the area A, it is only necessary to firstly increase the value of the variable capacitor connected in parallel to the power transmission antenna 3 by a correction amount "A1" thereby to move the target point to the point "R", and thereafter to increase the value of the variable inductor connected in series between the power transmission circuit 2 and the power transmission antenna 3 by a correction amount "A2" thereby to move the target point to the matching point P. As illustrated in FIG. 16B, in a case of a point on the impedance locus existing in the area B, it is only necessary to firstly increase the value of the variable inductor connected in series between the power transmission circuit 2 and the power transmission antenna 3 by a correction amount "B1" thereby to move the target point to the point "Q", and thereafter to increase the value of the variable capacitor connected in parallel on the side of the power transmission circuit 2 by a correction amount "B2" thereby to move the target point to the matching point P.

Figure 17A:
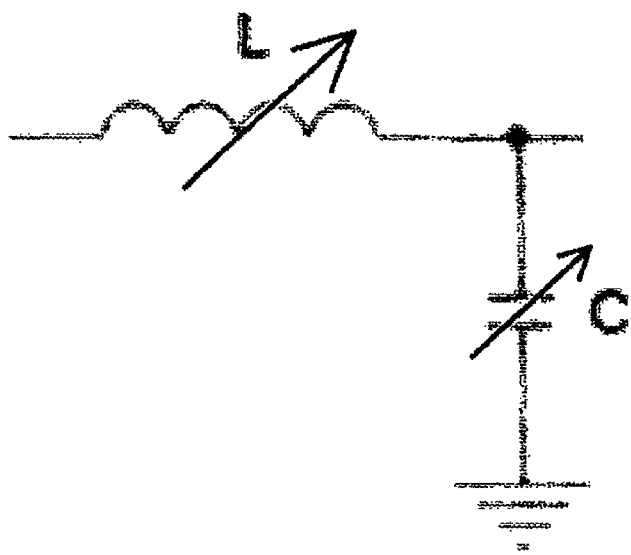
FIG. 17A is an example of the first mode matching circuit.
Figure 17B:
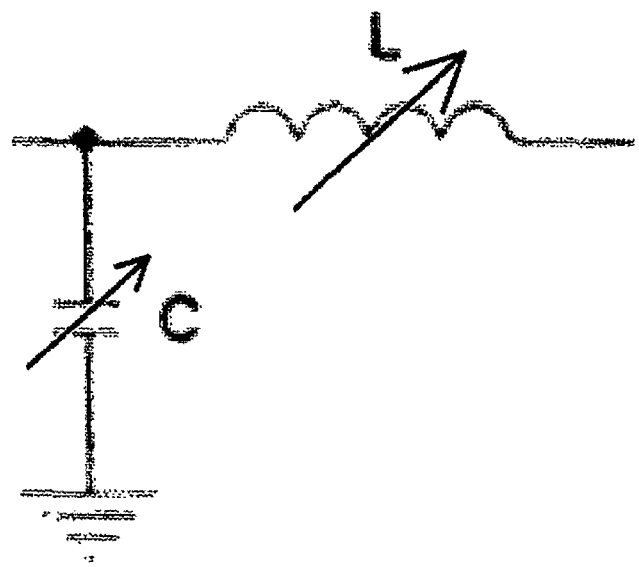
FIG. 17B is an example of the second mode matching circuit.

In consideration of the above fact, the matching circuit for matching a point on the impedance locus existing in the area A can be expressed as FIG. 17A whereas the matching circuit for matching a point on the impedance locus existing in the area B can be expressed as FIG. 17B. Regarding this embodiment, the circuit illustrated in FIG. 17A corresponds to the first mode matching circuit 11, and the circuit illustrated in FIG. 17B corresponds to the second mode matching circuit 12. It is only necessary to prepare these two types of matching circuits.

Thus, the power transmission-side device 1 determines the correction amounts A1 and A2 and the correction amounts B1 and B2 by means of theoretic calculation or some measurements, and stores a look-up table in which the correction amounts are associated with impedance values as a matching correction amount table on the storage unit 25 in advance, the correction amounts A1 and A2 being necessary for matching a point on the impedance locus existing in the area A by use of the first mode matching circuit 11 corresponding to FIG. 17A, the correction amounts B1 and B2 being necessary for matching a point on the impedance locus existing in the area B by use of the second mode matching circuit 12 corresponding to FIG. 17B. In this case, by calculating the input impedance Zin at the edge of the power transmission antenna, the power transmission-side device 1 can calculate the correction amounts necessary for matching the impedance at a time.

Figure 18A:
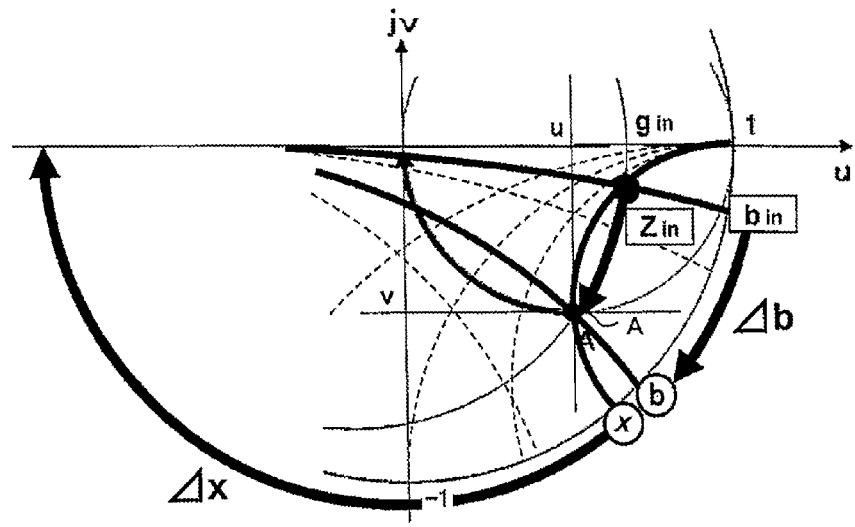
FIGS. 18A and 18B each is a diagram schematically indicating the approach for calculating the correction amounts by theoretic calculation.
Figure 18B:
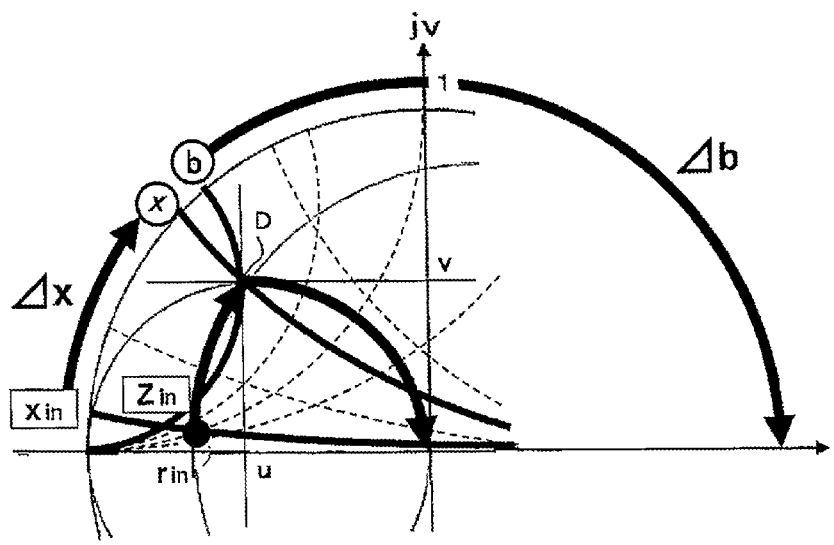

FIGS. 18A and 18B each is a diagram schematically indicating the approach for calculating the above-mentioned correction amounts by theoretic calculation. FIG. 18A corresponds to a case of a point on the impedance locus existing in the area A, and FIG. 18B corresponds to a case of a point on the impedance locus existing in the area B.

According to FIG. 18A, by rotating a target point "Zin" on the impedance locus clockwise, the intersection "A" thereof with the equivalent resistance circle expressed by "r=1" is specified and the correction amount "Δb" necessary for moving the target point to the intersection is calculated. Next, the correction amount "Δx" necessary for moving the point A to the matching point by rotating the point A along the equivalent resistance circle expressed by "r=1" is obtained. The correction amount Δb and the correction amount Δx correspond to the correction amount A1 and the correction amount A2 in FIG. 16A, respectively. On the basis of the correction amounts A1 and A2, the capacitance value C and the inductance value L used as the control value Tc can be identified.

According to FIG. 18B, by rotating a impedance point Zin clockwise and specifying the intersection "D" thereof with the equivalent conductance circle expressed by "g=1", the correction amount "Δx" necessary for moving the target point to the intersection is obtained. Next, the correction amount "Δb" necessary for moving the point D to the matching point by rotating the point D along the equivalent conductance circle expressed by "g=1" is obtained. The correction amount Δx and the correction amount Δb correspond to the correction amount B1 and the correction amount B2 in FIG. 16B, respectively. On the basis of the correction amounts B1 and B2, the capacitance value C and the inductance value L used as the control value Tc can be identified.

Provided that only the area A is considered or that only the area B is considered, any impedance point Zin on the input impedance locus corresponds to one reflection coefficient absolute value $|\Gamma|$ as the following equation (4) indicates.

$$|\Gamma| = \left| \frac{Z_{in} - Z_0}{Z_{in} + Z_0} \right| \quad (4)$$

Thus, each impedance point Zin on the input impedance locus is converted into the reflection coefficient absolute value $|\Gamma|$ according to the equation (4), and the matching correction amount table in which each converted value is associated with a pair of the capacitance value C and the inductance value L calculated by theoretic calculation is prepared in advance.

Preferably, when the matching correction amount table is prepared, quantization of the capacitance value C and the inductance value L corresponding to the reflection coefficient absolute value $|\Gamma|$ is performed by a predetermined resolution necessary for an application. The term "quantization" herein indicates dividing a certain range of the reflection coefficient absolute value $|\Gamma|$ into multiple ranges in each of which the same inductance value L and the same capacitance value C is used, and determining each representative value (referred to as "quantization representative value") of the inductance value L and the capacitance value C used in each of the divided ranges of the reflection coefficient absolute value $|\Gamma|$. Hereinafter, each boundary of the ranges of the above-mentioned reflection coefficient absolute value $|\Gamma|$ is referred to as "quantization boundary". The quantization is performed through iterative processing.

Specially, the quantization is performed by repeating the calculation of the quantization representative value and the quantization boundary one after the other so that the reflection coefficient absolute value $|\Gamma|$ near the quantization boundary is equal to or smaller than a predetermined threshold "$|\Gamma|_{thr}$". Preferably, the threshold $|\Gamma|_{thr}$ is set to 0.0707 that corresponds to a value capable of suppressing the reflection loss within 0.5%, i.e., a value capable of achieving the efficiency 99.5% if there is no other part generating the loss. When the capacitance value C and the inductance value L to be stored in the matching correction amount table are determined by such a quantization, the capacitance value C and the inductance value L are quantized so that the larger the reflection coefficient absolute value $|\Gamma|$ is, the shorter the quantizing interval becomes. In this way, by setting the matching circuit with reference to the matching correction amount table including the capacitance values C and the inductance values L after the quantization, the power transmission-side device 1 can suppress the reflection loss after the matching process continuously within a predetermined threshold regardless of the value of the input impedance Zin.

FIGS. 19A to 19C each illustrates the matching correction amount table prepared in conditions that each value RL of the load 6 is set to "10Ω", "50Ω" or "200Ω", and that the power transmission antenna 3 and the power reception antenna 5 (wherein inductance value L=8.64 µH, the capacitance value C=17.49 pF, the loss resistance R=1.0Ω, the capacitance of a capacitor connected in parallel Ct=10.08 pF.) according to the embodiment are placed to face each other, and that the coupling coefficient k is changed from "0.01" to "0.3". It is noted that these tables store the flag information If specifying the mode of the matching circuit in addition to the capacitance values C and the inductance values L for the matching circuits. The index numbers Idx are sequential serial numbers, and the larger the coupling coefficient k of a row is, the larger the index number Idx is allocated to the row. The storage unit 25 stores a plurality of the matching correction amount tables prepared in this way per value RL of the load 6.

By storing the matching correction amount tables each having such a configuration on the storage unit 25, the power transmission-side device 1 can determine which of the matching correction amount tables to use based on the estimated load value RLe. Furthermore, by referring to the selected matching correction amount table based on the input impedance Zin at the edge of the power transmission antenna, the power transmission-side device 1 can determine the matching circuit to be used and the control value Tc to be applied to the matching circuit at one-time processing.

[Effect by Automatic Matching Operation]

Hereinafter, a description will be given of the effect by the automatic matching operation by use of some examples.

Figure 20A:
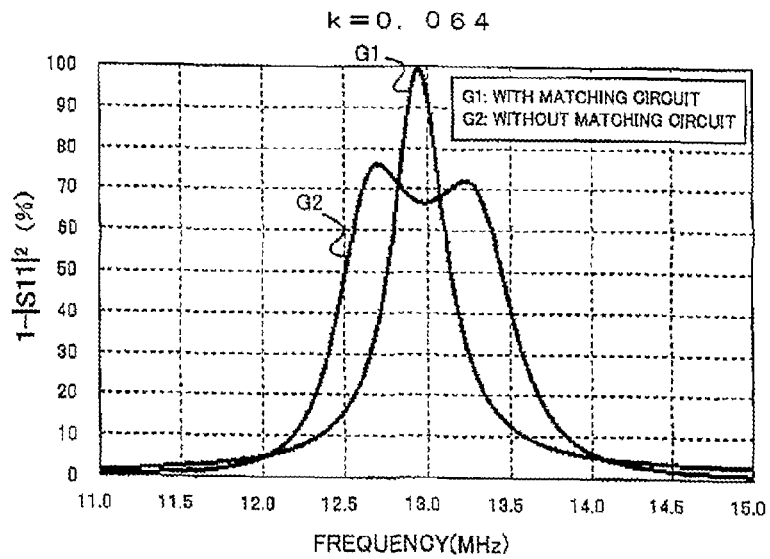
FIGS. 20A and 20B illustrate examples of the reduction of the reflection loss through the execution of the impedance matching process with reference to the matching correction amount table.
Figure 20B:
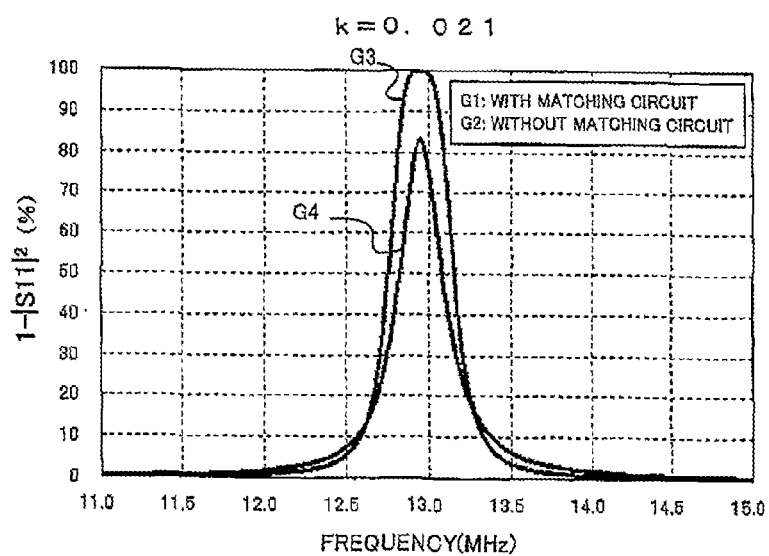

FIGS. 20A and 20B each illustrates an example of a graph indicating reduction of the reflection loss through the execution of the impedance matching process with reference to the matching correction amount table illustrated in FIG. 19A in a condition that the value RL of the load 6 is "10Ω". FIG. 20A indicates a case that the coupling coefficient k between the power transmission antenna 3 and the power reception antenna 5 is "0.064" (the width of the gap is 20 cm and the misalignment in the horizontal direction is 0 cm). FIG. 20B indicates a case that the coupling coefficient k is "0.021" (the width of the gap is 35 cm, and the misalignment is 0 cm).

In the case of FIG. 20A, the input impedance Zin at the edge of the power transmission antenna is "181.1−j26.1Ω". Accordingly, when the matching correction amount table in FIG. 19A is searched for the row having an impedance value nearest to the input impedance, the row having the index number Idx "6" is selected. In this case, the flag information If of the row indicating the mode of the matching circuit is "1", and the capacitance value C is "93.2 pF", and the inductance value L is "1136.6 nH", respectively. As illustrated in FIG. 20A, the value of "$1-|S_{11}|^2$" at the drive frequency "12.947 MHz" in a case (see graph G2) of no addition of the matching circuit is 67.0% whereas the value thereof in a case (see graph G1) that the capacitance value C and the inductance value L as mentioned above are applied to the selected first mode matching circuit 11 is 99.2%. As a result, improvement, i.e., reduction of the reflection loss, by 32.2% is achieved due to the addition of the matching circuit.

Next, in the case of FIG. 20B, the input impedance Zin at the edge of the power transmission antenna is "20.8−j0.2Ω". Accordingly, when the matching correction amount table in FIG. 19A is searched for the row having an impedance value nearest to the input impedance, the row having the index number Idx "3" is selected. In this case, the flag information If of the row indicating the mode of the matching circuit is "2", and the capacitance value C is "314.6 pF", and the inductance value L is "300.2 nH", respectively. As illustrated in FIG. 20B, the value of "$1-|S_{11}|^2$" at the drive frequency "12.947 MHz" in a case (see graph G4) of no addition of the matching circuit is 83.0% whereas the value thereof in a case (see graph G3) that the capacitance value C and the inductance value L as mentioned above are applied to the selected second mode matching circuit 12 is 99.8%. As a result, the reduction of the reflection loss by 16.8% is achieved due to the addition of the matching circuit.

In this way, the power transmission-side device 1 according to the first embodiment stores the matching correction amount tables each corresponding to a different value RL of the load 6 of the power reception-side device 4 on the storage unit 25, and calculates the estimated load value RLe to select the matching correction amount table to be used. Thereafter, the power transmission-side device 1 specifies the input impedance Zin at the edge of the power transmission antenna. Thereby, it is possible to automatically and promptly construct a proper matching circuit at one-time processing.

[Matching-State Tracking Operation]

Next, a description will be given of the matching-state tracking operation according to the first embodiment. The operation is executed for keeping the matching state after the first completion of the impedance matching process.

First, a description will be given of the necessity of the matching-state tracking operation. It is hereinafter assumed that for the purpose of the rated electric power transmission in a state that the power transmission antenna 3 and the power reception antenna 5 are placed to face each other, the matching circuit has already been configured to be most suitable for the input impedance Zin depending on the coupling state between the power transmission antenna 3 and the power reception antenna 5 and the value RL of the load 6 of the power reception-side device 4 through the execution of the automatic matching operation (this operation is generally executed in a state that the output is narrowed down). In this case, the power transmission circuit 2 proceeds with the rated electric power transmission. Here, it is supposed that the positional relationship between the power transmission-side device 1 and the power reception-side device 4 is relatively changed during the electric power transmission in the matching state. Such a situation could occur when the electric power transmission is performed for a moving object such as an electric vehicle. In this case, if the positional relationship between the power transmission-side device 1 and the power reception-side device 4 is relatively changed, the input impedance Zin at the edge of the power transmission antenna becomes different from the value set by the matching the impedance of the previous automatic matching operation. As a result, the mismatch thereof happens again. In this case, there is a necessity of prompt detection of the mismatch from the matching state and another matching process with respect to the changed input impedance Zin. In consideration of the above fact, the matching-state tracking operation according to the first embodiment tracks the variation of the coupling state between the power transmission antenna 3 and the power reception antenna 5, and properly determines the mode of the matching circuit and the control value Tc to be applied to the matching circuit thereby to keep the matching state.

Next, a description will be given of the process of the matching-state tracking operation. In the matching-state tracking operation, as with the automatic matching operation, the locus (see FIGS. 5A to 5C) of the input impedance Zin at the edge of the power transmission antenna at the time of changing the coupling state (e.g., gap) between the power transmission antenna 3 and the power reception antenna 5 is also used. Each of the loci of the impedance indicated by FIGS. 5A and 5C is determined in a state that the coupling state is changed while the value RL of the load 6 of the power reception-side device 4 is fixed, and these loci of the impedance are used in the first embodiment.

If the value RL of the load 6 of the power reception-side device 4 is not changed, the input impedance Zin at the edge of the power transmission antenna exists on the locus of the impedance indicated by FIGS. 5A to 5C. The mode of the matching circuit and the control value Tc to be applied to the matching circuit which are necessary in order to match an impedance point existing on the locus of the impedance are included in the matching correction amount table prepared per load value as illustrated in FIGS. 19A to 19C. Thus, in the matching-state tracking operation executed after the first-time matching state, the power transmission-side device 1 only has to change the row (i.e., index number Idx) to be used in the matching correction amount table by continuously referring to the matching correction amount table also used in the automatic matching operation.

In consideration of the above fact, regarding the matching-state tracking operation, the power transmission-side device 1 detects in which direction, either the left or the right (the coupling state is weakened as the position shifts to the left and strengthened as the position shifts to the right), the matching state corresponding to a particular impedance value shifts on the locus of the impedance indicated by FIGS. 5A to 5C. Namely, the power transmission-side device 1 detects whether the matching state shifts on either the upper side or the downside (the coupling state is weakened as the position shifts toward the upper side and strengthened as the position shifts toward the downside) from the presently-used row of the matching correction amount table. Then, the power transmission-side device 1 changes the configuration of the matching circuit toward the proper direction. As indicated above, in the matching correction amount table stored on the storage unit 25, the index numbers Idx are sequential serial numbers, and the larger the coupling coefficient k of a row is, the larger index number Idx is allocated to the row as illustrated in FIGS. 19A to 19C.

(Readout Direction Determination Method)

Hereinafter, a description will be given of the method of determining in which direction the matching state shifts, the direction where the coupling is strengthened or the direction where the coupling is weakened. The process is executed by the phase difference calculation/determination unit 16 and the adjustment direction determination unit 18.

First, with reference to FIGS. 21A to 21C, a description will be given of the relationship between the waveform of the incident wave voltage and the waveform of the reflective wave voltage in the case that the coupling strength shifts toward the direction where the coupling is strengthened.

Concretely, FIG. 21A illustrates the waveform of the incident wave voltage and the waveform of the reflective wave voltage in conditions that the value RL of the load 6 is "10Ω" and that the coupling coefficient k is strengthened in steps as "0.08", "0.12" and "0.2" after the first matching process in a condition that the coupling coefficient k between the power transmission antenna 3 and the power reception antenna 5 is "0.064".

FIG. 21B illustrates the waveform of the incident wave voltage and the waveform of the reflective wave voltage in conditions that the value RL of the load 6 is "50Ω" and that the coupling coefficient k is strengthened in steps as "0.08", "0.12" and "0.2" after the first matching process in a condition that the coupling coefficient k between the power transmission antenna 3 and the power reception antenna 5 is "0.064".

FIG. 21C illustrates the waveform of the incident wave voltage and the waveform of the reflective wave voltage in conditions that the value RL of the load 6 is "200Ω" and that the coupling coefficient k is strengthened in steps as "0.08", "0.12" and "0.2" after the first matching process in a condition that the coupling coefficient k between the power transmission antenna 3 and the power reception antenna 5 is "0.064".

Next, FIGS. 22A to 22C each illustrates the relationship between the waveform of the incident wave voltage and the waveform of the reflective wave voltage in a condition that the coupling strength shifts toward the direction where the coupling is weakened.

Concretely, FIG. 22A illustrates the waveform of the incident wave voltage and the waveform of the reflective wave voltage in conditions that the value RL of the load 6 is "10Ω" and that the coupling coefficient k is weakened in steps as "0.055", "0.04" and "0.02" after the first matching process in a condition that the coupling coefficient k between the power transmission antenna 3 and the power reception antenna 5 is "0.064".

FIG. 22B illustrates the waveform of the incident wave voltage and the waveform of the reflective wave voltage in conditions that the value RL of the load 6 is "50Ω" and that the coupling coefficient k is weakened in steps as "0.055", "0.04" and "0.02" after the first matching process in a condition that the coupling coefficient k between the power transmission antenna 3 and the power reception antenna 5 is "0.064".

FIG. 22C illustrates the waveform of the incident wave voltage and the waveform of the reflective wave voltage in conditions that the value RL of the load 6 is "200Ω" and that the coupling coefficient k is weakened in series as "0.055", "0.04" and "0.02" after the first matching process in a condition that the coupling coefficient k between the power transmission antenna 3 and the power reception antenna 5 is "0.064".

As illustrated in FIGS. 21A to 21C, when the positional relationship between the power transmission antenna 3 and the power reception antenna 5 is relatively changed in the direction of the strong coupling after the first matching process, the phase of the reflective wave voltage Vr lags behind the phase of the incident wave voltage Vf. In contrast, as illustrated in FIGS. 22A to 22C, when the coupling strength shifts in the direction of the weak coupling after the first matching process, the phase of the incident wave voltage Vf lags behind the phase of the reflective wave voltage Vr. These relationships concerning the phase can be applied to any value RL of the load 6.

In consideration of the above fact, the power transmission-side device 1 continues to monitor the phase relationship between the incident wave voltage Vf and the reflective wave voltage Vr after the first matching process, and it determines that the coupling strength between the power transmission antenna 3 and the power reception antenna 5 becomes stronger if the phase of the reflective wave voltage Vr lags against the phase of the incident wave voltage Vf. In this case, with reference to the row existing in such a direction that the coupling coefficient k (the index Idx) becomes larger in the matching correction amount table, i.e., the row existing in the downward direction with respect to the present row in the matching correction amount table, the power transmission-side device 1 applies the control value Tc in the reference row to the matching circuit indicated by the flag information If in the reference row.

In contrast, the power transmission-side device 1 determines that the coupling strength between the power transmission antenna 3 and the power reception antenna 5 becomes weaker if the phase of the reflective wave voltage Vr is ahead of the phase of the incident wave voltage Vf. In this case, with reference to the row existing in such a direction that the coupling coefficient k (the index Idx) becomes smaller in the matching correction amount table, i.e., the row existing in the upward direction with respect to the present row in the matching correction amount table, the power transmission-side device 1 applies the control value Tc in the reference row to the matching circuit indicated by the flag information If in the reference row.

By executing such a process, the power transmission-side device 1 can keep the matching state even if the input impedance Zin at the edge of the power transmission antenna varies due to the change of the coupling state between the power transmission antenna 3 and the power reception antenna 5. Preferably, the power transmission-side device 1 continues to monitor the reflection coefficient absolute value $|\Gamma|$ at all times after the first matching process. Then, if the reflection coefficient absolute value $|\Gamma|$ is equal to or smaller than a threshold $|\Gamma|_{thr}$ set as a specification of the system, the power transmission-side device 1 does not perform the above-mentioned matching-state tracking operation. In contrast, if the reflection coefficient absolute value $|\Gamma|$ is larger than the threshold $|\Gamma|_{thr}$, the power transmission-side device 1 identifies the phase relationship between the incident wave voltage Vf and the reflective wave voltage Vr, and changes the configuration of the matching circuit by changing the row to be used in the matching correction amount table. Thereby, the power transmission-side device 1 can keep the reflection coefficient absolute value $|\Gamma|$ equal to or smaller than the threshold $|\Gamma|_{thr}$ at all times, and suppress the reflection loss. The concrete procedure of the process will be described in the section [Process Flow] to be mentioned later.

Figure 24A:
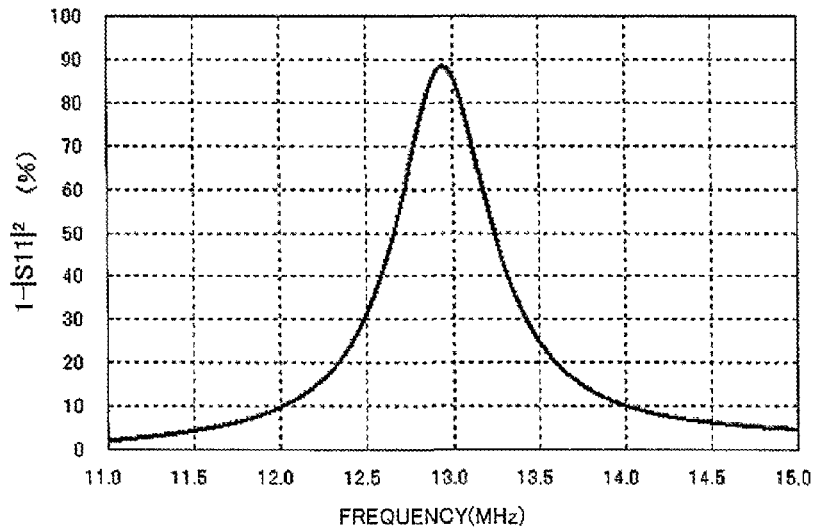
FIG. 24A indicates a graph of "$1-|S_{11}|^2$" in a state that the coupling coefficient varies from "0.064" to "0.1" after the matching process.
Figure 24B:
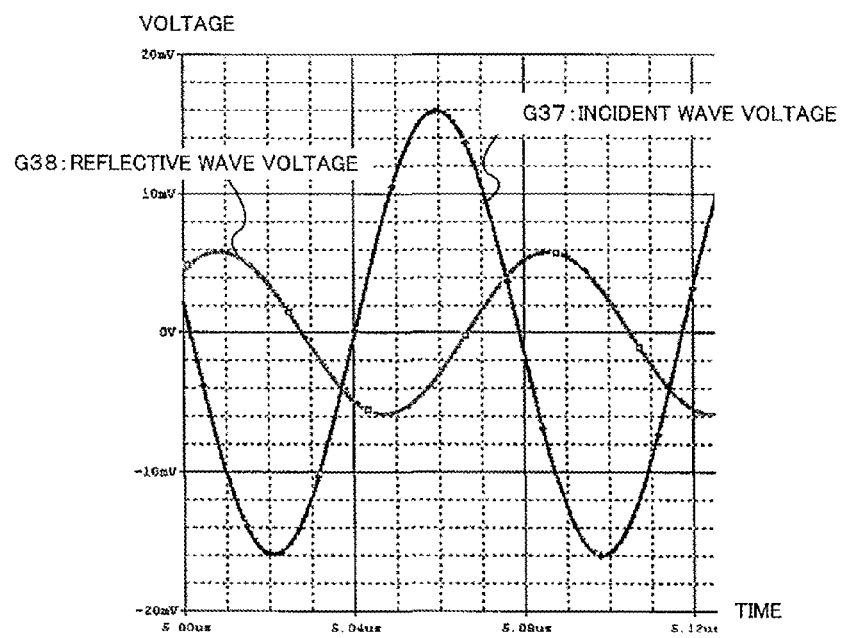
FIG. 24B indicates graphs of the waveform of the incident wave voltage and the waveform of the reflective wave voltage at the drive frequency in the case of FIG. 24A.
Figure 25A:
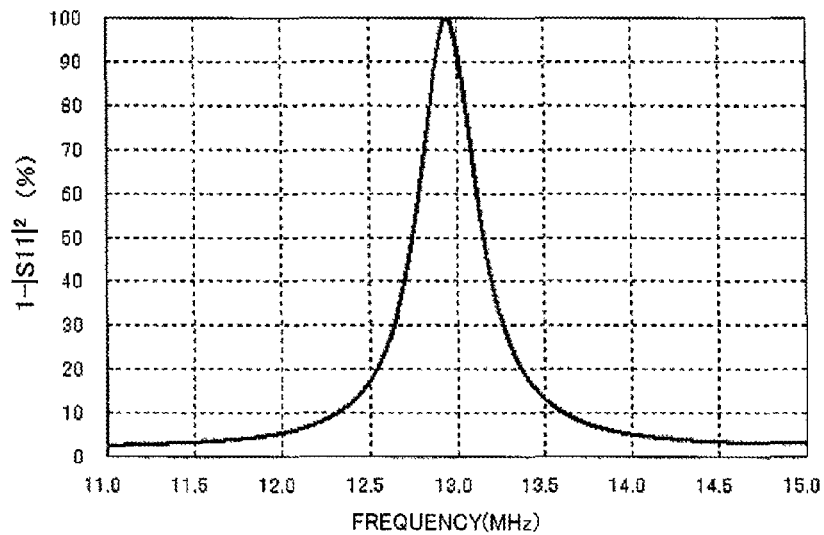
FIG. 25A indicates a graph of the value "$1-|S_{11}|^2$" after execution of the matching-state tracking operation.
Figure 25B:
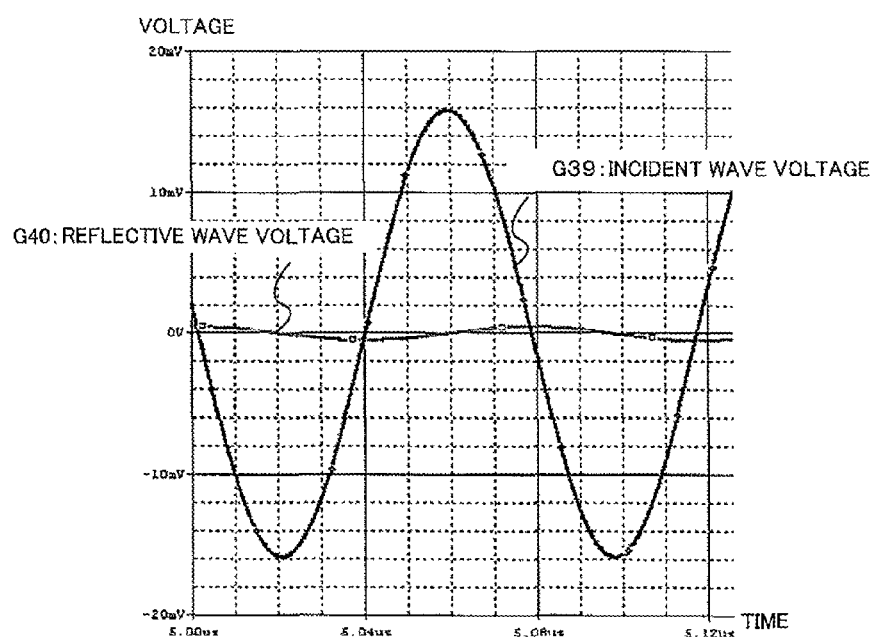
FIG. 25B indicates graphs of the waveform of the incident wave voltage and the waveform of the reflective wave voltage at the drive frequency in the case of FIG. 25A.

Next, with reference to FIGS. 23A to 25B, a description will be given of an example of the matching-state tracking operation in a condition that the value RL of the load 6 is "10Ω". Each example indicated by FIGS. 23A to 25B illustrates a case of the mismatch caused by the transition of the coupling coefficient k from "0.064" to "0.1" after the first matching process with reference to the row corresponding to the index Idx "6" illustrated in FIG. 19A. Concretely, FIG. 23A indicates a graph of $1-|S_{11}|^2$ just after the first matching process in a state that the coupling coefficient k is "0.064". FIG. 23B indicates graphs of the waveform of the incident wave voltage and the waveform of the reflective wave voltage at the drive frequency in the case of FIG. 23A. FIG. 24A indicates a graph of $1-|S_{11}|^2$ in a state that the coupling coefficient k varies from "0.064" to "0.1" after the first matching process. FIG. 24B indicates graphs of the waveform of the incident wave voltage and the waveform of the reflective wave voltage at the drive frequency in the case of FIG. 24A. FIG. 25A indicates a graph of the value "$1-|S_{11}|^2$" after execution of the matching-state tracking operation. FIG. 25B indicates graphs of the waveform of the incident wave voltage and the waveform of the reflective wave voltage at the drive frequency in the case of FIG. 25A.

Figure 23A:
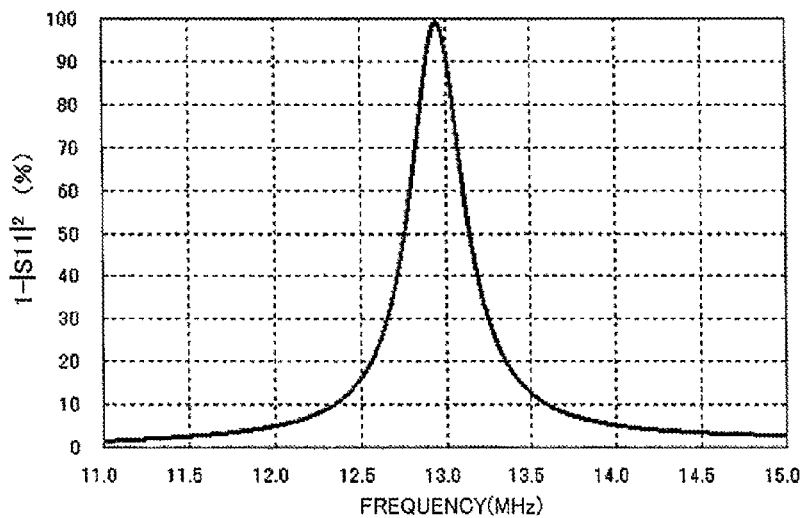
FIG. 23A indicates a graph of "$1-|S_{11}|^2$" just after the matching process in a state that the coupling coefficient is "0.064".
Figure 23B:
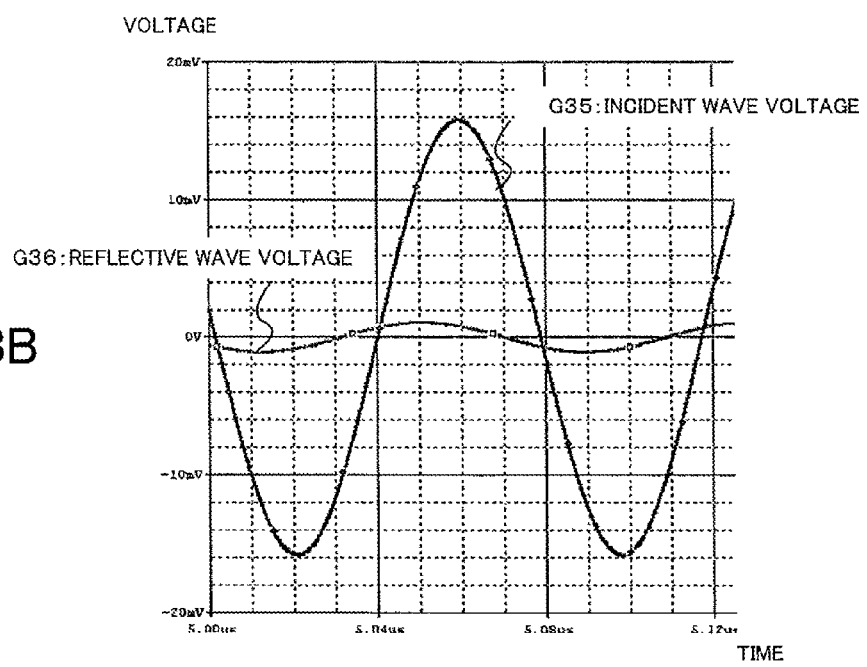
FIG. 23B indicates graphs of the waveform of the incident wave voltage and the waveform of the reflective wave voltage at the drive frequency in the case of FIG. 23A.

As illustrated in FIGS. 23A and 23B, just after the automatic matching operation is performed in the initial state at the drive frequency "12.947 MHz", almost 100% of the electric power is inputted to the power transmission antenna 3 and the level of the reflective wave is also low. At that time, the selected index number Idx in the matching correction amount table is "6". When the configuration of the matching circuit is unchanged and the coupling coefficient k is changed to "0.1", the level of the reflective wave has increased due to further mismatch, and the value "$1-|S_{11}|^2$" has decreased (to 88%) as indicated by FIGS. 24A and 24B.

In this case, on the basis of the phase relationship between the incident wave voltage Vf and the reflective wave voltage Vr, the power transmission-side device 1 detects the change of the coupling state. Concretely, the power transmission-side device 1 determines that the coupling strength becomes stronger due to the phase delay of the reflective wave voltage Vr with respect to the incident wave voltage Vf. Thus, in this case, on the basis of the row existing in such a direction that the coupling strength becomes stronger in the matching correction amount table, i.e., the row of the index number Idx "7" larger than the presently-used index number Idx "6", the power transmission-side device 1 updates the configuration of the matching circuit. Accordingly, as illustrated in FIGS. 25A and 25B, the power transmission-side device 1 becomes the matching state again.

[Determination Method of Step Width]

Next, a description will be given of the determination method of the step width Widx based on the reflection coefficient absolute value $|\Gamma|$.

In the examples illustrated in FIGS. 23A to 25B mentioned above, the step width Widx is fixed at "1". However, with the rapid change of the reflection coefficient, a large amount of time is possibly taken to search for the index number Idx corresponding to the desired control value Tc if the control value Tc is updated through shifts of the index number Idx one by one. Namely, when electric power is supplied to a moving body by use of electromagnetic-field resonance coupling, the rapid changes of the gap between the power transmission antenna 3 and the power reception antenna 5 and the misalignment thereof possibly happen with large variation widths. In such a case, it is anticipated that the above-mentioned variation widths in the period when the reflection coefficient absolute value $|\Gamma|$ is monitored become fairly large. In preparation for such a case, preferably, the power transmission-side device 1 flexibly determines the step width Widx in accordance with the variation width of the reflection coefficient absolute value $|\Gamma|$ from the matching state. Thereby, the power transmission-side device 1 can promptly match the impedance even when the coupling state between the power transmission antenna 3 and the power reception antenna 5 rapidly varies.

Concretely, a method of changing the step width Widx by use of the following criteria can be considered, "Widx=1" if "the variation width of $|\Gamma|$<0.15",
"Widx=2" if "the variation width of $|\Gamma|$<0.30",
"Widx=3" if "the variation width of $|\Gamma|$<0.45", and
"Widx=4" if "the variation width of $|\Gamma|$≥0.45".

For example, the power transmission-side device 1 stores a table of proper step widths Widx each corresponding to a different variation width of the reflection coefficient absolute value $|\Gamma|$ on the storage unit 25 in advance. The above-mentioned table is prepared based on experimental trials, for example. By determining the step width Widx with reference to the table based on the variation width of the reflection coefficient absolute value $|\Gamma|$, the power transmission-side device 1 can promptly recover the matching state even when the coupling state between the power transmission antenna 3 and the power reception antenna 5 rapidly varies.

[Process Flow]

Next, a description will be given of a procedure of the process according to the first embodiment. Hereinafter, after the explanation of the procedure of the process of the automatic matching operation with reference to first flow to third flow each illustrated in FIGS. 26 to 28, a description will be given of the procedure of the process of the matching-state tracking operation with reference to fourth flow illustrated in FIG. 29.

(First Flow)

Figure 26:
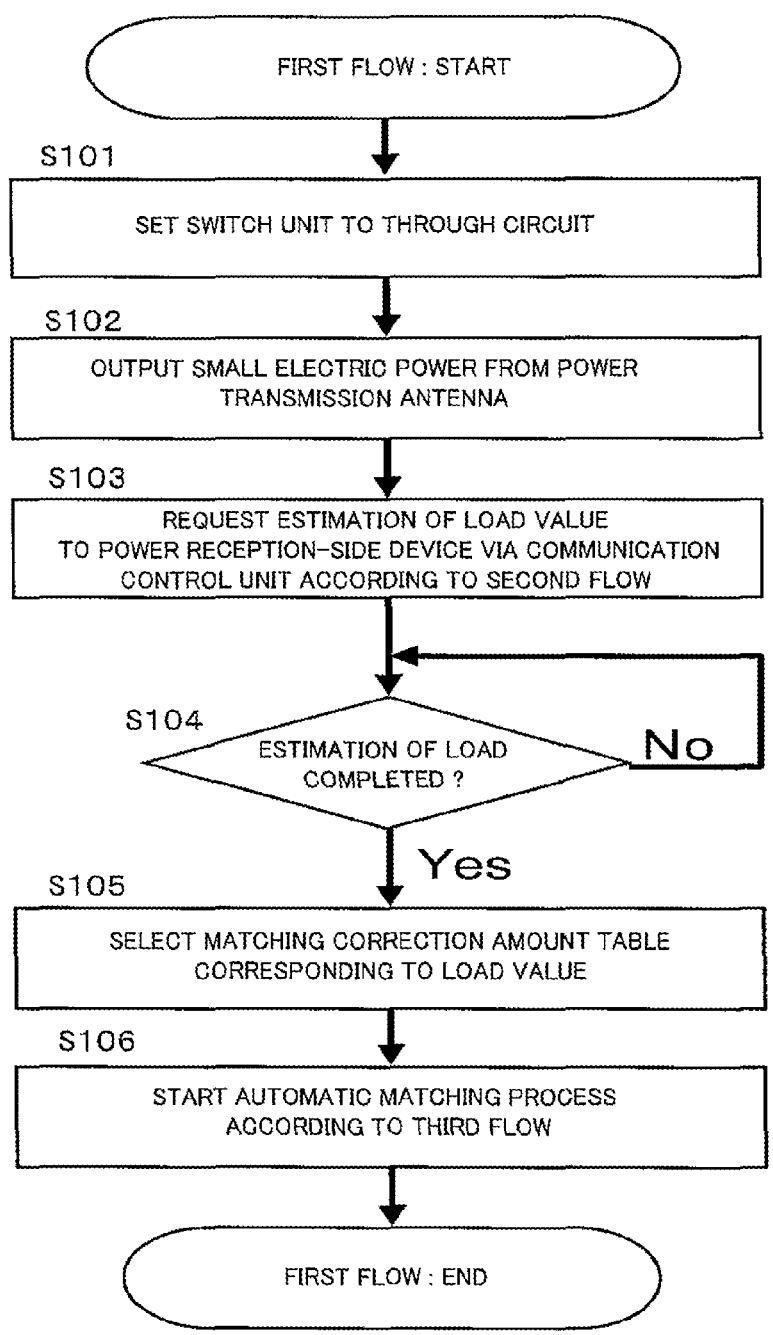
FIG. 26 is a flowchart indicating a procedure of the process of the first flow according to the first embodiment.

FIG. 26 is a flowchart indicating a procedure of the process executed by the power transmission-side device 1 in the first embodiment. The power transmission-side device 1 executes the process of the first flow indicated by FIG. 26 at a predetermined timing.

First, the matching circuit selection unit 23 of the power transmission-side device 1 sets the switch units 13 and 14 to the through circuit 30 (step S101). Then, the power transmission circuit 2 of the power transmission-side device 1 outputs small electric power from the power transmission antenna 3 prior to the transmission of the rated electric power (step S102).

Next, the power transmission-side device 1 sends the power reception-side device 4 a signal for requesting the estimation of the value RL of the load 6 via the communication control unit 75 (step S103). Thereafter, the power reception-side device 4 which has received the signal executes the process of the second flow to be described later. Then, the power transmission-side device 1 determines whether or not the load estimation has been completed (step S104). Particularly, the power transmission-side device 1 determines whether or not it has received the estimated load value RLe from the power reception-side device 4 via the communication control 75. If the load estimation has not been completed yet (step S104; No), the power transmission-side device 1 continues to monitor whether or not the load estimation has been completed. In contrast, if the load estimation has been completed (step S104; Yes), the table selection unit 27 of the power transmission-side device 1 selects the matching correction amount table corresponding to the load value nearest to the estimated load value RLe (step S105). Then, the power transmission-side device 1 starts the process (i.e., automatic matching process) indicated by the third flow to be described later (step S106).

(Second Flow)

Figure 27:
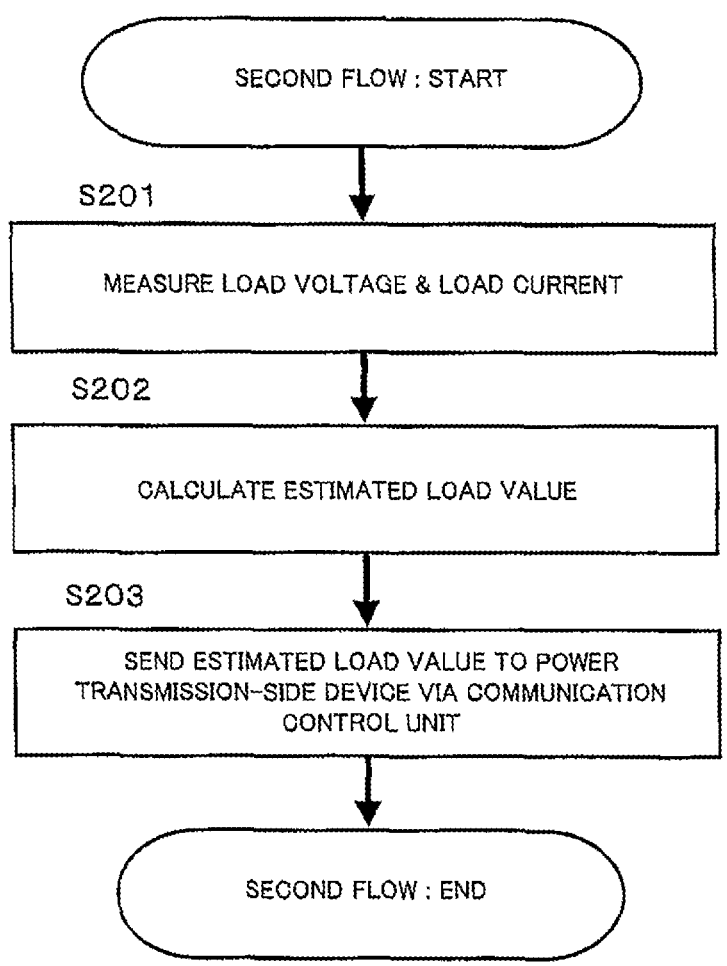
FIG. 27 is a flowchart indicating a procedure of the process of the second flow according to the first embodiment.

FIG. 27 is a flowchart indicating a procedure of the process executed by the load estimation unit 7 of the power reception-side device 4 in the first embodiment. The load estimation unit 7 executes the process of the second flow indicated by FIG. 27 when the load estimation unit 7 receives the signal for requesting the estimation of the load value from the communication control unit 75 at step S103 in FIG. 26.

First, the load estimation unit 7 measures the voltage of the load 6 and the current flowing in the load 6 (step S201). Concretely, the current value determination unit 71 detects the detected current value Ie while the voltage value detection unit 72 detects the detected voltage value Ve. Then, the load estimation unit 7 estimates the value RL of the load 6 (step S202). Concretely, the load value calculation unit 73 of the load estimation unit 7 calculates the estimated load value RLe by dividing the detected voltage value Ve by the detected current value Ie. The load estimation unit 7 sends the estimated load value RLe to the power transmission-side device 1 via the communication control unit 74 (step S203).

(Third Flow)

Figure 28:
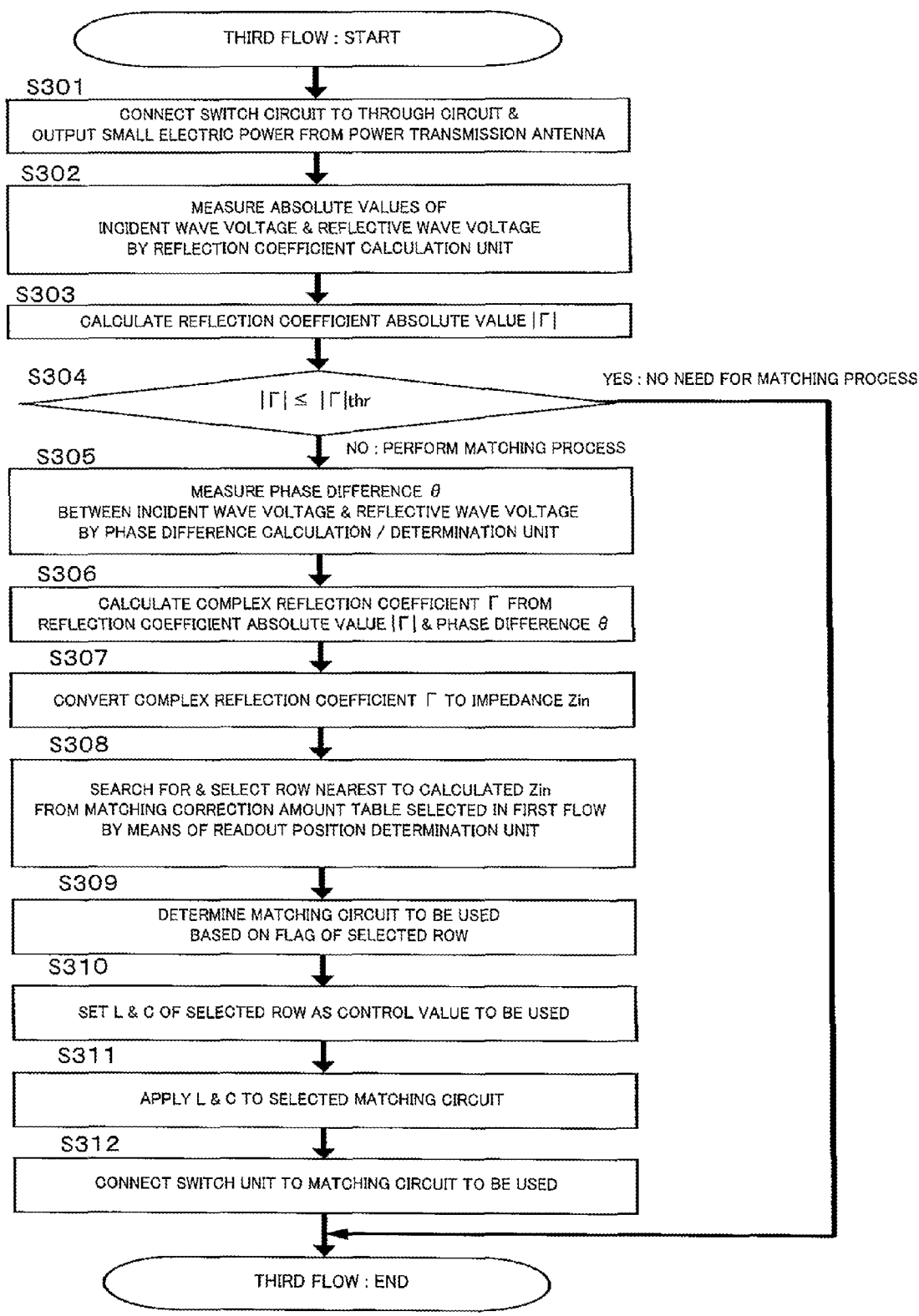
FIG. 28 is a flowchart indicating a procedure of the process of the third flow according to the first embodiment.

FIG. 28 is a flowchart indicating a procedure of the process of the third flow executed by the power transmission-side device 1. The power transmission-side device 1 executes the process of the third flow in FIG. 28 when proceeding with the process at step 106 of the first flow in FIG. 26.

First, the matching circuit selection unit 23 of the power transmission-side device 1 connects the switch units 13 and 14 to the through circuit 30 and outputs small electric power from the power transmission antenna 3 (step S301). Next, the reflection coefficient calculation unit 17 of the power transmission-side device 1 measures each absolute value of the incident wave voltage Vf and the reflective wave voltage Vr extracted by the incident-wave/reflective-wave extraction unit 15 (step S302). The reflection coefficient calculation unit 17 calculates the reflection coefficient absolute value $|\Gamma|$ by referring to the equation (1) (step S303).

Next, the power transmission-side device 1 determines whether or not the reflection coefficient absolute value $|\Gamma|$ is equal to or smaller than the threshold $|\Gamma|_{thr}$ (step S304). If the power transmission-side device 1 determines that the reflection coefficient absolute value $|\Gamma|$ is equal to or smaller than the threshold $|\Gamma|_{thr}$ (step S304; Yes), the power transmission-side device 1 determines that it has already been in the matching state and that it does not need any more matching process. Accordingly, the power transmission-side device 1 ends the process of the flowchart.

In contrast, if the reflection coefficient absolute value $|\Gamma|$ is larger than the threshold $|\Gamma|_{thr}$ (step S304; No), the matching process from step S305 to step S312 is performed. Concretely, the phase difference calculation/determination unit 16 firstly measures the phase difference θ between the incident wave voltage Vf and the reflective wave voltage Vr according to the equation (2) (step S305). Then, the phase difference calculation/determination unit 16 or the reflection coefficient calculation unit 17 calculates the complex reflection coefficient Γ from the reflection coefficient absolute value $|\Gamma|$ and the phase difference θ (step S306), and converts the complex reflection coefficient Γ to the input impedance Zin based on the equation (3) (step S307).

Next, the readout position determination unit 24 searches the matching correction amount table selected according to the first flow for the row having the impedance value nearest to the calculated input impedance Zin and selects it (step S308). Then, the readout position determination unit 24 supplies the matching circuit selection unit 23 with the flag information If of the selected row to let the matching circuit selection unit 23 determine the matching circuit to be used (step S309). Furthermore, the control value output unit 26 sets the capacitance value C and the inductance value L of the selected row as the control value Tc to be used (step S310). Then, the control value output unit 26 applies the capacitance value C and the inductance value L to the selected matching circuit (step S311). Thereafter, on the basis of the flag information If, the matching circuit selection unit 23 connects the switch units 13 and 14 to the matching circuit to be used (step S312).

(Fourth Flow)

Figure 29:
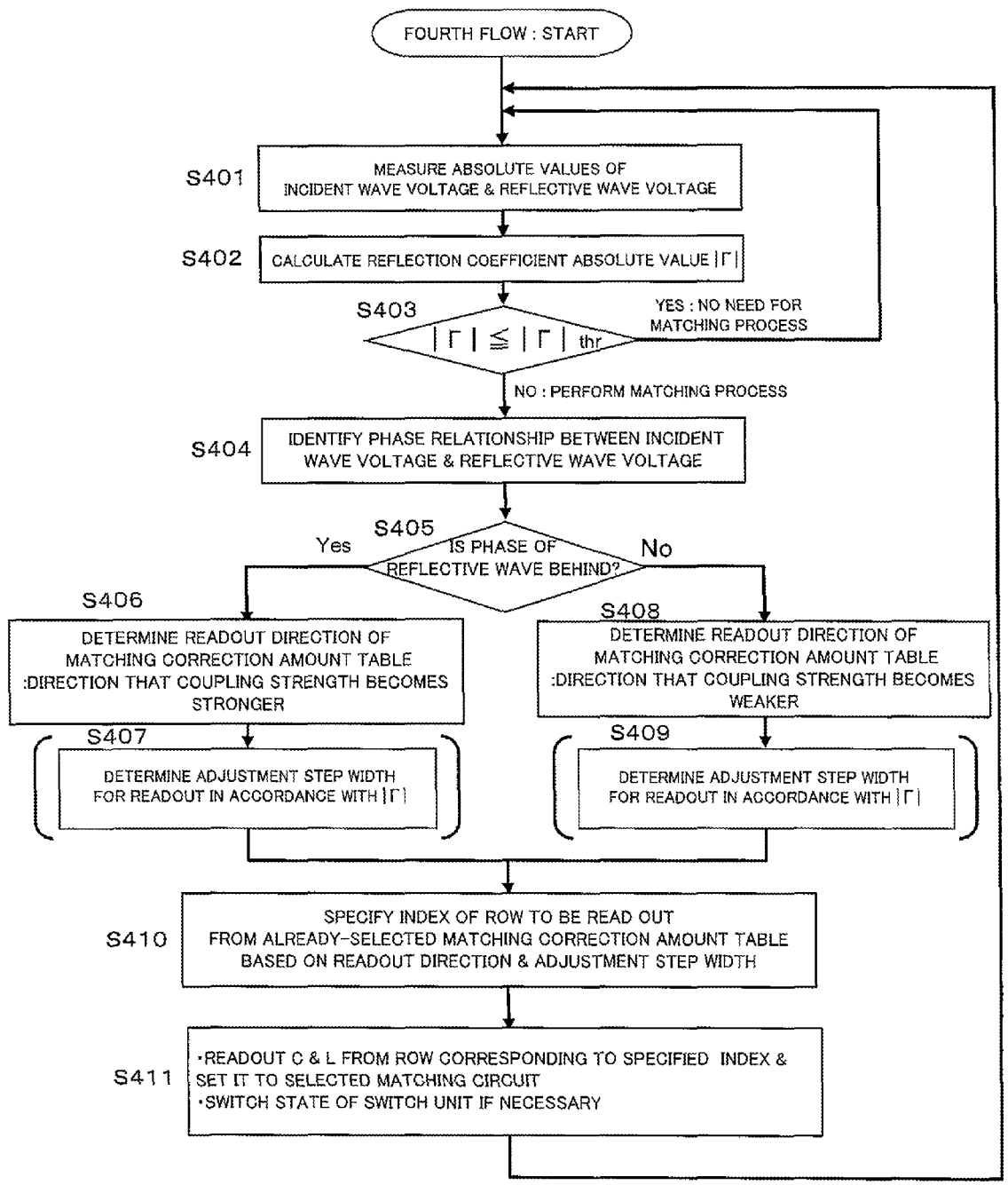
FIG. 29 is a flowchart indicating a procedure of the process of the fourth flow according to the first embodiment.

FIG. 29 is a flowchart indicating a procedure of the process executed by the power transmission-side device 1 according to the first embodiment. The power transmission-side device 1 executes the process of the fourth flow illustrated in FIG. 29 after executing the process of the third flow.

First, the reflection coefficient calculation unit 17 of the power transmission-side device 1 measures each absolute value of the incident wave voltage Vf and the reflective wave voltage Vr extracted by the incident-wave/reflective-wave extraction unit 15 (step S401). Then, the reflection coefficient calculation unit 17 calculates the reflection coefficient absolute value $|\Gamma|$ by referring to the equation (1) (step S402).

Next, the power transmission-side device 1 determines whether or not the reflection coefficient absolute value $|\Gamma|$ is equal to or smaller than the threshold $|\Gamma|_{thr}$ (step S403). If the power transmission-side device 1 determines that the reflection coefficient absolute value $|\Gamma|$ is equal to or smaller than the threshold $|\Gamma|_{thr}$ (step S403; Yes), the power transmission-side device 1 determines that it has already been in the matching state and that it does not need any more matching process. Accordingly, the power transmission-side device 1 returns the process to step S401, and continues to monitor whether or not the reflection coefficient absolute value |Γ| is equal to or smaller than the threshold |Γ|$_{thr}$.

In contrast, if the reflection coefficient absolute value |Γ| is larger than the threshold |Γ|$_{thr}$ (step S403; No), the phase difference calculation/determination unit 16 identifies the phase relationship between the incident wave voltage Vf and the reflective wave voltage Vr (step S404). Concretely, the phase difference calculation/determination unit 16 determines whether or not the phase of the reflective wave voltage Vr is behind the phase of the incident wave voltage Vf (step S405).

Then, if the phase difference calculation/determination unit 16 determines that the phase of the reflective wave voltage Vr is behind the phase of the incident wave voltage Vf (step S405; Yes), it determines that the state varies in such a direction that the coupling strength between the power transmission antenna 3 and the power reception antenna 5 becomes stronger. Then, in this case, the adjustment direction determination unit 18 sets the readout direction of the matching correction amount table to the direction where the coupling strength becomes stronger (step S406). Namely, in the case of the matching correction amount table illustrated in FIGS. 19A to 19C, the adjustment direction determination unit 18 sets the readout direction to the direction where the index number Idx becomes larger. Then, the adjustment step width determination unit 19 determines the step width Widx in accordance with the reflection coefficient absolute value |Γ| (step S407). For example, on the basis of a predetermined ratio (proportional constant) to be used in the case that the coupling strength becomes stronger, the adjustment step width determination unit 19 determines the step width Widx from the reflection coefficient absolute value |Γ|.

In contrast, when the phase difference calculation/determination unit 16 determines that the phase of the reflective wave voltage Vr is preceding the phase of the incident wave voltage Vf (step S405; No), it recognizes that the state is changed so that the coupling strength between the power transmission antenna 3 and the power reception antenna 5 becomes weaker. In this case, the adjustment direction determination unit 18 sets the readout direction of the matching correction amount table to the direction where the coupling strength becomes weaker (step S408). Namely, in the case of the matching correction amount tables illustrated in FIGS. 19A to 19C, the adjustment direction determination unit 18 sets the readout direction to the direction where the index number Idx becomes smaller. Then, the adjustment step width determination unit 19 determines the step width Widx in accordance with the reflection coefficient absolute value |Γ| (step S409). For example, on the basis of a predetermined ratio (proportional constant) to be used in the case that the coupling strength becomes weaker, the adjustment step width determination unit 19 determines the step width Widx from the reflection coefficient absolute value |Γ|.

After the execution of step S407 or step S409, on the basis of the determined readout direction and the step width Widx, the readout position determination unit 24 specifies the index number Idx of the row to be read out from the already-selected matching correction amount table (step S410). Then, the control value output unit 26 reads out the capacitance value C and the inductance value L of the row having the specified index number Idx, and applies these values to the matching circuit identified by the flag information If of the row having the specified index number Idx. The matching circuit selection unit 23 switches the switch units 13 and/or 14 based on the above-mentioned flag information If if necessary (step S411). Then, the power transmission-side device 1 returns the process back to step S401.

It is noted that each process at step S407 and step S409 is not an essential process, and that the power transmission-side device 1 may omit the process at step S407 and step S409 if a predetermined value is used as the step width Widx.

Second Embodiment

Next, a description will be given of the second embodiment. Regarding the second embodiment, a description will be given of a case that the value RL of the load 6 varies while the coupling coefficient k does not vary. In summary, the electric power transmission system estimates the coupling coefficient k and the input impedance Zin at the edge of the power transmission antenna, and on the basis of these estimate values, determines the matching circuit to be used and the control value Tc to be applied to the matching circuit with reference to the matching correction amount table. Thereby, the electric power transmission system matches the input impedance Zin at the edge of the power transmission antenna to the output impedance of the power transmission circuit. In addition, after once becoming the matching state, the electric power transmission system keeps the matching state through the matching-state tracking operation for keeping the matching state.

[Schematic Configuration]

Figure 30:
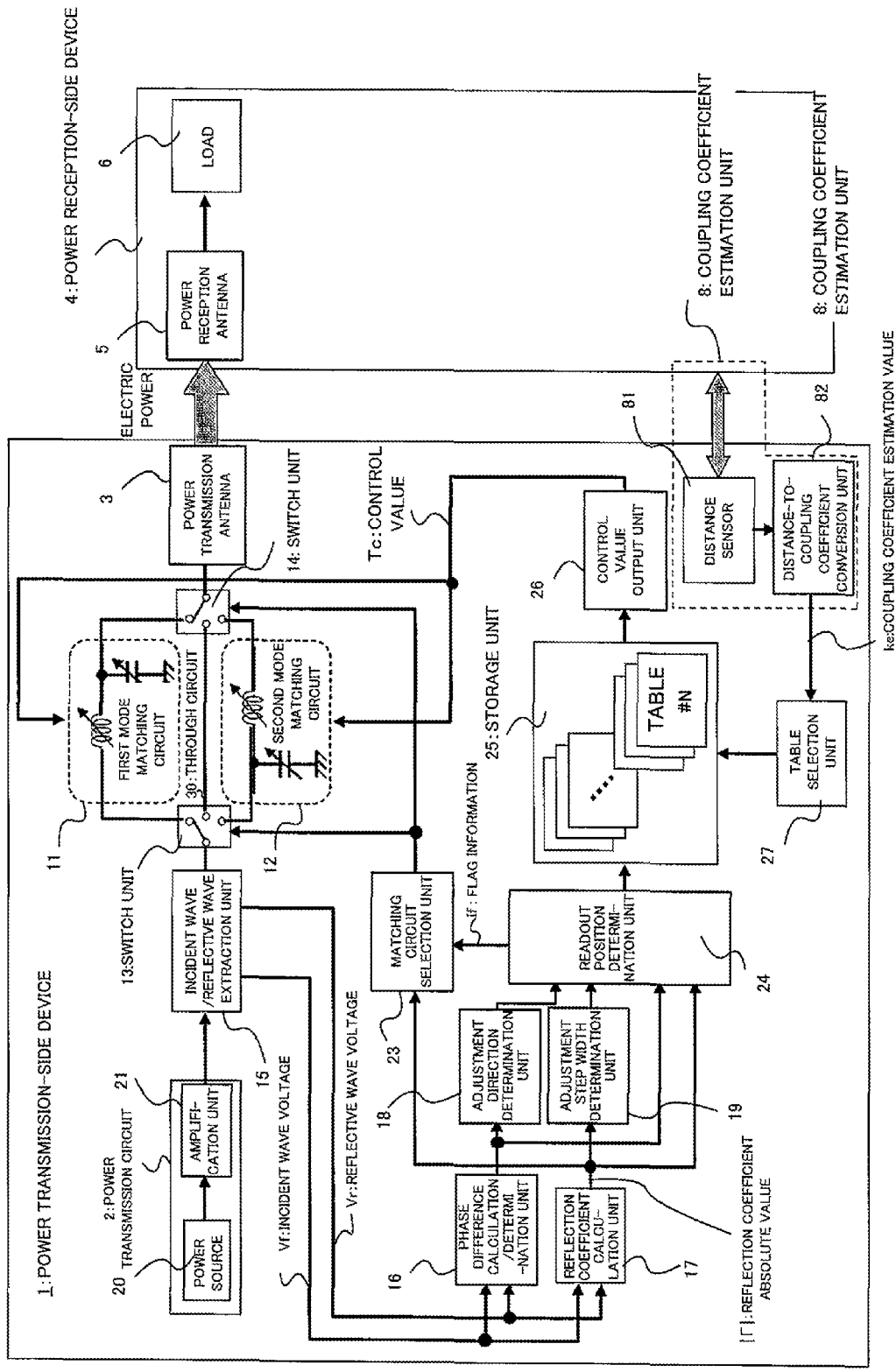
FIG. 30 illustrates the schematic configuration of the electric power transmission system according to the second embodiment.

FIG. 30 illustrates a schematic configuration of the electric power transmission system according to the second embodiment. The second embodiment is different from the first embodiment in that the value RL of the load 6 varies and that the storage unit 25 stores the matching correction amount tables each corresponding to a different coupling coefficient k to deal with the case that the value RL of the load 6 varies. Then, the power transmission-side device 1 executes the automatic matching operation in the initial state and executes the matching-state tracking operation after the automatic matching operation. Hereinafter, the same elements as the first embodiment will be arbitrarily provided with the same reference numbers and the explanation thereof will be omitted.

Figure 31:
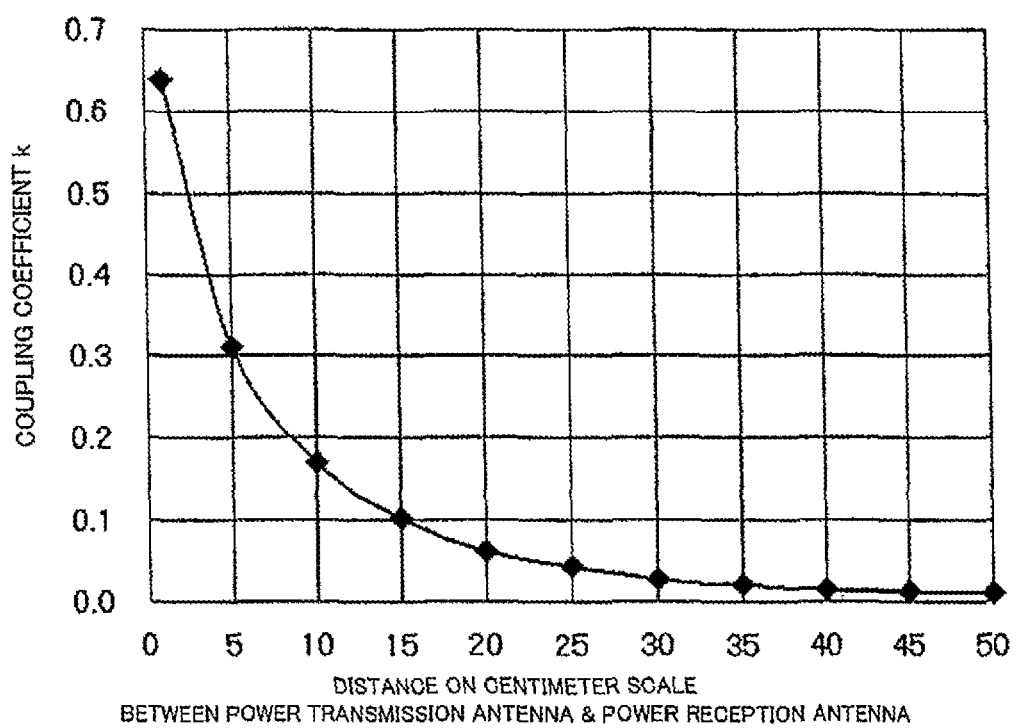
FIG. 31 illustrates a graph indicating the relationship of the coupling coefficient with the distance between the power transmission antenna and the power reception antenna.

The coupling coefficient estimation unit 8 estimates the coupling coefficient k between the power transmission antenna 3 and the power reception antenna 5 prior to the transmission of the rated electric power. Concretely, the distance sensor 81 measures the distance between the power transmission-side device 1 and the power reception-side device 4. The distance-to-coupling coefficient conversion unit 82 calculates the coupling coefficient k from the distance measured by the distance sensor 81 with reference to a conversion table between the distance and the coupling coefficient k stored in the memory in advance. FIG. 31 illustrates a graph indicating the relationship of the coupling coefficient k with the distance between the power transmission antenna 3 and the power reception antenna 5. The distance-to-coupling coefficient conversion unit 82 stores such a conversion table illustrated in FIG. 31 indicating the correspondence of the distance to the coupling coefficient k on its memory in advance.

On the basis of the reflection coefficient estimation value ke calculated by the coupling coefficient estimation unit 8, the table selection unit 27 selects the matching correction amount table to be used from a plurality of matching correction amount tables each corresponding to a different coupling coefficient k stored on the storage unit 25.

Figures 32, 33:
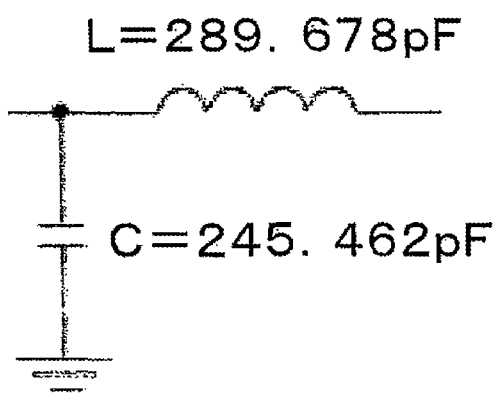
FIG. 32 illustrates an example of the matching correction amount table corresponding to the coupling coefficient "0.07".
FIG. 33 indicates a matching circuit suitable for the second embodiment.

A description will be given of the matching correction amount tables stored on the storage unit 25 in the second embodiment. FIG. 32 illustrates an example of the matching correction amount table corresponding to the case that the coupling coefficient k is "0.07". The matching correction amount table illustrated in FIG. 32 has the capacitance values C and the inductance values L necessary for matching the input impedance Zin to "50Ω" in a case that the value RL of the load 6 of the power reception-side device 4 is within the range of "10Ω" to "500Ω". In addition, as with the first embodiment, the flag information If indicating which of the first mode matching circuit 11 and the second mode matching circuit 12 to use is also stored in each matching correction amount table.

For example, provided that the input impedance Zin inputted to the readout position determination unit 24 is "27+j0Ω", the readout position determination unit 24 selects the row of the index number Idx "7" including the impedance value (R=25.040Ω, X=1.435Ω) nearest to the input impedance Zin, and specifies that the flag information If is "2", and that the capacitance value C is "245.462 pF", and that the inductance value L is "289.678 nH". Then, the readout position determination unit 24 supplies the matching circuit selection unit 23 with the flag information If corresponding to information on the mode of the matching circuit.

On the basis of the supplied flag information If indicating "2", the matching circuit selection unit 23 controls the switch units 13 and/or 14 so that the second mode matching circuit 12 is connected between the power transmission circuit 2 and the power transmission antenna 3. The capacitance value C and the inductance value L are supplied to the control value output unit 26, and the control value output unit 26 applies these values to the variable capacitor unit and the variable inductance unit of the matching circuit. FIG. 33 illustrates the matching circuit determined in such a way mentioned above.

In this way, according to the second embodiment, as with the first embodiment, by obtaining the input impedance Zin at the edge of the power transmission antenna and referring to the selected matching correction amount table, the power transmission-side device 1 can promptly match the impedance between the power transmission circuit 2 and the power transmission antenna 3. For example, when electric vehicles will become popular in the future and an electric vehicle stopping at a traffic intersection will be charged by a battery charger provided on the road surface, it will be necessary to start the charge after the stop of the vehicle as soon as possible. In such a situation, automatic completion of the impedance matching as soon as possible will lead to prompt transition to a rated electric power transmission.

[Matching Correction Amount Table]

Next, a description will be given of the matching correction amount table stored on the storage unit 25 in advance according to the second embodiment. The matching correction amount tables used in both the first embodiment and the second embodiment are generated based on the locus of the variation of the input impedance Zin at the edge of the power transmission antenna illustrated in FIGS. 5A to 6C. FIGS. 6A to 6C each indicates a locus of the input impedance Zin in the case of changing the value RL of the load 6 while fixing the coupling coefficient k between the power transmission antenna 3 and the power reception antenna 5. Hereinafter, a description will be given of the case that the matching correction amount table is prepared based on the impedance locus illustrated in FIGS. 6A to 6C, since in the second embodiment, the value RL of the load 6 of the power reception-side device 4 varies while the coupling coefficient k is fixed as mentioned above.

As illustrated in FIGS. 6A to 6C, if the load value RL is changed while the coupling coefficient k is fixed, each of the loci of the input impedance Zin at the edge of the power transmission antenna varies particularly around the axis corresponding to "X=0Ω" in the horizontal direction on the Smith chart as with the loci in FIGS. 5A to 5C. The loci of the input impedance Zin has a tendency to be relatively positioned towards the left if the coupling coefficient k is a small value (e.g., "k=0.030"), towards the right if the coupling coefficient k is a large value (e.g., "k=0.120"), and substantially without slanting leftward or rightward if the coupling coefficient k is a medium value such as "k=0.064".

As illustrated in FIGS. 6A to 6C, each locus indicating the variation of the input impedance Zin at the edge of the power transmission antenna at the time when the value RL of the load 6 of the power reception-side device 4 is changed has a common shape in that it varies particularly around the axis corresponding to "X=0Ω" in the horizontal direction on the Smith chart even if the target coupling coefficient k is different. Thus, in order to match the impedance at any point on the locus of the impedance, it is only necessary to divide the Smith chart into two area, the area A and the area B, as illustrated in FIGS. 15A and 15B according to the first embodiment, and to use the matching circuit appropriate for each area. Namely, the same way as the first embodiment can be applied to the second embodiment.

Concretely, as illustrated in FIGS. 16A to 16C, in a case that a point on the impedance locus exists in the area A, it is only necessary to increase the value of the variable capacitor connected in parallel to the power transmission antenna 3 by a correction amount A1 thereby to move the target point to the point R, and thereafter to increase the value of the variable inductor connected in series between the power transmission circuit 2 and the power transmission antenna 3 by a correction amount A2 thereby to move the target point to the matching point P. In a case that a point on the impedance locus exists in the area B, the value of the variable inductor connected in series between the power transmission circuit 2 and the power transmission antenna 3 is increased by a correction amount B1 thereby to move the target point to the Q at first, and thereafter the value of the variable capacitor connected in parallel on the side of the power transmission circuit 2 is increased by a correction amount B2 thereby to move the target point to the matching point P. The explanation thereof is the same as the explanation in the first embodiment.

The configurations of the matching circuits for matching an impedance point existing in each of the areas A and B are the same as the configurations according to the first embodiment, and they are illustrated in FIGS. 17A and 17B. As with the first embodiment, FIG. 17A corresponds to the first mode matching circuit 11 and FIG. 17B corresponds to the second mode matching circuit 12. Thus, the power transmission-side device 1 only has to prepare these two patterns of circuits as the matching circuits.

The matching correction amount table is also prepared in the same way as the first embodiment. The power transmission-side device 1 determines the correction amounts A1 and A2 and the correction amounts B1 and B2 by means of theoretic calculation (see FIGS. 18A and 18B) or some measurements, and previously stores a look-up table in which the calculated values are associated with the impedance values as a matching correction amount table on the storage unit 25 for example. Here, the correction amounts A1 and A2 are necessary for matching an impedance point existing in the area A by use of the matching circuit corresponding to FIG. 17A, and the correction amounts B1 and B2 are necessary for matching an impedance point existing in the area B by use of the matching circuit corresponding to FIG. 17B. In this way, by calculating the input impedance Zin at the edge of the power transmission antenna, the power transmission-side device 1 can obtain the correction amounts necessary for the matching process at a time.

FIGS. 34A to 34C each illustrates the matching correction amount table prepared through theoretic calculation in conditions that each coupling coefficient k is set to "0.03", "0.07" or "0.15", and that the power transmission antenna 3 and the power reception antenna 5 (wherein inductance value L=8.64 pH, the capacitance value C=17.49 pF, the loss resistance R=1.0Ω, the capacitance of a capacitor connected in parallel Ct=10.08 pF) according to the embodiment are placed to face each other, and that the value RL of the load 6 is changed from "10Ω" to "500Ω". It is noted that these tables include the flag information If specifying the mode of the matching circuit in addition to the capacitance value C and the inductance value L to be applied to each matching circuit. The index numbers Idx are sequential serial numbers, and the larger the impedance value (load) of a row is, the larger the index number Idx is allocated to the row. The storage unit 25 stores a plurality of the matching correction amount tables prepared in this way per coupling coefficient k.

By using the matching correction amount table having such a configuration, the power transmission-side device 1 can determine which of the matching correction amount tables to use through the calculation of the coupling coefficient k between the power transmission antenna 3 and the power reception antenna 5. Furthermore, by calculating the value of the input impedance Zin at the edge of the power transmission antenna, the power transmission-side device 1 can determine the matching circuit to be used and the control value Tc to be applied to the matching circuit at one-time processing on the basis of the selected matching correction amount table.

[Effect by Automatic Matching Operation]

Hereinafter, a description will be given of the effect by the automatic matching operation by use of some examples.

Figure 35A:
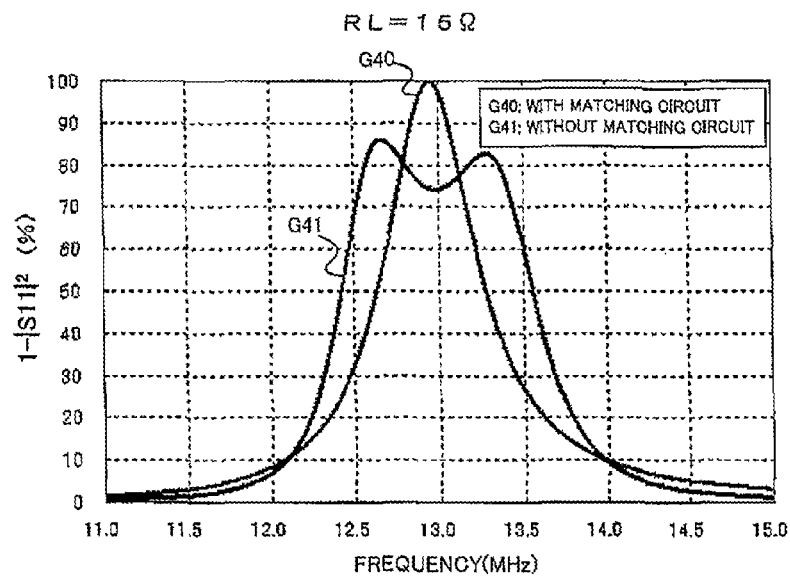
FIGS. 35A and 35B illustrate examples of the reduction of the reflection loss through the execution of the impedance matching process with reference to the matching correction amount table.
Figure 35B:
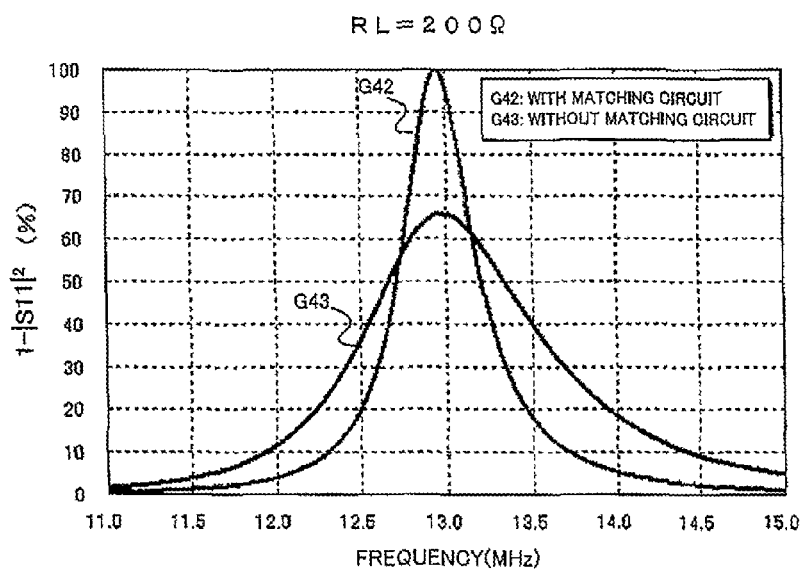

FIGS. 35A and 35B illustrate examples of graphs indicating the reduction of the reflection loss through the execution of the impedance matching process with reference to the matching correction amount table illustrated in FIG. 34B in a condition that the coupling coefficient k is "0.07". FIG. 35A indicates a case that the value RL of the load 6 is "15Ω", and FIG. 35B indicates a case that the value RL of the load 6 is "200Ω".

In the case of FIG. 35A, the input impedance Zin at the edge of the power transmission antenna is "150.3−j17.05Ω". Accordingly, when the matching correction amount table in FIG. 34B is searched for the row having an impedance value nearest thereto, the row having the index number Idx "2" is selected. In this case, the flag information If of the row indicating the mode of the matching circuit is "1", and the capacitance value C is "106.3 pF", and the inductance value L is "879.1 nH". As illustrated in FIG. 35A, the value of "$1-|S_{11}|^2$" at the drive frequency "12.947 MHz" in a case (see graph G41) of no addition of the matching circuit is 74.4% whereas the value thereof in a case (see graph G40) that the capacitance value C and the inductance value L as mentioned above are applied to the selected first mode matching circuit 11 is 100.0%. As a result, improvement, i.e., reduction of the reflection loss, by 25.6% is achieved due to the addition of the matching circuit.

Next, in the case of FIG. 35B, the input impedance Zin at the edge of the power transmission antenna is "13.1+j1.8Ω". Accordingly, when the matching correction amount table indicated in FIG. 34B is searched for the row having an impedance value nearest thereto, the row having the index number Idx "9" is selected. In this case, the flag information If of the row indicating the mode of the matching circuit is "2", and the capacitance value C is "412.9 pF", and the inductance value L is "247.7 nH". As illustrated in FIG. 35B, the value of "$1-|S_{11}|^2$" at the drive frequency "12.947 MHz" in a case (see graph G43) of no addition of the matching circuit is 65.7% whereas the value thereof in a case (see graph G42) that the capacitance value C and the inductance value L as mentioned above are applied to the selected second mode matching circuit 12 is 100.0%. As a result, improvement, i.e., reduction of the reflection loss, by 34.3% is achieved due to the addition of the matching circuit.

In this way, the power transmission-side device 1 according to the second embodiment stores the matching correction amount tables each corresponding to a different coupling coefficient k between the power transmission antenna 3 and the power reception antenna 5 on the storage unit 25, and calculates the reflection coefficient estimation value ke to select the matching correction amount table to be used. Thereafter, the power transmission-side device 1 specifies the input impedance Zin at the edge of the power transmission antenna. Thereby, it is possible to automatically and promptly construct a proper matching circuit at one-time processing.

[Matching-State Tracking Operation]

Next, a description will be given of the matching-state tracking operation according to the second embodiment. The operation is executed for keeping the matching state after the first completion of the impedance matching process.

First, a description will be given of the necessity of the matching-state tracking operation. It is hereinafter assumed that for the purpose of the rated electric power transmission in a state that the power transmission antenna 3 and the power reception antenna 5 are placed to face each other, the matching circuit has already been configured to be most suitable for the input impedance Zin depending on the coupling state between the power transmission antenna 3 and the power reception antenna 5 and the value RL of the load 6 of the power reception-side device 4 through the execution of the automatic matching operation (this operation is generally executed in a state that the output is narrowed down). In this case, the power transmission circuit 2 proceeds with the rated electric power transmission. Here, it is supposed that the value RL of the load 6 of the power reception-side device 4 is changed during the electric power transmission in the matching state. Generally, when a lithium ion battery mounted on an electric vehicle is charged, the charge process is executed while the operation mode such as a constant current mode, a constant voltage mode, and a constant electric power mode is switched. In this case, the load value could vary depending on the amount of charge of the battery, so it is necessary to assume the variation of the load in such an application. If the value RL of the load 6 of the power reception-side device 4 varies, the input impedance Zin at the edge of the power transmission antenna becomes different from the value set by the previous matching process of the automatic matching operation. As a result, the mismatch thereof happens again. In this case, there is a necessity of prompt detection of the mismatch from the matching state and another matching process with respect to the changed input impedance Zin. In consideration of the above fact, the matching-state tracking operation according to the second embodiment tracks the variation of the value RL of the load 6 of the power reception-side device 4, and properly determines the mode of the matching circuit and the control value Tc to be applied to the matching circuit thereby to keep the matching state.

Next, a description will be given of the matching-state tracking operation. In the matching-state tracking operation, as with the automatic matching operation, the locus (see FIGS. 6A to 6C) of the input impedance Zin at the edge of the power transmission antenna in a condition that the value RL of the load 6 is changed is also used. Each of the loci of the impedance indicated by FIGS. 6A and 6C is determined in a state that the value RL of the load 6 of the power reception-side device 4 is changed while the coupling coefficient k between the power transmission antenna 3 and the power reception antenna 5 is fixed, and these loci of the impedance are used in the second embodiment.

If the coupling coefficient k between the power transmission antenna 3 and the power reception antenna 5 is not changed, the input impedance Zin at the edge of the power transmission antenna exists on the locus of the impedance indicated by FIGS. 6A to 6C. The mode of the matching circuit and the control value Tc to be applied to the matching circuit which are necessary in order to match a impedance on the locus of the impedance are included in the matching correction amount table prepared per coupling coefficient k as illustrated in FIGS. 34A to 34C. Thus, in the matching-state tracking operation executed after becoming the first-time matching state, the power transmission-side device 1 only has to change the row (i.e., index number Idx) of the matching correction amount table to be applied by continuously referring to the matching correction amount table used in the automatic matching operation.

In consideration of the fact, regarding the matching-state tracking operation, the power transmission-side device 1 detects in which direction, either the left or the right (the load becomes large as the position shifts to the left and becomes smaller as the position shifts to the right), the matching state corresponding to a particular impedance shifts on the locus of the impedance indicated by FIGS. 6A to 6C. Namely, the power transmission-side device 1 detects whether the matching state shifts on either the upper side or the downside (the load becomes large as the position shifts toward the downside and becomes small as the position shifts toward the upper side) from the presently-used row of the matching correction amount table. Then, the power transmission-side device 1 changes the configuration of the matching circuit toward the proper direction. As indicated above, in the matching correction amount tables stored on the storage unit 25, the index numbers Idx are sequential serial numbers, and the larger the impedance value (load) of a row is, the larger index number Idx is allocated to the row as illustrated in FIGS. 34A to 34C.

(Readout Direction Determination Method)

Hereinafter, a description will be given of the method of determining in which direction the matching state shifts, the direction where the load becomes larger or the direction where the load becomes smaller. The process is executed by the phase difference calculation/determination unit 16 and the adjustment direction determination unit 18.

First, with reference to FIGS. 36A to 36C, a description will be given of the relationship between the waveform of the incident wave voltage and the waveform of the reflective wave voltage in the case that the coupling strength shifts toward the direction where the load becomes larger.

Concretely, FIG. 36A illustrates the waveform of the incident wave voltage and the waveform of the reflective wave voltage in a case that the coupling coefficient k is "0.030" and that the value RL of the load 6 becomes larger in steps as "100", "200" and "400" after matching the impedance in a condition that the value RL of the load 6 is "50Ω".

FIG. 36B illustrates the waveform of the incident wave voltage and the waveform of the reflective wave voltage in a case that the coupling coefficient k is "0.064" and that the value RL of the load 6 becomes larger in steps as "100", "200" and "400" after matching the impedance in a condition that the value RL of the load 6 is "50Ω".

FIG. 36C illustrates the waveform of the incident wave voltage and the waveform of the reflective wave voltage in a case that the coupling coefficient k is "0.120" and that the value RL of the load 6 becomes larger in steps as "100", "200" and "400" after matching the impedance in a condition that the value RL of the load 6 is "50Ω".

Figure 37A:
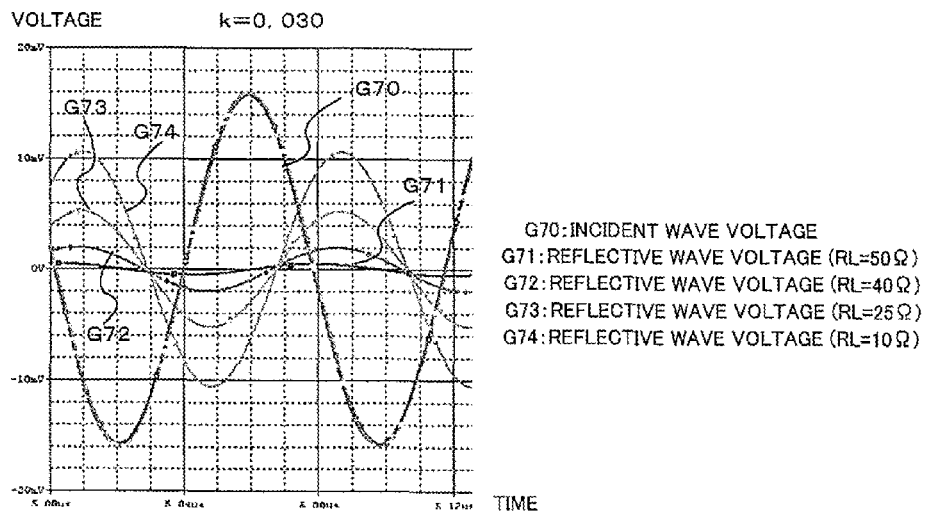
FIGS. 37A to 37C each illustrates the relationship between the waveform of the incident wave voltage and the waveform of the reflective wave voltage in the case that the load value shifts toward the direction where the load value becomes smaller.
Figure 37B:
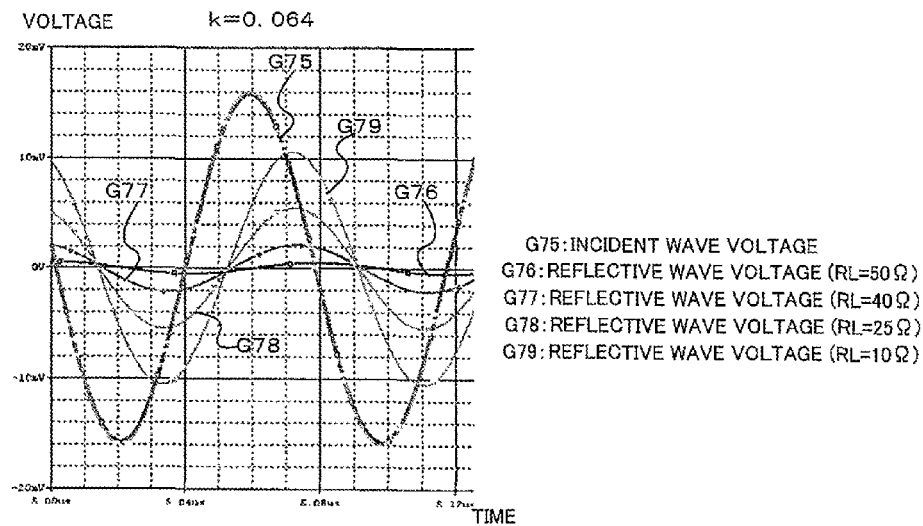
Figure 37C:
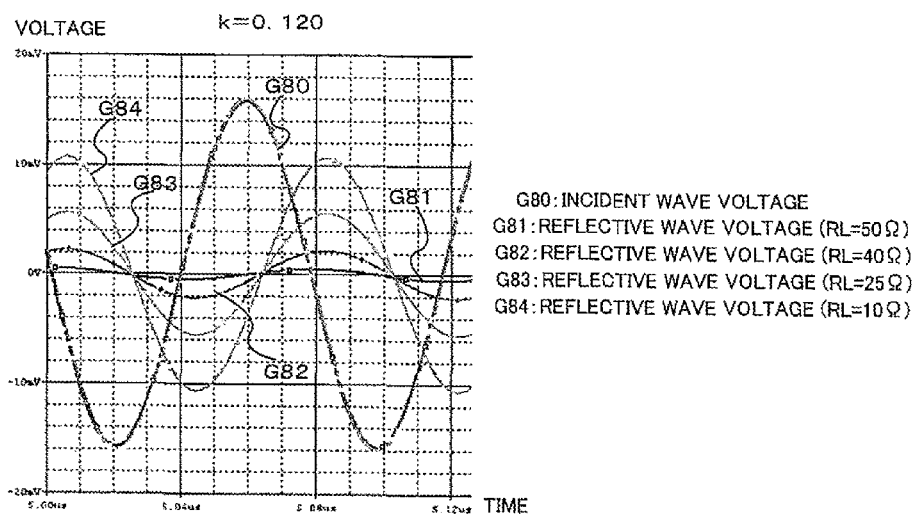

Next, FIGS. 37A to 37C illustrates the relationship between the waveform of the incident wave voltage and the waveform of the reflective wave voltage in a case that the load shifts toward the direction where the load becomes smaller.

Concretely, FIG. 37A illustrates the waveform of the incident wave voltage and the waveform of the reflective wave voltage in a case that the coupling coefficient k is "0.030" and that the value RL of the load 6 becomes smaller in steps as "40Ω", "25Ω" and "10Ω" after matching the impedance in a condition that the value RL of the load 6 is "50Ω".

FIG. 37B illustrates the waveform of the incident wave voltage and the waveform of the reflective wave voltage in a case that the coupling coefficient k is "0.064" and that the value RL of the load 6 becomes smaller in steps as "40Ω", "25Ω" and "10Ω" after matching the impedance in a condition that the value RL of the load 6 is "50Ω".

FIG. 37C illustrates the waveform of the incident wave voltage and the waveform of the reflective wave voltage in a case that the coupling coefficient k is "0.120" and that the value RL of the load 6 becomes smaller in series as "40Ω", "25Ω" and "10Ω" after the matching at the time when the value RL of the load 6 is "50Ω".

As illustrated in FIGS. 36A to 36C, when the value RL of the load 6 shifts in the direction where the it becomes larger after once having the impedance matched, the phase of the reflective wave voltage Vr is preceding the phase of the incident wave voltage Vf. In contrast, as illustrated in FIGS. 37A to 37C, when the load 6 shifts in the direction where the it becomes smaller after once having the impedance matched, the phase of the reflective wave voltage Vr lags behind the phase of the incident wave voltage Vf. These relationships concerning the phases can be applied to any coupling coefficient k.

In consideration of the above fact, the power transmission-side device 1 continues to monitor the phase relationship between the incident wave voltage Vf and the reflective wave voltage Vr after the first matching process, and it determines that the value RL of the load 6 becomes larger if the phase of the reflective wave voltage Vr is preceding the phase of the incident wave voltage Vf. In this case, with reference to the row existing in such a direction that the value RL of the load 6 (the index Idx) becomes larger in the matching correction amount table, i.e., the row existing in the downward direction with respect to the present row in the matching correction amount table, the power transmission-side device 1 applies the control value Tc in the reference row to the matching circuit indicated by the flag information If in the reference row.

In contrast, the power transmission-side device 1 determines that the value RL of the load 6 becomes smaller if the phase of the reflective wave voltage Vr lags behind the phase of the incident wave voltage Vf. In this case, with reference to the row existing in such a direction that the load value (the index Idx) becomes smaller in the matching correction amount table, i.e., the row existing in the upward direction with respect to the present row in the matching correction amount table, the power transmission-side device 1 applies the control value Tc in the reference row to the matching circuit indicated by the flag information If in the reference row.

By executing such a process, the power transmission-side device 1 can keep the matching state even if the input impedance Zin at the edge of the power transmission antenna varies due to the change of the value RL of the load 6 connected to the power reception-side device 4. Preferably, as with the first embodiment, the power transmission-side device 1 continues to monitor the reflection coefficient absolute value $|\Gamma|$ at all times after the first matching process. Then, if the reflection coefficient absolute value $|\Gamma|$ is equal to or smaller than the threshold $|\Gamma|_{thr}$, the power transmission-side device 1 does not perform the above-mentioned matching-state tracking operation. In contrast, if the reflection coefficient absolute value $|\Gamma|$ is larger than the threshold $|\Gamma|_{thr}$, the power transmission-side device 1 identifies the phase relationship between the incident wave voltage Vf and the reflective wave voltage Vr, and changes the configuration of the matching circuit by changing the row to be used in the matching correction amount table. Thereby, the power transmission-side device 1 can keep the reflection coefficient absolute value $|\Gamma|$ equal to or smaller than the threshold $|\Gamma|_{thr}$ at all times, and suppress the reflection loss.

Figure 39A:
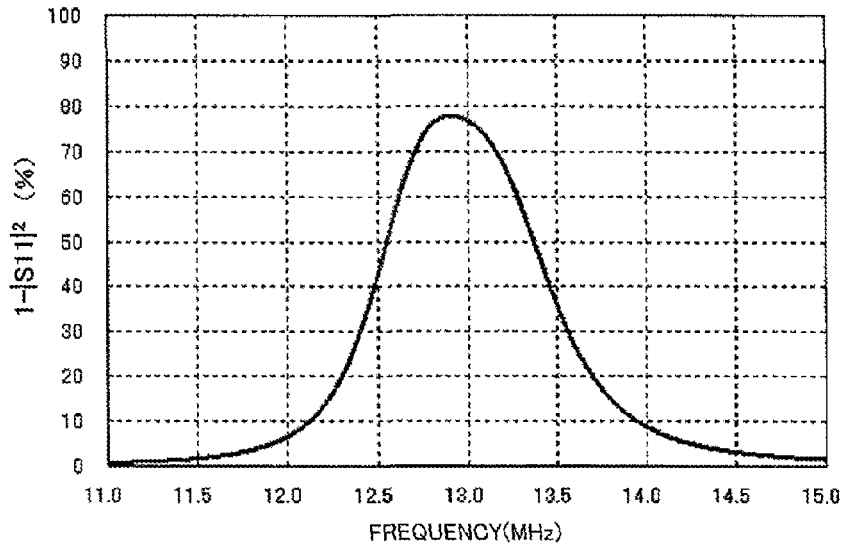
FIG. 39A indicates a graph of "$1-|S_{11}|^2$" in a state that the load value varies from "30Ω" to "10Ω" after the matching.
Figure 39B:
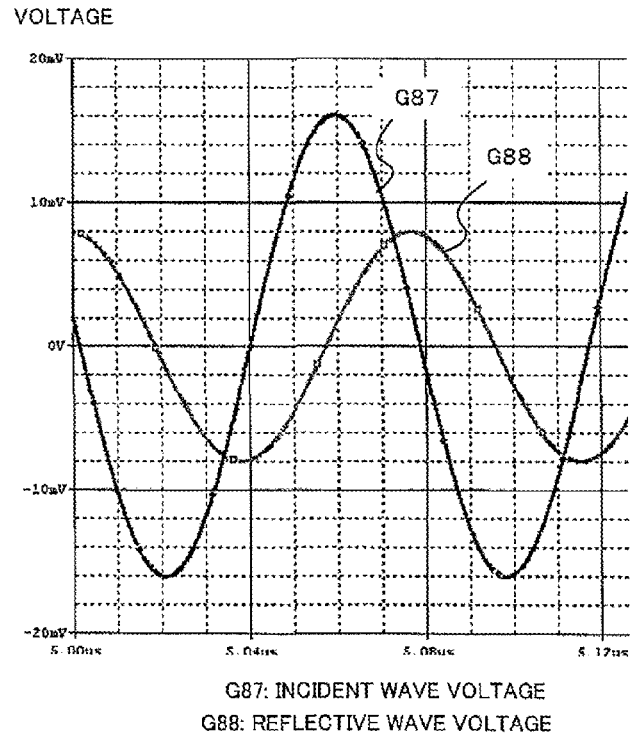
FIG. 39B indicates graphs of the waveform of the incident wave voltage and the waveform of the reflective wave voltage at the drive frequency in the case of FIG. 39A.
Figure 40A:
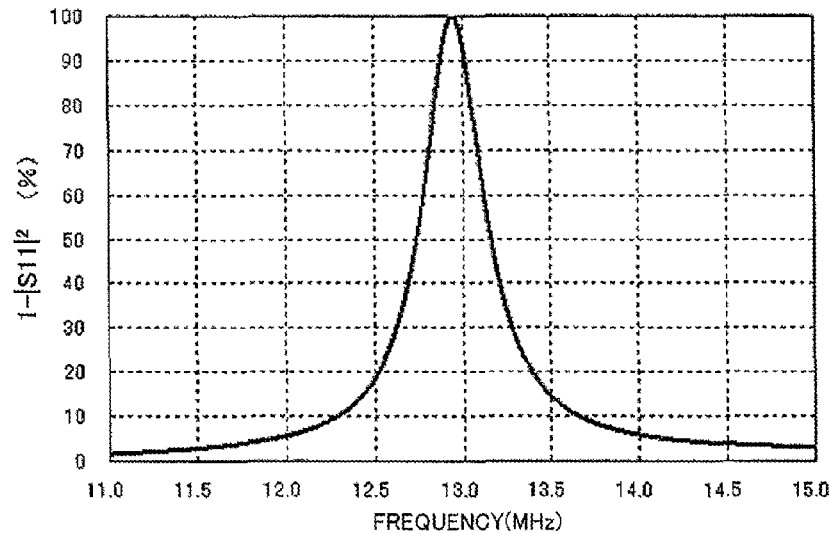
FIG. 40A indicates a graph of "$1-|S_{11}|^2$" after execution of the matching-state tracking operation.
Figure 40B:
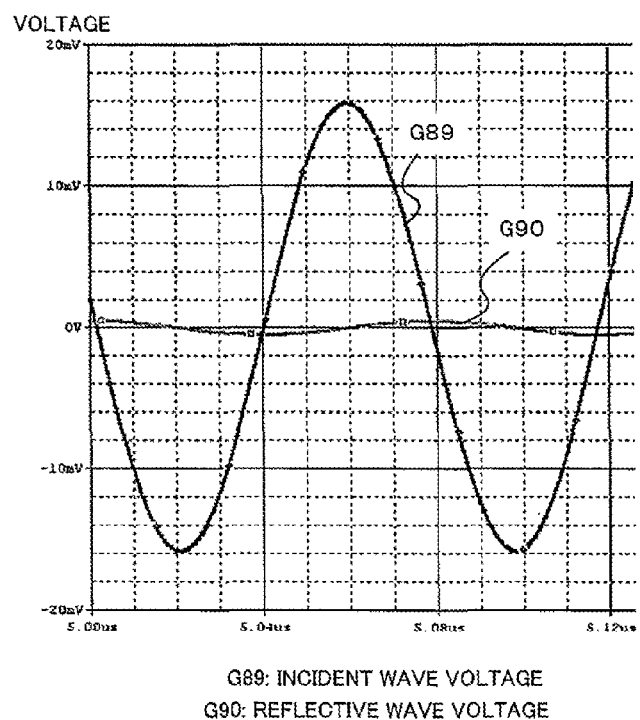
FIG. 40B indicates graphs of the waveform of the incident wave voltage and the waveform of the reflective wave voltage at the drive frequency in the case of FIG. 40A.

Next, with reference to FIGS. 38A to 40B, a description will be given of an example of the matching-state tracking operation in a case that the coupling coefficient k is "0.07". Each example indicated by FIGS. 38A to 40B illustrates a case of the mismatch caused by the transition of the value RL of the load 6 from "30Ω" to "10Ω" after the first matching process by referring to the row corresponding to the index Idx "4" illustrated in FIG. 34B. Concretely, FIG. 38A indicates a graph of "$1-|S_{11}|^2$" just after the matching process in a state that the value RL of the load 6 is "30Ω". FIG. 38B indicates graphs of the waveform of the incident wave voltage and the waveform of the reflective wave voltage at the drive frequency in the case of FIG. 38A. FIG. 39A indicates a graph of "$1-|S_{11}|^2$" in a state that the value RL of the load 6 varies from "30Ω" to "10Ω" after the matching process. FIG. 39B indicates graphs of the waveform of the incident wave voltage and the waveform of the reflective wave voltage at the drive frequency in the case of FIG. 39A. FIG. 40A indicates a graph of the value "$1-|S_{11}|^2$" after execution of the matching-state tracking operation. FIG. 40B indicates graphs of the waveform of the incident wave voltage and the waveform of the reflective wave voltage at the drive frequency in the case of FIG. 40A.

Figure 38A:
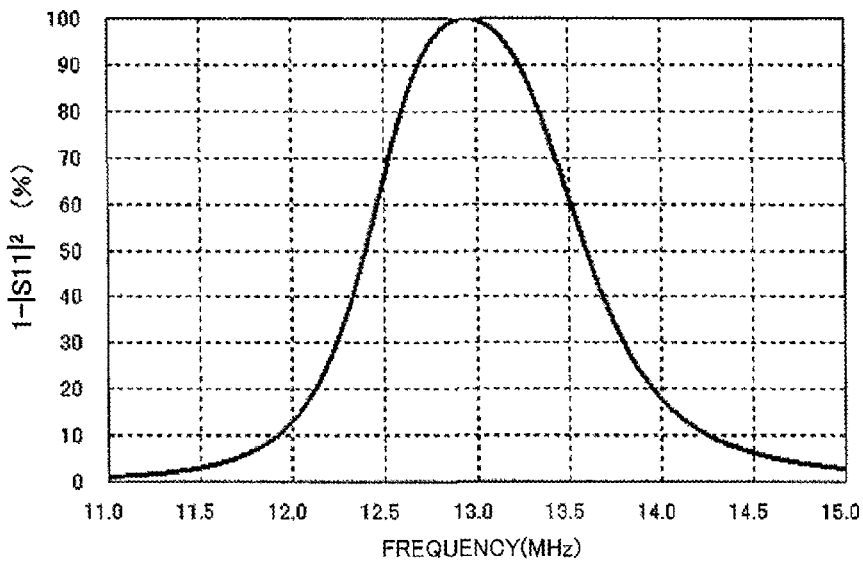
FIG. 38A indicates a graph of "$1-|S_{11}|^2$" just after the matching process in a state that the load value is "30Ω".
Figure 38B:
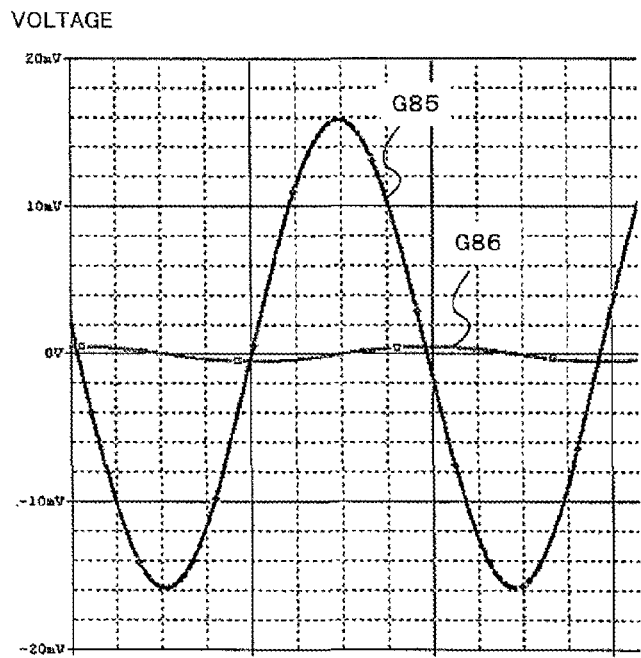
FIG. 38B indicates graphs of the waveform of the incident wave voltage and the waveform of the reflective wave voltage at the drive frequency in the case of FIG. 38A.

As illustrated in FIGS. 38A and 38B, just after the automatic matching operation is performed in the initial state at the drive frequency "12.947 MHz", almost 100% of the electric power is inputted to the power transmission antenna 3 and the level of the reflective wave is also low. At that time, the selected index number Idx in the matching correction amount table is "4". When the configuration of the matching circuit is unchanged and the value RL of the load 6 is changed to "10Ω", the level of the reflective wave increases due to recurrence of mismatch, and the value "$1-|S_{11}|^2$" decreases to 77% as indicated by FIGS. 39A and 39B.

In this case, on the basis of the phase relationship between the incident wave voltage Vf and the reflective wave voltage Vr, the power transmission-side device 1 detects the change of the value RL of the load 6. Concretely, the power transmission-side device 1 determines that the value RL of the load 6 becomes smaller due to the phase delay of the reflective wave voltage Vr with respect to the incident wave voltage Vf. Thus, in this case, on the basis of the row existing in such a direction that the value RL of the load 6 becomes smaller in the matching correction amount table, i.e., the row of the index number Idx "1" smaller than the presently-used index number Idx "4", the power transmission-side device 1 updates the configuration of the matching circuit. Accordingly, as illustrated in FIGS. 40A and 40B, the power transmission-side device 1 becomes the matching state again.

The determination method of the step width Widx is the same as the first embodiment, so the explanation thereof will be omitted.

[Process Flow]

Next, a description will be given of a procedure of the process according to the second embodiment. Hereinafter, after the explanation of the procedure of the process of the automatic matching operation with reference to "fifth flow" in FIG. 41 and "sixth flow" in FIG. 42, a description will be given of the procedure of the process of the matching-state tracking operation with reference to "seventh flow" illustrated in FIG. 43.

(Fifth Flow)

Figure 41:
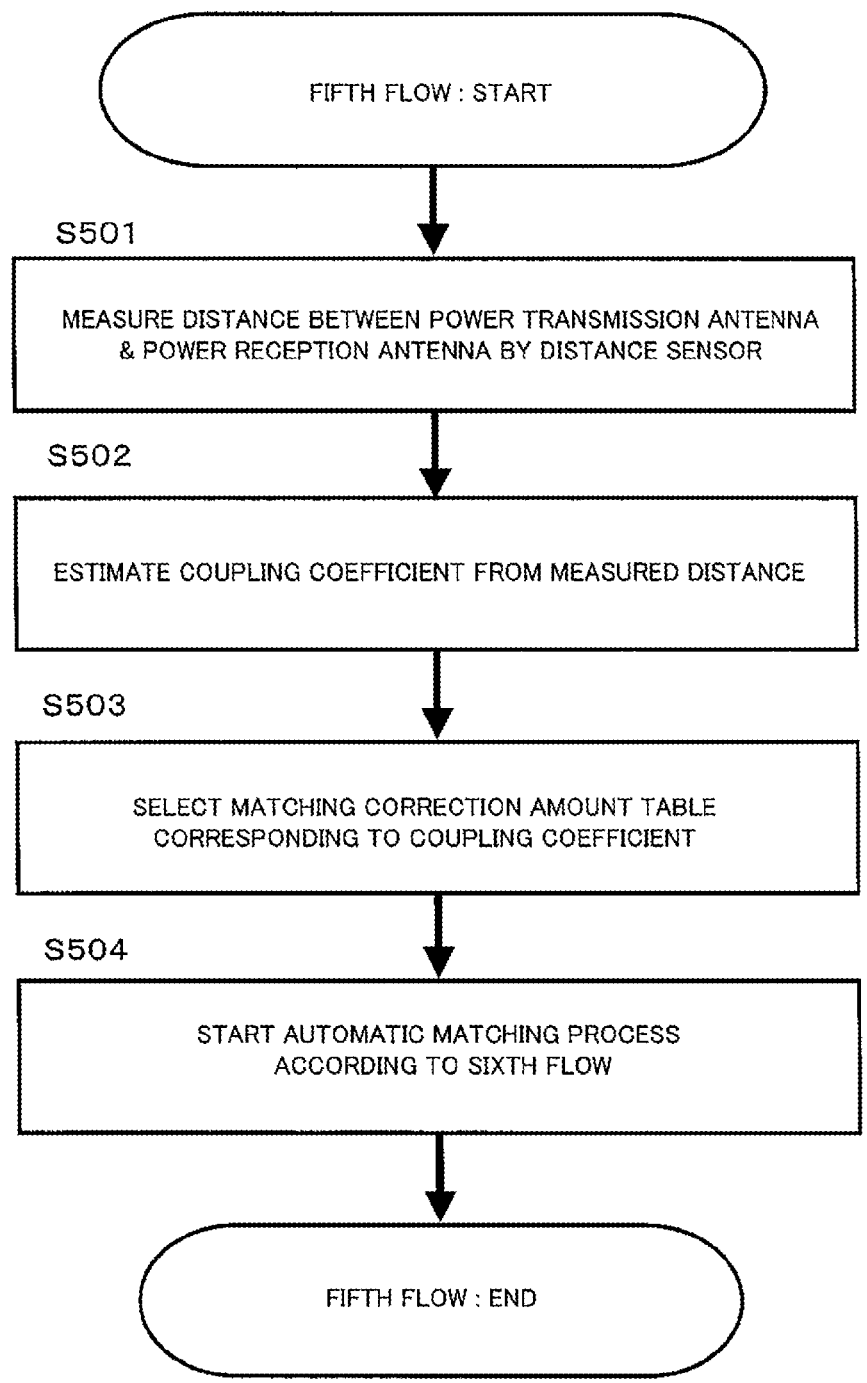
FIG. 41 is a flowchart indicating a procedure of the process of the fifth flow according to the second embodiment.

FIG. 41 is a flowchart indicating a procedure of the process of the fifth flow executed by the power transmission-side device 1 in the second embodiment. The power transmission-side device 1 executes the process of the fifth flow indicated by FIG. 41 at a predetermined timing.

First, the distance sensor 81 of the power transmission-side device 1 measures the distance between the power transmission antenna and the power reception antenna 5 (step S501). Then, the distance-to-coupling coefficient conversion unit 82 of the power transmission-side device 1 estimates the coupling coefficient k from the measured distance (step S502). Namely, the distance-to-coupling coefficient conversion unit 82 calculates the reflection coefficient estimation value ke. Next, the table selection unit 27 of the power transmission-side device 1 selects the matching correction amount table corresponding to the reflection coefficient estimation value ke from a plurality of the matching correction amount tables stored on the storage unit 25 (step S503). Then, the power transmission-side device 1 starts the automatic matching process corresponding to the fifth flow in FIG. 42 (step S504).

(Sixth Flow)

Figure 42:
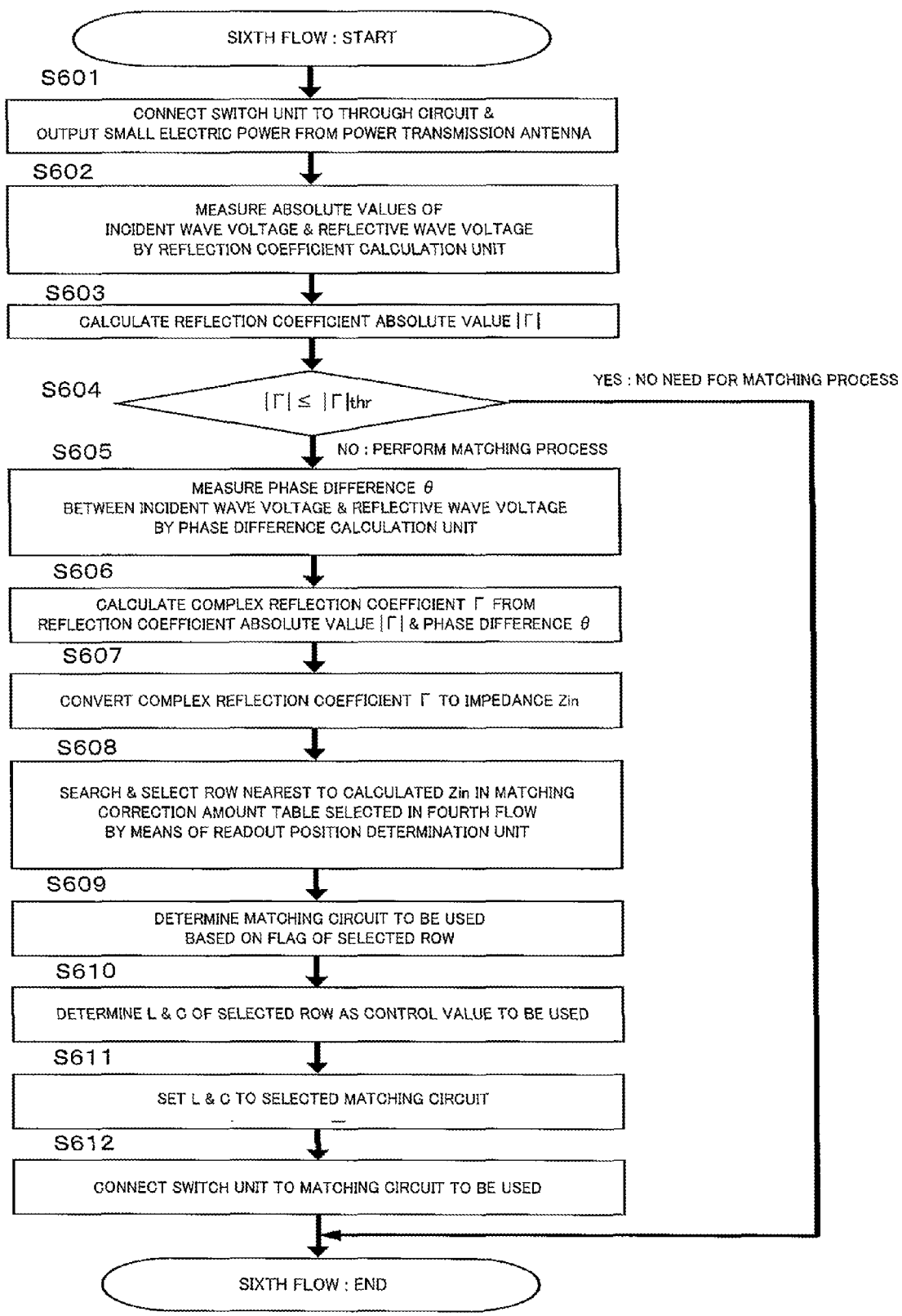
FIG. 42 is a flowchart indicating a procedure of the process of the sixth flow according to the second embodiment.

FIG. 42 is a flowchart indicating a procedure of the process of the sixth flow executed by the power transmission-side device 1 in the second embodiment. The power transmission-side device 1 executes the process of the sixth flow indicated by FIG. 42 when proceeding with step S504 of the fifth flow in FIG. 41.

First, the matching circuit selection unit 23 of the power transmission-side device 1 sets the switch units 13 and 14 to the through circuit 30, and outputs small electric power from the power transmission antenna 3 (step S601). Next, the reflection coefficient calculation unit 17 of the power transmission-side device 1 measures each absolute value of the incident wave voltage Vf and the reflective wave voltage Vr extracted by the incident-wave/reflective-wave extraction unit 15 (step S602). The reflection coefficient calculation unit 17 calculates the reflection coefficient absolute value $|\Gamma|$ by referring to the equation (1) (step S603).

Next, the power transmission-side device 1 determines whether or not the reflection coefficient absolute value $|\Gamma|$ is equal to or smaller than the threshold $|\Gamma|_{thr}$ (step S604). If the power transmission-side device 1 determines that the reflection coefficient absolute value $|\Gamma|$ is equal to or smaller than the threshold $|\Gamma|_{thr}$ (step S604; Yes), the power transmission-side device 1 determines that it has already been in the matching state and that it does not need any more matching process. Accordingly, the power transmission-side device 1 ends the process of the flowchart.

In contrast, if the reflection coefficient absolute value |Γ| is larger than the threshold |Γ|$_{thr}$ (step S604; No), the matching process from step S605 to step S612 is performed. Concretely, the phase difference calculation/determination unit 16 firstly measures the phase difference θ between the incident wave voltage Vf and the reflective wave voltage Vr according to the equation (2) (step S605). Then, the phase difference calculation/determination unit 16 or the reflection coefficient calculation unit 17 calculates the complex reflection coefficient Γ from the reflection coefficient absolute value |Γ| and the phase difference θ (step S606), and converts the complex reflection coefficient Γ to the input impedance Zin based on the equation (3) (step S607).

Next, the readout position determination unit 24 searches the matching correction amount table selected according to the fifth flow for the row having the impedance value nearest to the calculated input impedance Zin and selects it (step S608). Then, the readout position determination unit 24 supplies the matching circuit selection unit 23 with the flag information If of the selected row to let the matching circuit selection unit 23 determine the matching circuit to be used (step S609). Furthermore, the control value output unit 26 sets the capacitance value C and the inductance value L of the selected row as the control value Tc to be used (step S610). Then, the control value output unit 26 applies the capacitance value C and the inductance value L to the selected matching circuit (step S611). Thereafter, on the basis of the flag information If, the matching circuit selection unit 23 connects the switch units 13 and 14 to the matching circuit to be used (step S612).

(Seventh Flow)

Figure 43:
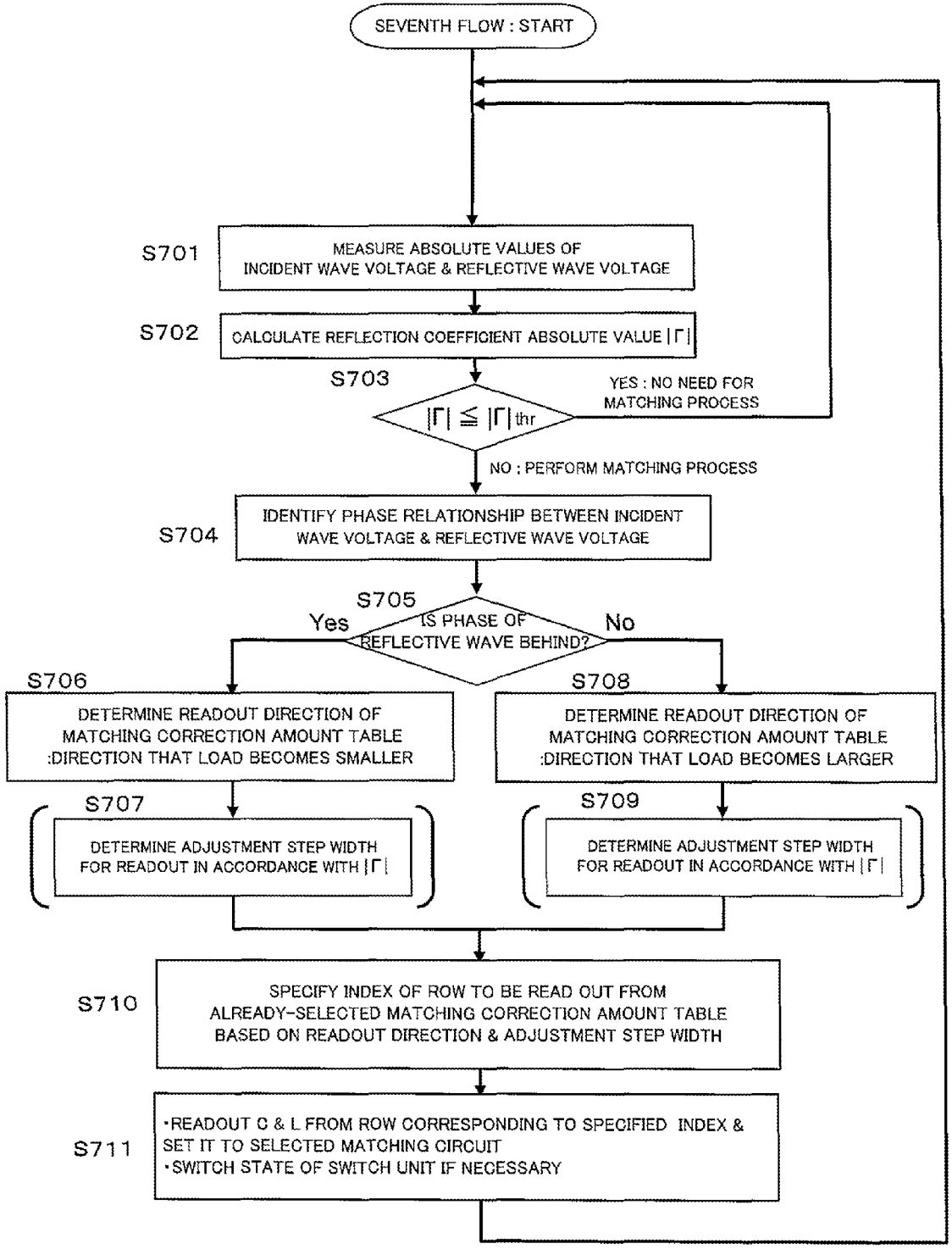
FIG. 43 is a flowchart indicating a procedure of the process of the seventh flow according to the second embodiment.

FIG. 43 is a flowchart indicating a procedure of the process of the seventh flow executed by the power transmission-side device 1 according to the second embodiment. The power transmission-side device 1 executes the process of the seventh flow illustrated in FIG. 43 just after executing the process of the sixth flow in FIG. 42.

First, the reflection coefficient calculation unit 17 of the power transmission-side device 1 measures each absolute value of the incident wave voltage Vf and the reflective wave voltage Vr extracted by the incident-wave/reflective-wave extraction unit 15 (step S701). Then, the reflection coefficient calculation unit 17 calculates the reflection coefficient absolute value |Γ| by referring to the equation (1) (step S702).

Next, the power transmission-side device 1 determines whether or not the reflection coefficient absolute value |Γ| is equal to or smaller than the threshold |Γ|$_{thr}$ (step S703). If the power transmission-side device 1 determines that the reflection coefficient absolute value |Γ| is equal to or smaller than the threshold |Γ|$_{thr}$ (step S703; Yes), the power transmission-side device 1 determines that it has already been in the matching state and that it does not need any more matching process. Accordingly, the power transmission-side device 1 returns the process to step S701.

In contrast, if the reflection coefficient absolute value |Γ| is larger than the threshold |Γ|$_{thr}$ (step S703; No), the phase difference calculation/determination unit 16 identifies the phase relationship between the incident wave voltage Vf and the reflective wave voltage Vr (step S704). Concretely, the phase difference calculation/determination unit 16 determines whether or not the phase of the reflective wave voltage Vr is behind the phase of the incident wave voltage Vf.

Then, when the phase difference calculation/determination unit 16 determines that the phase of the reflective wave voltage Vr is behind the phase of the incident wave voltage Vf (step S705; Yes), it determines that the state varies in such a direction that the value RL of the load 6 becomes smaller. Then, in this case, the adjustment direction determination unit 18 sets the readout direction of the matching correction amount table to the direction where the load value becomes smaller (step S706). In the case of the matching correction amount tables illustrated in FIGS. 34A to 34C, the adjustment direction determination unit 18 sets the readout direction to the direction where the index number Idx becomes smaller. Then, the adjustment step width determination unit 19 determines the step width Widx in accordance with the reflection coefficient absolute value |Γ| (step S707). For example, on the basis of a predetermined ratio (proportional constant) to be used in the case that the value RL of the load 6 becomes smaller, the adjustment step width determination unit 19 determines the step width Widx from the reflection coefficient absolute value |Γ|.

In contrast, when the phase difference calculation/determination unit 16 determines that the phase of the reflective wave voltage Vr is preceding the phase of the incident wave voltage Vf (step S705; No), it recognizes that the state is changed so that the value RL of the load 6 becomes larger. In this case, the adjustment direction determination unit 18 sets the readout direction of the matching correction amount table to the direction where the load value becomes larger (step S708). In the case of the matching correction amount tables illustrated in FIGS. 34A to 34C, the adjustment direction determination unit 18 sets the readout direction to the direction where the index number Idx becomes larger. Then, the adjustment step width determination unit 19 determines the step width Widx in accordance with the reflection coefficient absolute value |Γ| (step S709). For example, on the basis of a predetermined ratio (proportional constant) to be used in the case that the load value becomes larger, the adjustment step width determination unit 19 determines the step width Widx from the reflection coefficient absolute value |Γ|.

After the execution of step S707 or step S709, on the basis of the determined readout direction and the step width Widx, the readout position determination unit 24 specifies the index number Idx of the row to be read out from the already-selected matching correction amount table (step S710). Then, the control value output unit 26 reads out the capacitance value C and the inductance value L from the row having the specified index number Idx, and applies these values to the matching circuit identified by the flag information If of the row having the specified index number Idx. The matching circuit selection unit 23 switches the switch units 13 and/or 14 based on the above-mentioned flag information If if necessary (step S711). Then, the power transmission-side device 1 returns the process back to step S701.

It is noted that each process at step S707 and step S709 is not an essential process, and that the power transmission-side device 1 may omit the process at step S707 and step S709 if a predetermined value is used as the step width Widx.

MODIFICATION

Next, a description will be given of each modification appropriate for the first embodiment and the second embodiment. Each modification can be applied to the above-mentioned first and second embodiments in combination.

First Modification

The configuration of the matching circuit to which the present invention can be applied is not limited to the configuration illustrated in FIG. 12. The description thereof will be given with reference to FIGS. 44A and 44B.

Figure 44A:
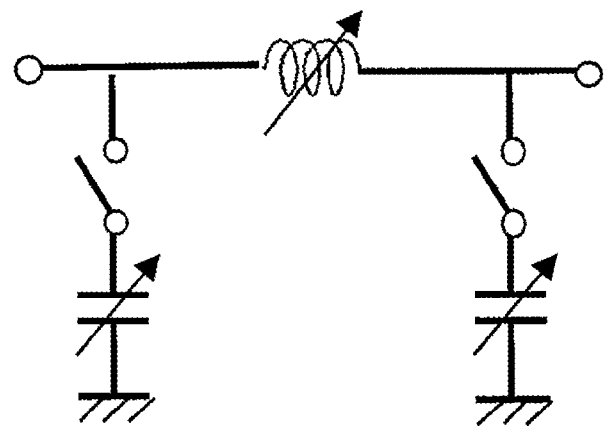
FIGS. 44A and 44B illustrate matching circuits according to the modification.

FIG. 44A illustrates a matching circuit in a state that the first mode matching circuit 11 and the second mode matching circuit 12 only share a variable inductor element. The matching circuit illustrated in FIG. 44A can function as either the first mode matching circuit 11 or the second mode matching circuit 12 through switchover of the switch units. In the same way, the first mode matching circuit 11 and the second mode matching circuit 12 may share only a variable capacitor element.

Figure 44B:
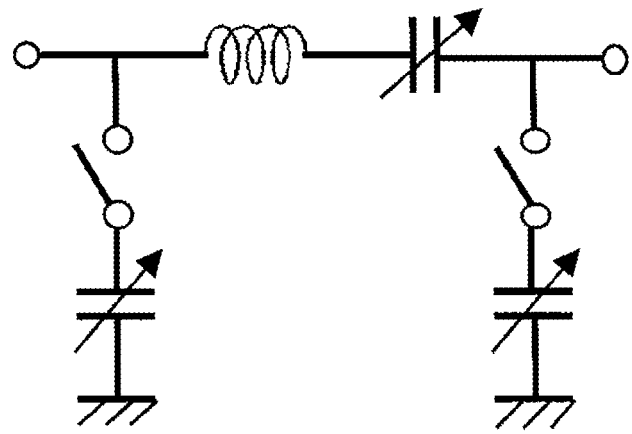

FIG. 44B illustrates a circuit diagram of a matching circuit including a variable capacitor and a fixed inductor instead of a variable inductor. The matching circuit illustrated in FIG. 44B can function as either the first mode matching circuit 11 or the second mode matching circuit 12 through switchover of the switch units. Each of the fixed inductor and the variable capacitor is an example of "the variable inductor element". In this way, the present invention can be preferably embodied even by use of the matching circuits illustrated in FIGS. 44A and 44B.

In addition, any modifications by which so-called π-type matching circuit can be configured are included in the present invention without particular distinction.

Second Modification

In the matching correction amount tables illustrated in FIGS. 19A to 19C and FIGS. 32A to 32C, a pair of the capacitance value C and the inductance value L are stored as a control value Tc. Instead of this, a control value Tc for converting the value of the variable capacitor and the value of the variable inductor to each predetermined value may be stored in the matching correction amount table. For example, when a step motor and a variable condenser are used to configure a variable capacitor, the voltage for controlling the motor may be stored in the matching correction amount table. Instead, bit patterns for controlling a switching device may be stored in the matching correction amount table if the capacitance value C and the inductance value L are set to each predetermined value by switching a micro capacitor and a micro inductor to be either the on-state or the off-state by use of the switching device such as a relay.

Third Modification

In the explanation of the section "Matching Correction Amount Table" in the first embodiment, necessary correction amounts A1, A2, B1 and B2 are obtained through theoretical calculation. Instead, the correction amounts A1, A2, B1 and B2 may be obtained by placing the actual power transmission antenna 3 and the actual power reception antenna 5 to face each other and changing the coupling state thereof.

Also in the explanation of the section "Matching Correction Amount Table" in the second embodiment, necessary correction amounts A1, A2, B1 and B2 are obtained through theoretical calculation. Instead, the correction amounts A1, A2, B1 and B2 may be obtained by placing the actual power transmission antenna 3 and the actual power reception antenna 5 to face each other in a predetermined relative positional relationship and by changing the value RL of the load 6 of the power reception-side device 4.

Fourth Modification

According to the first embodiment, the load estimation unit 7 calculates the estimated load value RLe prior to the rated electric power transmission. Instead, if the value RL of the load of the load 6 of the power reception-side device 4 is determined in advance as a system specification, the power transmission-side device 1 selects the matching correction amount table corresponding to the value of the load 6 determined beforehand in the system without calculating the estimated load value RLe by means of the load estimation unit 7.

Even according to the second embodiment, if the positional relationship between the power transmission antenna 3 and the power reception antenna 5 is determined in advance as a system specification, the power transmission-side device 1 selects the matching correction amount table corresponding to the coupling coefficient k determined beforehand in the system without estimation processing of the coupling coefficient k by the coupling coefficient estimation unit 8.

Fifth Modification

The coupling coefficient estimation unit 8 measures the distance between the power transmission antenna 3 and the power reception antenna 5 by the distance sensor 81. The present invention, however, is not limited thereto. Instead, the coupling coefficient estimation unit 8 sends a small signal in a predetermined bandwidth whose center is the resonant frequency while sweeping the frequency, and calculates frequency characteristics of the reflection coefficient ($\Gamma$ or $S_{11}$) by using the sent signal and the returned signal reflected from the power transmission antenna 3. Then, the coupling coefficient estimation unit 8 calculates the reflection coefficient estimation value ke with reference to a predetermined map based on the shapes of the calculated frequency characteristics, i.e., the number of local minimal peaks, its frequencies, and the absolute value of the reflection coefficient. Here, the above-mentioned map is a map indicating coupling coefficients k each corresponding to the number of local minimal peaks, its frequencies, and the absolute value of the reflection coefficient regarding the frequency characteristics of each reflection coefficient. The map is prepared in advance through experimental trials and stored on the memory. Even in this case, preferably, the coupling coefficient estimation unit 8 can estimate the coupling coefficient k.

Sixth Modification

The power transmission antenna 3 and the power reception antenna 5 are embodied by use of a series parallel equivalent circuit. Instead, the power transmission antenna 3 and the power reception antenna 5 may be embodied by use of a serial resonance equivalent circuit more simplified than a series parallel equivalent circuit.

Seventh Modification

The matching circuit selection unit 23 of the power transmission-side device 1 selects the matching circuit to be used based on the flag information If in the matching correction amount table stored on the storage unit 25. Instead, the matching circuit selection unit 23 may select the matching circuit to be used based on the calculated input impedance Zin.

In this case, for example, the matching circuit selection unit 23 selects the second mode matching circuit 12 if the real part (R) of the calculated input impedance Zin or the real part (Ri) of the impedance value of the row in the matching correction amount table selected based on the input impedance Zin is larger than output impedance (i.e., impedance value at the matching point) of the power transmission circuit 2. In contrast, the matching circuit selection unit 23 selects the first mode matching circuit 11 if the real part (R) or (Ri) is equal to or smaller than the output impedance.

Eighth Modification

According to the first embodiment and the second embodiment, the through circuit 30 is described as a circuit capable of being switched by the switch units 13 and 14, and any matching circuit is not inserted into the circuit. However, any implementation can be applied to the through circuit 30 as long as it has the same effect as the implementation that any matching circuit is not inserted into it. For example, such an implementation that the variable inductance can be controlled to 0, though it does not have any actual through circuit for passing through the matching circuit, in order to have the same effect as the implementation that any matching circuit is not inserted into the circuit is equal to the implementation capable of switching to the through circuit 30 having no matching circuit.

Tenth Modification

Each of the configurations of the power transmission-side device 1 illustrated in FIGS. 12 and 30 is an example, and configuration to which the present invention can be applied is not limited to the configurations. For example, if the power transmission-side device 1 only executes the automatic matching operation and does not need to execute the matching-state tracking operation, it does not have to have the adjustment direction determination unit 18 and the adjustment step width determination unit 19.

Eleventh Modification

According to FIG. 12, the load value calculation unit 73 of the power reception-side device 4 calculates the estimated load value RLe. Instead, the power transmission-side device 1 may calculate the estimated load value RLe. In this case, after detecting the voltage and the current of the load 6, the power reception-side device 4 transmits these values to the power transmission-side device 1 via communication control unit 74, and the power transmission-side device 1 calculates the estimated load value RLe based on these transmitted values.

INDUSTRIAL APPLICABILITY

This invention can be preferably applied to any wireless electric power transmission system using an electromagnetic resonance coupling mode. In addition, this invention can be preferably applied to various kinds of modes such as a magnetic coupling mode and an electric field coupling mode.

BRIEF DESCRIPTION OF REFERENCE NUMBERS

1 Power transmission-side device
2 Power transmission circuit
3 Power transmission antenna
4 Power reception-side device
5 Power reception antenna
6 Load
7 Load estimation unit
8 Coupling coefficient estimation unit
11 First mode matching circuit
12 Second mode matching circuit
13 and 14 Switch units
15 Incident-wave/reflective-wave extraction unit
16 Phase difference calculation/determination unit
17 Reflection coefficient calculation unit
18 Adjustment direction determination unit
19 Adjustment step width determination unit
23 Matching circuit selection unit
24 Readout position determination unit
25 Storage unit
26 Control value output unit
27 Table selection unit

The invention claimed is:

1. An impedance matching device included in a wireless electric power transmission system, the wireless electric power transmission system transmitting wireless electric power radiated from a power transmission antenna to a power reception antenna by coupling the power transmission antenna with the power reception antenna through an electromagnetic field, the impedance matching device being provided between a power transmission circuit and the power transmission antenna, the impedance matching device comprising:

an input impedance estimation unit configured to estimate an input impedance equivalent value corresponding to an input impedance of the power transmission antenna or a value equivalent thereto;

a first matching circuit configured to include a first variable inductor element and a first variable capacitor element, the first variable inductor element being connected in series between the power transmission circuit and the power transmission antenna, one end of the first variable capacitor element being grounded, another end of the first variable capacitor element being connected between the power transmission antenna and the first variable inductor element;

a second matching circuit configured to include a second variable inductor element and a second variable capacitor element, the second variable inductor element being connected in series between the power transmission circuit and the power transmission antenna, one end of the second variable capacitor element being grounded, another end of the second variable capacitor element being connected between the power transmission circuit and the second variable inductor element;

a through circuit connected in series between the power transmission circuit and the power transmission antenna;

a load value estimation unit configured to estimate a value of a load of a power circuit in which the transmitted electric power is consumed, the power circuit being connected to the power reception antenna;

a storage unit configured to store control values each associated with the value of the load and the input impedance equivalent value, each of the control values corresponding to an inductance value and a capacitance value, the inductive and capacitance values needed for matching to a predetermined impedance value used by the first matching circuit or the second matching circuit;

a circuit selection unit configured to electrically connect one of the first matching circuit, the second matching circuit and the through circuit based on the estimated value of the load and the estimated input impedance equivalent value; and a control value output unit configured to read out one of the control values stored in the storage unit based on the estimated value of the load and the estimated input impedance equivalent value, and to output the control value to the respective circuit selected by the circuit selection unit.

2. The impedance matching device according to claim 1,
wherein the storage unit stores the control values and flag information, each pair of the control values and the flag information being associated with the value of the load and the input impedance equivalent value, the flag information indicating either the first matching circuit or the second matching circuit to which the control value is applied, and
wherein the circuit selection unit electrically connects either one of the first matching circuit or the second matching circuit based on the flag information determined from the estimated value of the load and the estimated input impedance equivalent value.

3. The impedance matching device according to claim 2,
wherein each of the control values is determined based on a locus of variation of impedance inputted from the power transmission circuit to the power transmission antenna in a condition that a coupling state between the power transmission antenna and the power reception antenna is changed while the value of the load of the power circuit is fixed.

4. The impedance matching device according to claim 2, further comprising:
an incident-wave/reflective-wave extraction unit configured to extract incident wave voltage corresponding to an output signal from the power transmission circuit and reflective wave voltage corresponding to a signal reflected from the power transmission antenna;
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
a phase difference calculation unit configured to compare a phase of the incident wave voltage to a phase of the reflective wave voltage and to calculate a phase difference between the phases,
wherein the input impedance estimation unit estimates the reflection-coefficient-absolute-value equivalent value and the phase difference as the input impedance equivalent value.

5. The impedance matching device according to claim 2, further comprising:
an incident-wave/reflective-wave extraction unit configured to extract incident wave voltage corresponding to an output signal from the power transmission circuit and reflective wave voltage corresponding to a signal reflected from the power transmission antenna; and
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto,
wherein the circuit selection unit selects the through circuit when the reflection-coefficient-absolute-value equivalent value is equal to or smaller than a predetermined value.

6. The impedance matching device according to claim 1,
wherein the control value is quantized such that the larger an absolute value of a reflection coefficient is, the shorter the quantizing interval becomes.

7. The impedance matching device according to claim 1, further comprising:
an incident-wave/reflective-wave extraction unit configured to extract incident wave voltage corresponding to an output signal from the power transmission circuit and reflective wave voltage corresponding to a signal reflected from the power transmission antenna;
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
a phase difference calculation unit configured to compare a phase of the incident wave voltage to a phase of the reflective wave voltage and to calculate a phase difference between the phases,
wherein the input impedance estimation unit estimates the reflection-coefficient-absolute-value equivalent value and the phase difference as the input impedance equivalent value.

8. The impedance matching device according to claim 1, further comprising:
an incident-wave/reflective-wave extraction unit configured to extract incident wave voltage corresponding to an output signal from the power transmission circuit and reflective wave voltage corresponding to a signal reflected from the power transmission antenna; and
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto,
wherein the circuit selection unit selects the through circuit when the reflection-coefficient-absolute-value equivalent value is equal to or smaller than a predetermined value.

9. The impedance matching device according to claim 1,
wherein each of the control values is determined based on a locus of variation of impedance inputted from the power transmission circuit to the power transmission antenna in a condition that a coupling state between the power transmission antenna and the power reception antenna is changed while the value of the load of the power circuit is fixed.

10. The impedance matching device according to claim 9, further comprising:
an incident-wave/reflective-wave extraction unit configured to extract incident wave voltage corresponding to an output signal from the power transmission circuit and reflective wave voltage corresponding to a signal reflected from the power transmission antenna;
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
a phase difference calculation unit configured to compare a phase of the incident wave voltage to a phase of the reflective wave voltage and to calculate a phase difference between the phases,
wherein the input impedance estimation unit estimates the reflection-coefficient-absolute-value equivalent value and the phase difference as the input impedance equivalent value.

11. The impedance matching device according to claim 9, further comprising:
- an incident-wave/reflective-wave extraction unit configured to extract incident wave voltage corresponding to an output signal from the power transmission circuit and reflective wave voltage corresponding to a signal reflected from the power transmission antenna; and
- a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto,
- wherein the circuit selection unit selects the through circuit when the reflection-coefficient-absolute-value equivalent value is equal to or smaller than a predetermined value.

12. An impedance matching device included in a wireless electric power transmission system, the wireless electric power transmission system transmitting wireless electric power radiated from a power transmission antenna to a power reception antenna by coupling the power transmission antenna with the power reception antenna through an electromagnetic field, the impedance matching device being provided between a power transmission circuit and the power transmission antenna, the impedance matching device comprising:
- an input impedance estimation unit configured to estimate an input impedance equivalent value corresponding to an input impedance of the power transmission antenna or a value equivalent thereto;
- a first matching circuit configured to include a first variable inductor element and a first variable capacitor element, the first variable inductor element being connected in series between the power transmission circuit and the power transmission antenna, one end of the first variable capacitor element being grounded, another end of the first variable capacitor element being connected between the power transmission antenna and the first variable inductor element;
- a second matching circuit configured to include a second variable inductor element and a second variable capacitor element, the second variable inductor element being connected in series between the power transmission circuit and the power transmission antenna, one end of the second variable capacitor element being grounded, another end of the second variable capacitor element being connected between the power transmission circuit and the second variable inductor element;
- a through circuit connected in series between the power transmission circuit and the power transmission antenna;
- a coupling coefficient estimation unit configured to estimate a coupling coefficient between the power transmission antenna and the power reception antenna;
- a storage unit configured to store control values each associated with the coupling coefficient and the input impedance equivalent value, each of the control values corresponding to an inductance value and a capacitance value, the inductive and capacitance values needed for matching to a predetermined impedance value used by the first matching circuit or the second matching circuit;
- a circuit selection unit configured to electrically connect one of the first matching circuit, the second matching circuit and the through circuit based on the estimated coupling coefficient and the estimated input impedance equivalent value; and
- a control value output unit configured to read out one of the control values stored in the storage unit based on the estimated coupling coefficient and the estimated input impedance equivalent value, and to output the control value to the respective circuit selected by the circuit selection unit.

13. The impedance matching device according to claim 12,
- wherein the storage unit stores the control values and flag information, each pair of the control values and the flag information being associated with the estimated coupling coefficient and the input impedance equivalent value, the flag information indicating either the first matching circuit or the second matching circuit to which the control value is applied, and
- wherein the circuit selection unit electrically connect either one of the first matching circuit or the second matching circuit based on the flag information determined from the estimated coupling coefficient and the estimated input impedance equivalent value.

14. The impedance matching device according to claim 13,
- wherein each of the control values is determined based on a locus of variation of impedance inputted from the power transmission circuit to the power transmission antenna in a condition that the value of the load of the power circuit is changed while a coupling state between the power transmission antenna and the power reception antenna is fixed.

15. The impedance matching device according to claim 13, further comprising:
- an incident-wave/reflective-wave extraction unit configured to extract incident wave voltage corresponding to an output signal from the power transmission circuit and reflective wave voltage corresponding to a signal reflected from the power transmission antenna;
- a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
- a phase difference calculation unit configured to compare a phase of the incident wave voltage to a phase of the reflective wave voltage and to calculate a phase difference between the phases,
- wherein the input impedance estimation unit estimates the reflection-coefficient-absolute-value equivalent value and the phase difference as the input impedance equivalent value.

16. The impedance matching device according to claim 12, further comprising:
- an incident-wave/reflective-wave extraction unit configured to extract incident wave voltage corresponding to an output signal from the power transmission circuit and reflective wave voltage corresponding to a signal reflected from the power transmission antenna;
- a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
- a phase difference calculation unit configured to compare a phase of the incident wave voltage to a phase of the reflective wave voltage and to calculate a phase difference between the phases, wherein the input impedance estimation unit estimates the reflection-coefficient-absolute-value equivalent value and the phase difference as the input impedance equivalent value.

17. The impedance matching device according to claim 12, wherein each of the control values is determined based on a locus of variation of impedance inputted from the power transmission circuit to the power transmission antenna in a condition that a value of a load of a power circuit is changed while a coupling state between the power transmission antenna and the power reception antenna is fixed.

18. The impedance matching device according to claim 17, further comprising:
an incident-wave/reflective-wave extraction unit configured to extract incident wave voltage corresponding to an output signal from the power transmission circuit and reflective wave voltage corresponding to a signal reflected from the power transmission antenna;
a reflection coefficient calculation unit configured to calculate a reflection-coefficient-absolute-value equivalent value based on the incident wave voltage and the reflective wave voltage, the reflection-coefficient-absolute-value equivalent value indicating an absolute value of the reflection coefficient or a value equivalent thereto; and
a phase difference calculation unit configured to compare a phase of the incident wave voltage to a phase of the reflective wave voltage and to calculate a phase difference between the phases,
wherein the input impedance estimation unit estimates the reflection-coefficient-absolute-value equivalent value and the phase difference as the input impedance equivalent value.

19. A control method executed by an impedance matching device included in a wireless electric power transmission system, the wireless electric power transmission system transmitting wireless electric power radiated from a power transmission antenna to a power reception antenna by coupling the power transmission antenna with the power reception antenna through an electromagnetic field, the impedance matching device being provided between a power transmission circuit and the power transmission antenna, the impedance matching device comprising:
a first matching circuit configured to include a first variable inductor element and a first variable capacitor element, the first variable inductor element being connected in series between the power transmission circuit and the power transmission antenna, one end of the first variable capacitor element being grounded, another end of the first variable capacitor element being connected between the power transmission antenna and the first variable inductor element;
a second matching circuit configured to include a second variable inductor element and a second variable capacitor element, the second variable inductor element being connected in series between the power transmission circuit and the power transmission antenna, one end of the second variable capacitor element being grounded, another end of the second variable capacitor element being connected between the power transmission circuit and the second variable inductor element;
a through circuit connected in series between the power transmission circuit and the power transmission antenna; and
a storage unit configured to store control values each associated with a value of a load of a power circuit in which the transmitted electric power is consumed and an input impedance equivalent value, each of the control values corresponding to an inductance value and a capacitance value, the inductive and capacitance values needed for matching to a predetermined impedance value used by the first matching circuit or the second matching circuit, the input impedance equivalent value corresponding to an input impedance of the power transmission antenna or a value equivalent thereto, the power circuit being connected to the power reception antenna,
the control method comprising:
an input impedance estimation process for estimating the input impedance equivalent value;
a load value estimation process for estimating the value of the load;
a circuit selection process for electrically connecting one of the first matching circuit, the second matching circuit and the through circuit based on the estimated value of the load and the estimated input impedance equivalent value; and
a control value output process for reading out one of the control values stored in the storage unit based on the estimated value of the load and the estimated input impedance equivalent value, and for outputting the control value to the respective circuit selected in the circuit selection process.

20. A control method executed by an impedance matching device included in a wireless electric power transmission system, the wireless electric power transmission system transmitting wireless electric power radiated from a power transmission antenna to a power reception antenna by coupling the power transmission antenna with the power reception antenna through an electromagnetic field, the impedance matching device being provided between a power transmission circuit and the power transmission antenna, the impedance matching device comprising:
a first matching circuit configured to include a first variable inductor element and a first variable capacitor element, the first variable inductor element being connected in series between the power transmission circuit and the power transmission antenna, one end of the first variable capacitor element being grounded, another end of the first variable capacitor element being connected between the power transmission antenna and the first variable inductor element;
a second matching circuit configured to include a second variable inductor element and a second variable capacitor element, the second variable inductor element being connected in series between the power transmission circuit and the power transmission antenna, one end of the second variable capacitor element being grounded, another end of the second variable capacitor element being connected between the power transmission circuit and the second variable inductor element;
a through circuit connected in series between the power transmission circuit and the power transmission antenna; and
a storage unit configured to store control values each associated with a coupling coefficient between the power transmission antenna and the power reception antenna and an input impedance equivalent value, each of the control values corresponding to an inductance value and a capacitance value, the inductive and capacitance values needed for matching to a predetermined impedance value used by the first matching circuit or the second matching circuit, the input impedance equivalent value corresponding to an input impedance of the power transmission antenna or a value equivalent thereto, the control method comprising:
- an input impedance estimation process for estimating the input impedance equivalent value;
- a coupling state estimation process for estimating the coupling coefficient;
- a circuit selection process for electrically connecting one of the first matching circuit, the second matching circuit and the through circuit based on the estimated coupling coefficient and the estimated input impedance equivalent value; and
- a control value output process for reading out one of the control values stored in the storage unit based on the estimated coupling coefficient and the estimated input impedance equivalent value, and for outputting the control value to the respective circuit selected in the circuit selection process.

\* \* \* \* \*